US012354951B2

(12) United States Patent
Chuang et al.

(10) Patent No.: US 12,354,951 B2
(45) Date of Patent: Jul. 8, 2025

(54) LAYOUT FOR REDUCING LOADING AT LINE SOCKETS AND/OR FOR INCREASING OVERLAY TOLERANCE WHILE CUTTING LINES

(71) Applicant: Taiwan Semiconductor Manufacturing Company, Ltd., Hsinchu (TW)

(72) Inventors: Harry-Hak-Lay Chuang, Zhubei (TW); Kuo-Chyuan Tzeng, Chu-Pei (TW); Wan-Chen Chen, Hsinchu (TW); Chang-Chih Huang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 579 days.

(21) Appl. No.: 17/591,119

(22) Filed: Feb. 2, 2022

(65) Prior Publication Data
US 2023/0043884 A1    Feb. 9, 2023

Related U.S. Application Data

(60) Provisional application No. 63/230,322, filed on Aug. 6, 2021.

(51) Int. Cl.
*H01L 23/528* (2006.01)
*H01L 21/768* (2006.01)
*H01L 23/535* (2006.01)

(52) U.S. Cl.
CPC ...... *H01L 23/528* (2013.01); *H01L 21/76895* (2013.01); *H01L 23/535* (2013.01)

(58) Field of Classification Search
CPC ............ H01L 23/528; H01L 21/76895; H01L 23/535; H01L 23/5226; H01L 23/5283;
(Continued)

(56) References Cited

U.S. PATENT DOCUMENTS

2012/0045901 A1    2/2012 Kim et al.
2012/0146110 A1    6/2012 Jung
(Continued)

OTHER PUBLICATIONS

Larrivee, Steve. "Solid State Drive Primer # 4—Nand Architecture—Pages & Blocks" Cactus Technologies, published on Mar. 30, 2015.

*Primary Examiner* — Jonathan Han
(74) *Attorney, Agent, or Firm* — Eschweiler & Potashnik, LLC

(57) ABSTRACT

Various embodiments of the present disclosure are directed towards methods for forming conductive lines and conductive sockets using mandrels with turns, as well as the resulting conductive lines and sockets. A conductive socket of the present disclosure may have a top layout with at least one turn and with a width that is substantially the same as that of conductive lines along the at least one turn. Such a top layout may reduce loading during formation of the conductive socket. Conductive lines of the present disclosure may comprise outer conductive lines and inner conductive lines having ends laterally offset from ends of the outer conductive lines along lengths of the conductive lines. Formation of the inner and outer conductive lines using a mandrel with a turn may enlarge a process window while cutting ends of a sidewall spacer structure from which the inner and outer conductive lines are formed.

20 Claims, 52 Drawing Sheets

(58) Field of Classification Search
CPC ......... H01L 21/76885; H01L 21/76838; H01L 23/52; H10B 61/10; H10B 63/24; H10B 63/80

See application file for complete search history.

(56) References Cited

U.S. PATENT DOCUMENTS

| | | |
|---|---|---|
| 2015/0182230 A1 | 7/2015 | Belagali et al. |
| 2018/0342421 A1* | 11/2018 | Bombardier ...... H01L 21/76816 |
| 2019/0109090 A1 | 4/2019 | Chen et al. |
| 2019/0259698 A1* | 8/2019 | Takahashi ............ H10B 41/27 |

* cited by examiner

LAYOUT FOR REDUCING LOADING AT LINE SOCKETS AND/OR FOR INCREASING OVERLAY TOLERANCE WHILE CUTTING LINES

REFERENCE TO RELATED APPLICATION

This Application claims the benefit of U.S. Provisional Application No. 63/230,322, filed on Aug. 6, 2021, the contents of which are incorporated by reference in their entirety.

BACKGROUND

With the increasing scaling down of semiconductor devices, various processing techniques have been adapted to allow for the manufacture of features with increasingly smaller dimensions. For example, photolithography is often used to optically transfer patterns to photoresist but is reaching limits on feature size. Therefore, photolithography may be used with self-aligned double patterning processes to achieve smaller feature sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 21A and 21B to FIGS. 28A and 28B illustrate a series of views of some embodiments of a method for forming an IC chip comprising a plurality of conductive sockets coupled with conductive lines and having a plurality of turns.

DETAILED DESCRIPTION

Figure 1:
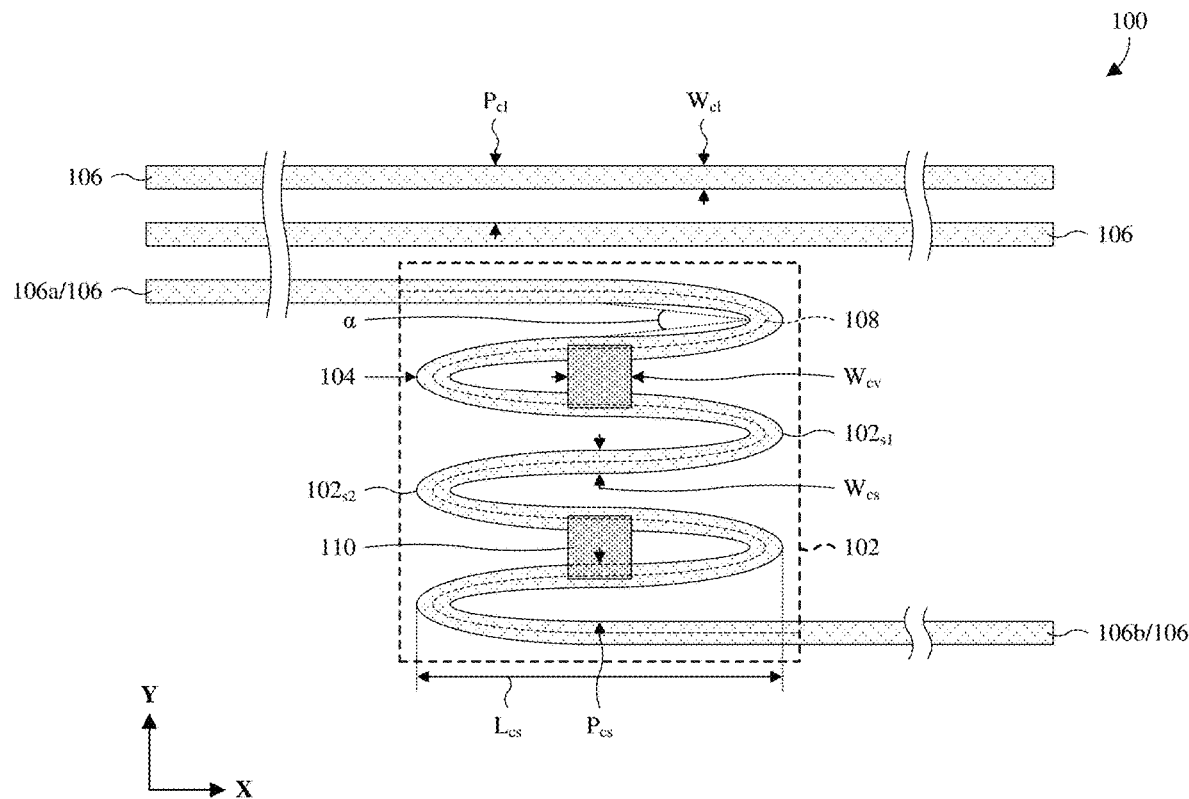
FIG. 1 illustrates a top layout view of some embodiments of an integrated circuit (IC) chip comprising a conductive socket coupled with a conductive line and having a plurality of turns.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Conductive lines may be formed with small widths and small pitches using self-aligned double patterning. However, reliably landing contacts and/or vias on such conductive lines without electrically shorting neighboring conductive lines may pose challenges because of the small widths and the small pitches. Therefore, conductive sockets coupled with the conductive lines may also be formed. A conductive socket may have a large, rectangular top layout offset from the conductive lines and on which to land contacts and/or vias for electrically coupling to a corresponding conductive line of the conductive socket. The large, rectangular top layout may be large in that it has a larger width than that of the conductive lines.

A method for forming the conductive lines and the conductive sockets may comprise depositing a conductive layer and a hard mask layer overlying the conductive layer. A line-shaped mandrel may be formed overlying the hard mask layer. A sidewall spacer structure may be formed comprising a first spacer line and a second spacer line elongated in parallel and respectively on opposite sidewalls of the line-shaped mandrel. The line-shaped mandrel may be removed, and a photolithography process may be performed to form a photoresist mask adjoining the first spacer line and spaced from the second spacer line. An etch may be performed into the hard mask layer and the conductive layer using the photoresist mask and the sidewall spacer structure collectively as a mask. The etch forms a first conductive line and a second conductive line corresponding to the first and second spacer lines, and further forms a conductive socket coupled with the first conductive line and corresponding to the photoresist mask. After the etch, the hard mask layer may be removed by another etch, a chemical mechanical planarization (CMP), or some other suitable removal process.

The conductive socket may have a large, rectangular top layout, as noted above, whereby the photoresist mask may have the large, rectangular top layout during the etch and the hard mask layer may have the large, rectangular top layout during the removal. Because of the large, rectangular top layout, loading during the etch and the removal may be greater at the conductive socket than at the first and second conductive lines. As such, an etch rate during the etch and a removal rate during the removal may be lower at the conductive socket than at the first and second conductive lines. Because of the lower etch rate, the hard mask layer may have a larger thickness at the conductive socket than at the first and second conductive lines upon completion of the etch. If the removal persists long enough to remove the hard mask layer at the conductive socket, over removal may occur at the first and second conductive lines. This may lead to increased resistances at the first and second conductive lines. If the removal persists only long enough to remove the hard mask layer at the first and second conductive lines, under removal may occur at the conductive socket. This may lead to contacts and/or vias failing to contact the conductive socket and may hence lead to an open circuit.

Various embodiments of the present disclosure are directed an integrated circuit (IC) chip in which a conductive socket is coupled with a conductive line and has at least one turn. The conductive socket may, for example, have a serpentine top layout or some other suitable top layout extending away from an end of the conductive line. Further, various embodiments of the present disclosure are directed towards a method for forming the IC chip.

According to some embodiments of the method, a hard mask layer is deposited overlying a conductive layer, and a mandrel is formed overlying the hard mask layer by a photolithography/etching process. A spacer layer is deposited overlying the mandrel and the hard mask layer and further lining sidewalls of the mandrel. The spacer layer is etched back to remove the spacer layer from atop the mandrel and to form a sidewall spacer structure on the sidewalls of the mandrel. The mandrel is removed, and an etch is performed into the hard mask layer and the conductive layer with the sidewall spacer structure in place. The sidewall spacer structure serves as a mask during the etch and is such that the etch forms a conductive line and a conductive socket from the conductive layer. The conductive line is elongated in a first dimension, and the conductive socket extends from an end of the conductive line in a second dimension transverse to the first dimension and along a path with at least one turn. Further, the conductive socket has a width that is substantially the same as that of the conductive line along the path. After the etch, the hard mask layer is removed.

Because the etch extends into both the hard mask layer and the conductive layer using the sidewall spacer structure as a mask, the sidewall spacer structure, the conductive layer, and the hard mask layer share a common layout. Because a layout of the conductive socket extends along a path with at least one turn and has a width that is substantially the same as that of the conductive line, loading during the etch and during the removal is substantially the same at the conductive socket as at the conductive line. As such, an etch rate during the etch and a removal rate during the removal may be substantially the same at the conductive socket as at the conductive line. This may reduce over removal or under removal during the removal.

Because the sidewall spacer structure is used as a mask for forming both the conductive socket and the conductive line, rather than using the sidewall spacer structure as a mask for the conductive line and a photoresist mask as a mask for the conductive socket, the conductive socket and the conductive line may be formed using a common photomask or reticle rather than separate photomasks or reticles. For example, the common photomask or reticle may be used to form the mandrel from which the sidewall spacer structure is formed. Accordingly, the conductive socket and the conductive line may be formed using only one photomask/reticle, which may reduce costs because photomasks/reticles are costly.

With reference to FIG. 1, a top layout view 100 of some embodiments of an IC chip comprising a conductive socket 102 with a plurality of turns 104 is provided. The conductive socket 102 borders a plurality of conductive lines 106 elongated in parallel in a first dimension (e.g., an X dimension). Further, the conductive socket 102 is coupled to a first conductive line 106a of the plurality of conductive lines 106 and a second conductive line 106b of the plurality of conductive lines 106 on opposite sides of the conductive socket 102.

The conductive socket 102 extends from an end of the first conductive line 106a to an end of the second conductive line 106b in a second dimension (e.g., a Y dimension) transverse to the first dimension along a path 108. The path 108 accommodates the plurality of turns 104 and is serpentine, whereby the conductive socket 102 has a top layout that is serpentine. A turn corresponds to a continuous change in direction (as illustrated) or a discrete change in direction along the path 108, whereby the conductive socket 102 has six turns. In alternative embodiments, the conductive socket 102 has more or less turns.

The conductive socket 102 has a width $W_{cs}$ along the path 108, from the first conductive line 106a to the second conductive line 106b. In other words, the conductive socket 102 has the width $W_{cs}$ along the path 108, from a beginning of the path 108 to an end of the path 108. The width $W_{cs}$ is the same as or substantially the same as a width $W_{cl}$ of the conductive lines 106. By substantially the same, it is meant that the width $W_{cs}$ of the conductive socket 102 is within about 5%, 10%, 20%, or some other suitable percentage of the width $W_{cl}$ of the conductive lines 106. In other words, a magnitude of a difference between the widths $W_{cl}$, $W_{cl}$ is less than about 5%, 10%, 20%, or some other suitable percentage of the width $W_{cl}$.

A plurality of contacts/vias 110 is on the conductive socket 102. The contacts/vias 110 partially form an interconnect structure and provide electrical coupling from the conductive socket 102 to a remainder of the interconnect structure when viewed in cross section. In some embodiments, a width $W_{cv}$ of the contacts/vias 110 is greater than the width $W_{cl}$ of the conductive lines 106 and/or is less than or equal to a length $L_{cs}$ of the conductive socket 102. In other embodiments, the width $W_{cv}$ of the contacts/vias 110 is greater than the length $L_{cs}$.

As seen hereafter, the conductive lines 106 and the conductive socket 102 may be formed by an etch into a conductive layer and a hard mask layer overlying the conductive layer using sidewall spacer structures as a mask. Further, the hard mask layer may be removed after the etch. As such, the conductive lines 106 and the conductive socket 102 share a common top layout with the hard mask layer and the sidewall spacer structures.

Because the conductive socket 102 extends along the path 108 with the turns 104, and because the width $W_{cs}$ of the conductive socket 102 along the path 108 is substantially the same as the width $W_{cl}$ of the conductive lines 106, loading during the etch and during the removal may be substantially the same at the conductive socket 102 as at the conductive lines 106. In contrast, if the conductive socket 102 had a large, rectangular top layout, loading during the etch and the removal may be greater at the conductive socket 102 than at the conductive lines 106. Because of the substantially the same loading, the etch rate during the etch and the removal rate during the removal may be substantially the same at the conductive socket 102 as at the conductive lines 106. This may reduce over removal or under removal during the removal.

In some embodiments, a top layout of the conductive socket 102 has a socket area and is bounded by a minimum bounding rectangle (MBR) having a socket MBR area, and a top layout of conductive lines spaced from the conductive socket 102 has a conductive-line area and is bounded by a MBR having a conductive-line MBR area. In some embodiments, a ratio of the socket area to the socket MBR area is the same as or substantially the same as a ratio of the conductive-line area to the conductive-line MBR area. By substantially the same, it is meant that the ratio of the conductive socket 102 is within about 5%, 10%, 20%, or some other suitable percentage of the ratio of the conductive lines 106. Having the same or substantially the same ratios may facilitate uniform loading during the etch and the removal.

In some embodiments, the conductive lines 106 are separated by a conductive-line pitch $P_{cl}$ in a dimension (e.g., the Y dimension), and the turns 104 are such that the conductive socket 102 extends back and forth with a conductive-socket pitch $P_{cs}$ in the dimension that is the same as or substantially the same as the conductive-line pitch $P_{cl}$. By substantially the same, it is meant that the conductive-socket pitch $P_{cs}$ is within about 5%, 10%, 20%, or some other suitable percentage of the conductive-line pitch $P_{cl}$. Having the same or substantially the same pitches $P_{cl}$, $P_s$, may facilitate uniform loading during the etch and the removal.

As seen hereafter, an etch may be used to form the conductive lines 106 and the conductive socket 102. Because the width $W_{cs}$ of the conductive socket 102 and the width $W_{cl}$ of the conductive lines 106 may be the same or substantially the same, a sidewall spacer structure may be used as a mask for both the conductive lines 106 and the conductive socket 102 during the etch. As such, the conductive lines 106 and the conductive socket 102 may be formed using a common photomask or reticle rather than separate photomasks or reticles. For example, the common photomask or reticle may be used to form a mandrel from which the sidewall spacer structure is formed. By using the common photomask or reticle for forming both the conductive socket 102 and the conductive lines 106, rather than separate photomasks or reticles, cost may be reduced because photomasks or reticles are costly to manufacture.

With continued reference to FIG. 1, the turns 104 continuously change direction and have individual turn angles α. A turn angle for such a continuously changing turn corresponds to an angle between a first axis and a second axis. The first axis extends from a beginning location at which the turn begins to a midpoint along the turn, which is between the beginning location and an ending location at which the turn ends. Further, the second axis extends from the ending location to the midpoint. In some embodiments, the midpoint is equidistant from the beginning location and the ending location along the turn. In some embodiments, the beginning location, the ending location, and the midpoint are on a sidewall (e.g., a first sidewall $102_{s1}$ or a second sidewall $102_{s2}$) of the conductive socket 102. In some embodiments, the beginning location, the ending location, and the midpoint are on the path 108.

In some embodiments, the turn angles α are the same amongst some or all of the turns 104. In some embodiments, the turn angles α are different amongst some or all of the turns 104. In some embodiments, one, some, or all of the turn angles α are acute and hence less than about 90 degrees. In some embodiments, one, some, or all of the turn angles α are right or obtuse angles and hence greater than or equal to about 90 degrees.

In some embodiments, the turns 104 of the conductive socket 102 share a common top layout that alternates between a first orientation and a second orientation in a dimension (e.g., the Y dimension) transverse to that along which the conductive lines 106 are elongated.

In some embodiments, the path 108 is at a center of the width $W_{cs}$ of the conductive socket 102. In other embodiments, the path 108 is at the first or second sidewall $102_{s1}$, $102_{s2}$ of the conductive socket 102. In some embodiments, the first sidewall $102_{s1}$ of the conductive socket 102 and/or the second sidewall $102_{s2}$ of the conductive socket 102 conform to the path 108.

In some embodiments, the conductive-line pitch $P_{cl}$ is equal to or substantially equal to two times the width $W_{cl}$ of the conductive lines 106 and/or two times the width $W_{cs}$ of the conductive socket 102. Further, in some embodiments, the conductive-socket pitch $P_{cs}$ is equal to or substantially equal to two times the width $W_{cs}$ of the conductive socket 102 and/or two times the width $W_{cl}$ of the conductive lines 106.

In some embodiments, the conductive lines 106 and the conductive socket 102 are or comprise doped polysilicon, copper, aluminum copper, some other suitable metal(s) and/or conductive material(s), or any combination of the foregoing. In some embodiments, the conductive lines 106 and the conductive socket 102 are formed from a common layer. In some embodiments, the conductive lines 106 are interconnect lines (e.g., in a back-end-of-line (BEOL) interconnect structure).

As above and hereafter, lines (e.g., the conductive lines 106, mandrel lines, spacer lines, etc.) are said to be elongated in parallel. In at least some embodiments, the lines elongated in parallel are lines extending in parallel along greatest dimensions of the lines. Further, in at least some embodiments, a greatest dimension of such a line may correspond to a length of the line and/or may be many times greater than remaining dimensions of the line. For example, the greatest dimension of the line may be one, two, three, fourth, five, or more orders of magnitude greater than the remaining dimensions of the line.

With reference to FIGS. 2A-2D, top layout views 200A-200D of some alternative embodiments of the IC chip of FIG. 1 are provided in which the conductive socket 102 is varied.

Figure 2A:
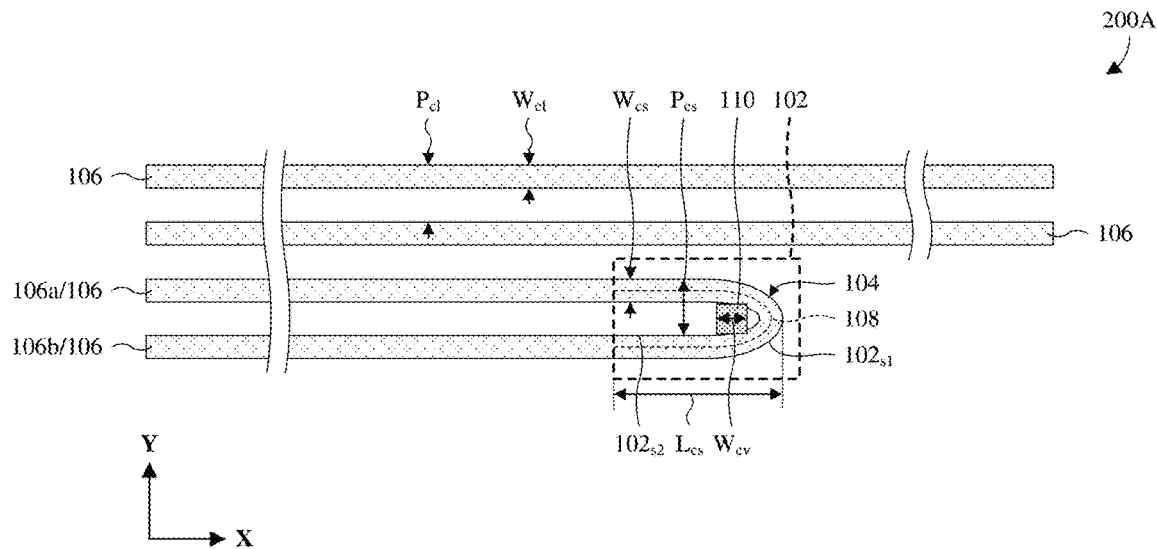
FIGS. 2A-2D illustrate top layout views of some alternative embodiments of the IC chip of FIG. 1 in which the conductive socket is varied.

In FIG. 2A, the conductive socket 102 has only one turn 104, and a ratio between the width $W_{cs}$ of the conductive socket 102 and the width $W_{cl}$ of the conductive lines 106 has been decreased compared to FIG. 1. Further, there is only one contact/via 110 on the conductive socket 102, and the contact/via 110 is at the turn 104. Note that a turn angle of the turn 104 has not been labeled due to space constraints but is acute similar to the turn angle α in FIG. 1.

Figure 2B:
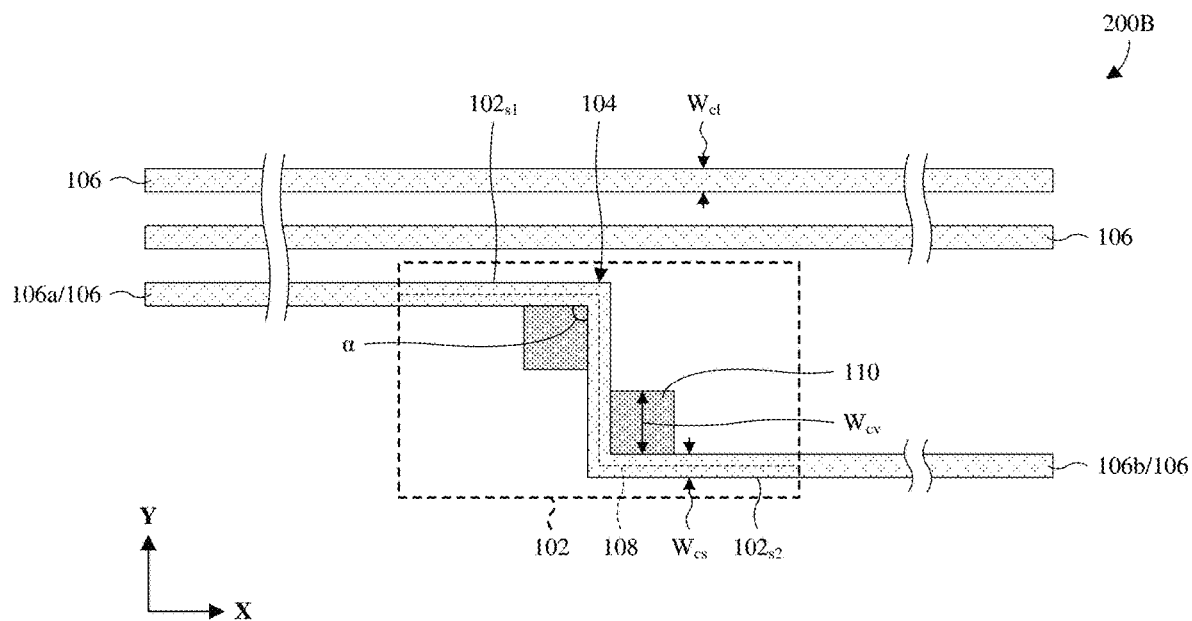

In FIG. 2B, the conductive socket 102 has two turns 104, which discretely change direction. Further, the individual turn angles α of the turns 104 are right angles or about 90 degrees, and the contact/vias 110 are respectively at the turns 104.

Figure 2C:
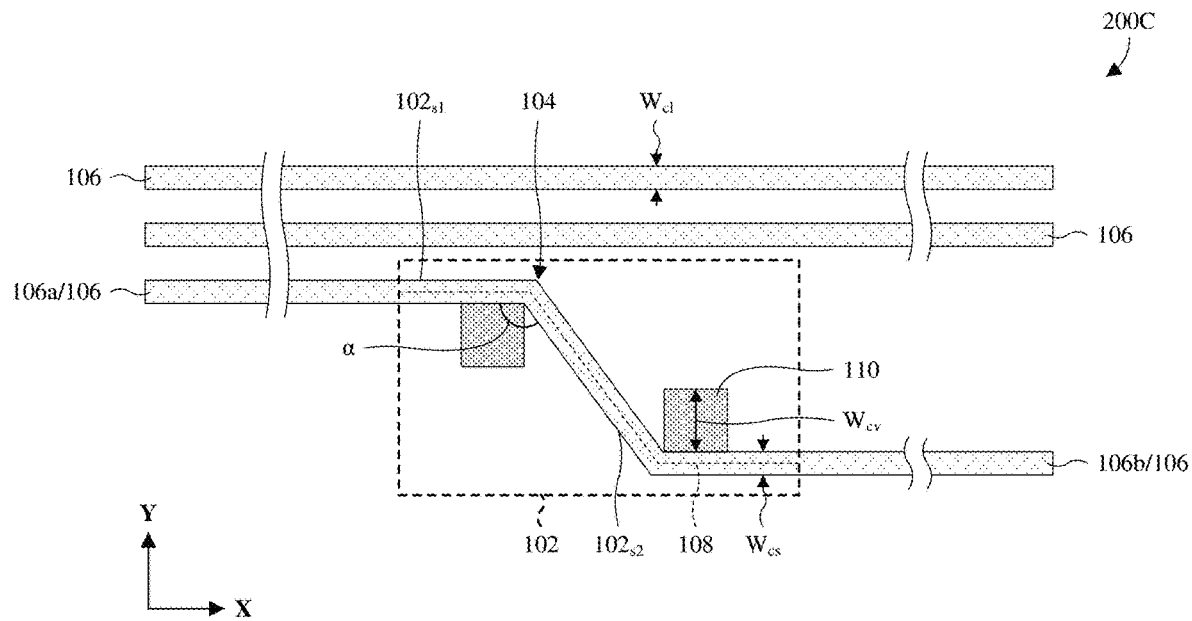

In FIG. 2C, the conductive socket 102 has two turns 104, which discretely change direction, and the contact/vias 110 are respectively at the turns 104. Further, the individual turn angles α of the turns 104 are obtuse angles and hence are greater than about 90 degrees.

Figure 2D:
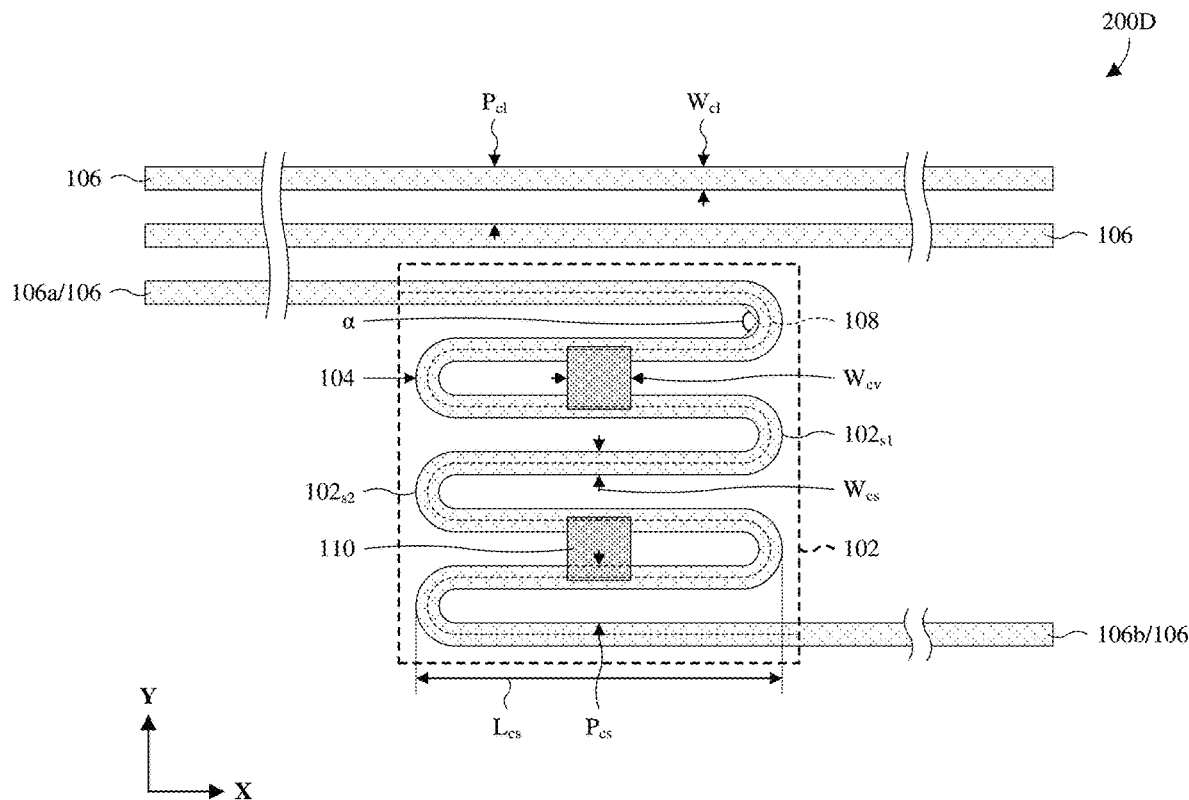

In FIG. 2D, the individual turn angles α of the turns 104 are greater than in FIG. 1.

Figure 3:
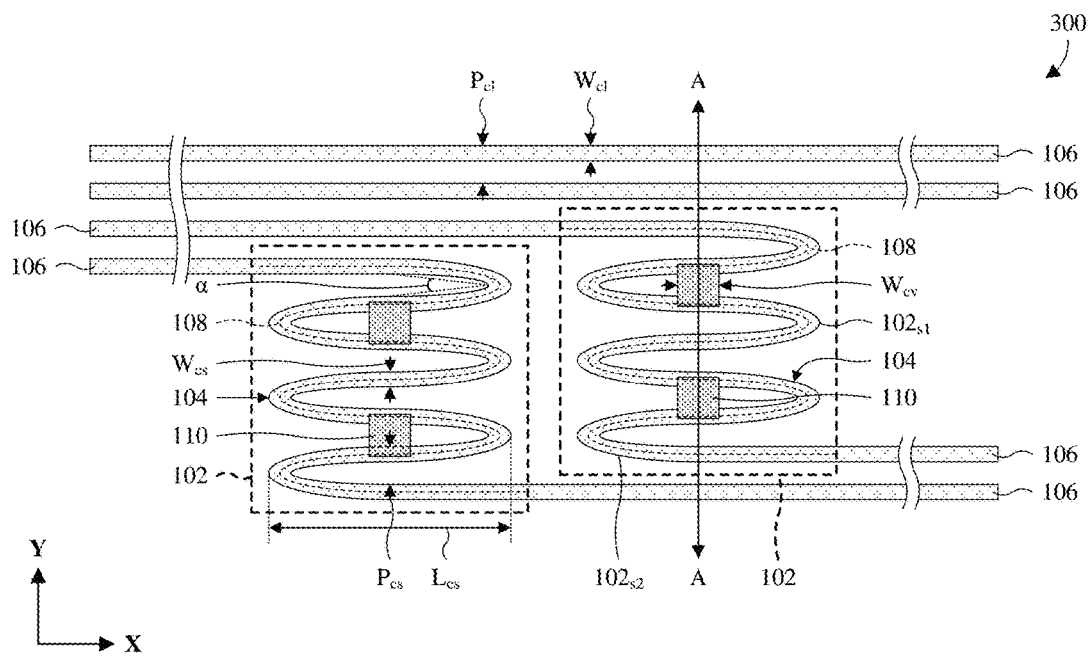
FIG. 3 illustrates a top layout view of some alternative embodiments of the IC chip of FIG. 1 in which the IC chip comprises a plurality of conductive sockets each as in FIG. 1.

With reference to FIG. 3, a top layout view 300 of some alternative embodiments of the IC chip of FIG. 1 is provided in which the IC chip comprises a plurality of conductive sockets 102. The conductive sockets 102 are each as in FIG. 1. However, in alternative embodiments, the conductive sockets 102 are each as in any of FIGS. 2A-2D. While two conductive sockets 102 are shown, additional conductive sockets are amenable in alternative embodiments. Such additional conductive sockets may, for example, each be as in any of FIGS. 1 and 2A-2D.

Figure 4:
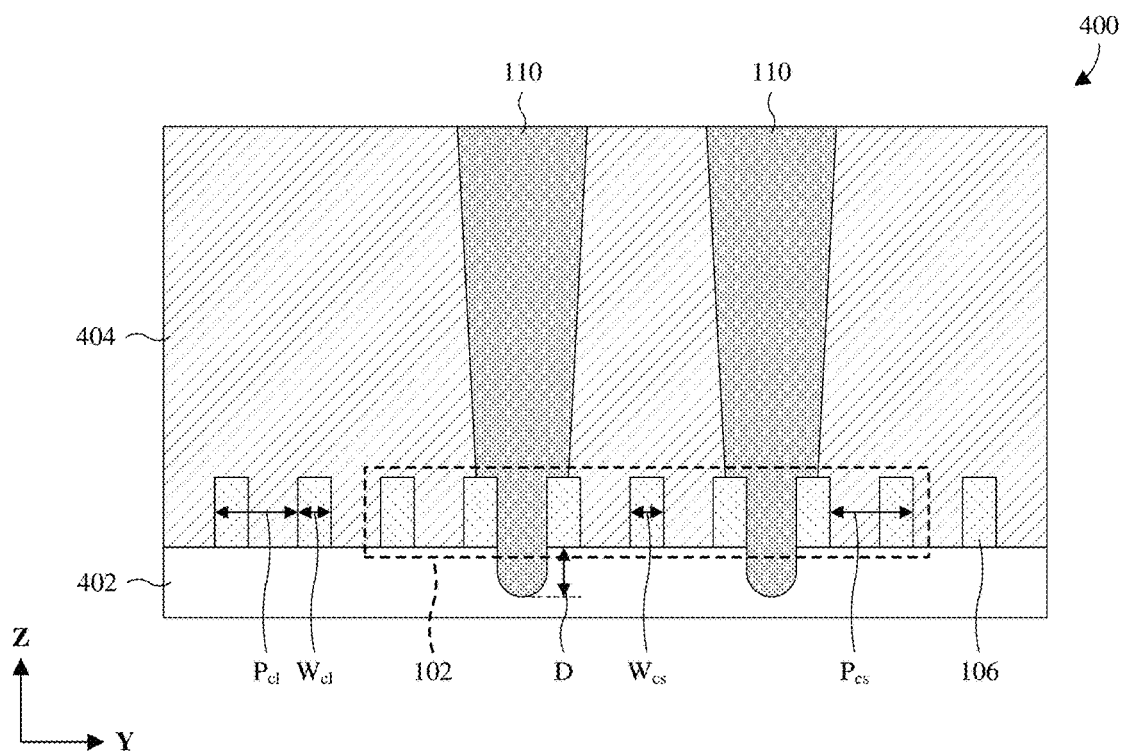
FIG. 4 illustrates a cross-sectional view of some embodiments of the IC chip of FIG. 3 along line A of FIG. 3.

With reference to FIG. 4, a cross-sectional view 400 of some embodiments of the IC chip of FIG. 3 along line A of FIG. 3 is provided. The conductive socket 102 and the conductive lines 106 overlie a dielectric layer 402. The dielectric layer 402 may, for example, be or comprise silicon oxide, silicon nitride, some other suitable dielectric(s), or any combination of the foregoing. In some embodiments, the dielectric layer 402 is an intermetal dielectric (IMD) layer, an interlayer dielectric (ILD) layer, or some other suitable dielectric.

The contacts/vias 110 overlie and electrically couple to the conductive socket 102. Further, the contacts/vias 110 protrude through the conductive socket 102 into the dielectric layer 402. In some embodiments, the contacts/vias 110 protrude into the dielectric layer 402 to a depth D less than about 30 nanometers, 40 nanometers, or some other suitable value.

An interconnect dielectric layer 404 surrounds the contacts/vias 110, the conductive lines 106, and the conductive socket 102 over the dielectric layer 402. The interconnect dielectric layer 404 may, for example, be or comprise undoped silicate glass (USG) and/or some other suitable dielectric(s). In some embodiments, the interconnect dielectric layer 404 is an IMD layer, an ILD layer, or some other suitable dielectric.

Figure 5A:
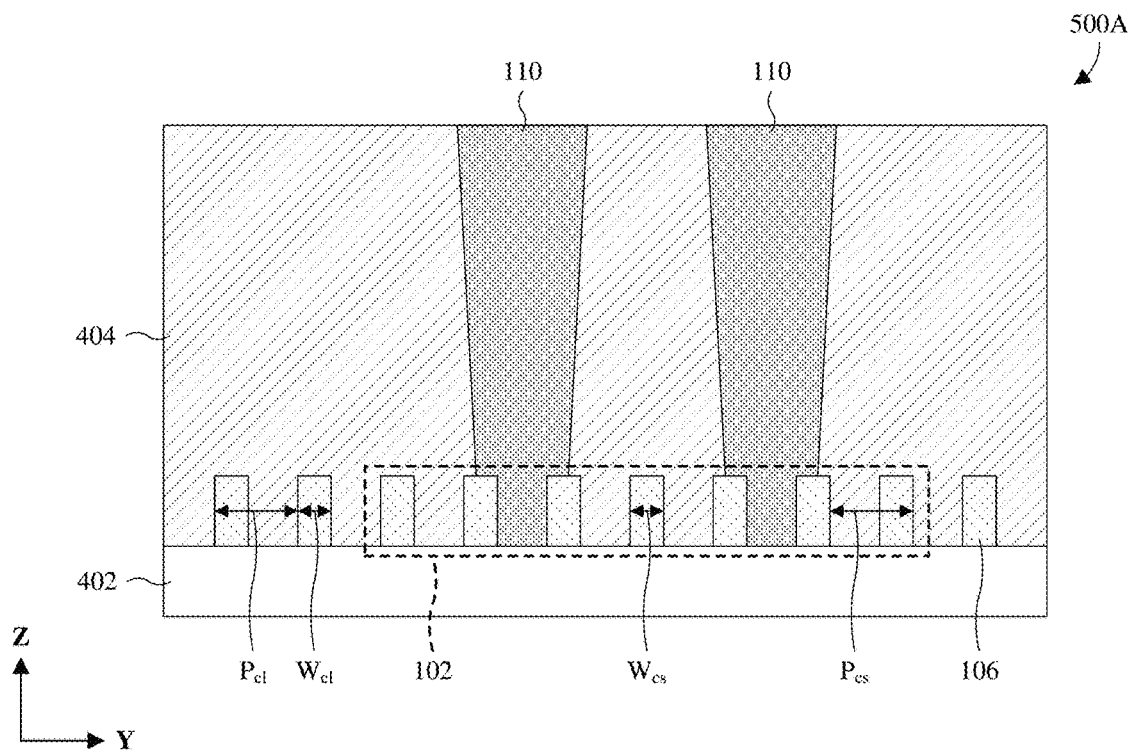
FIGS. 5A and 5B illustrate cross-sectional views of some alternative embodiments of the IC chip of FIG. 4.
Figure 5B:
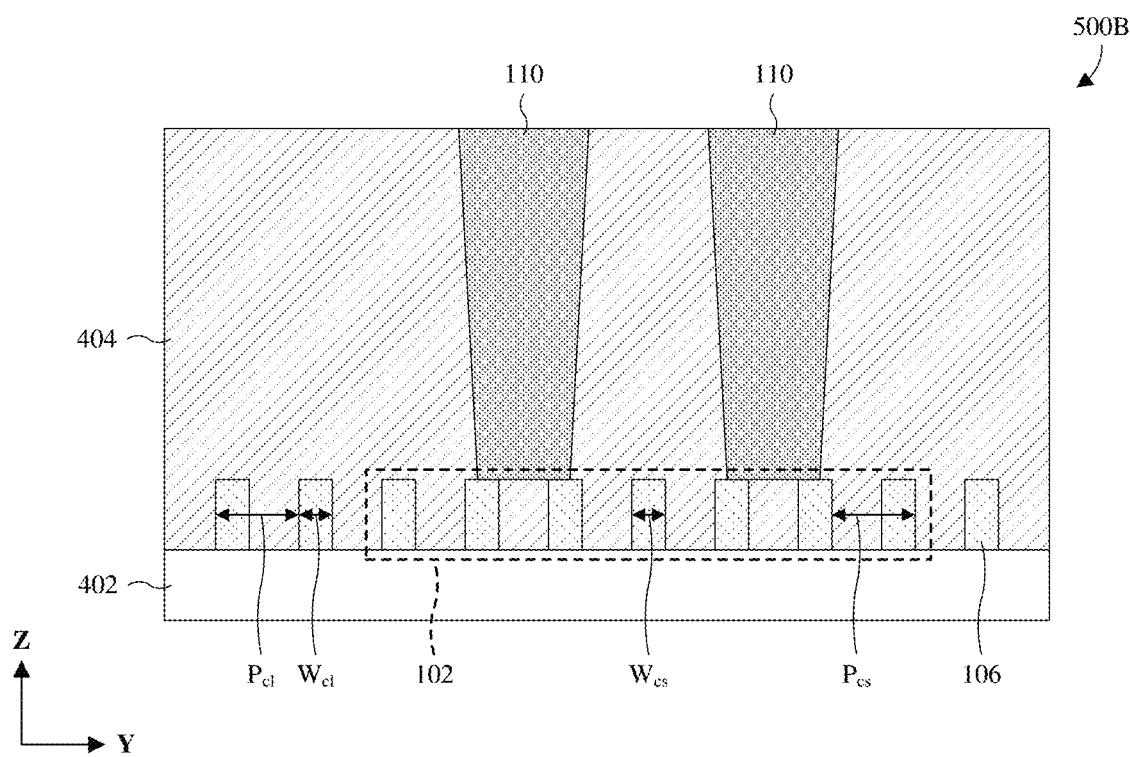

With reference to FIGS. 5A and 5B, cross-sectional views 500A, 500B of some alternative embodiments of the IC chip of FIG. 4 are provided. In FIG. 5A, the contacts/vias 110 have individual bottom surfaces level with a bottom surface of the conductive socket 102. In FIG. 5B, the bottom surfaces of the contacts/vias 110 are over a top surface of the conductive socket 102. In alternative embodiments, the bottom surfaces of the contacts/vias 110 are elevated relative to the bottom surface of the conductive socket 102 and are further recessed relative to the top surface of the conductive socket 102.

Figure 6:
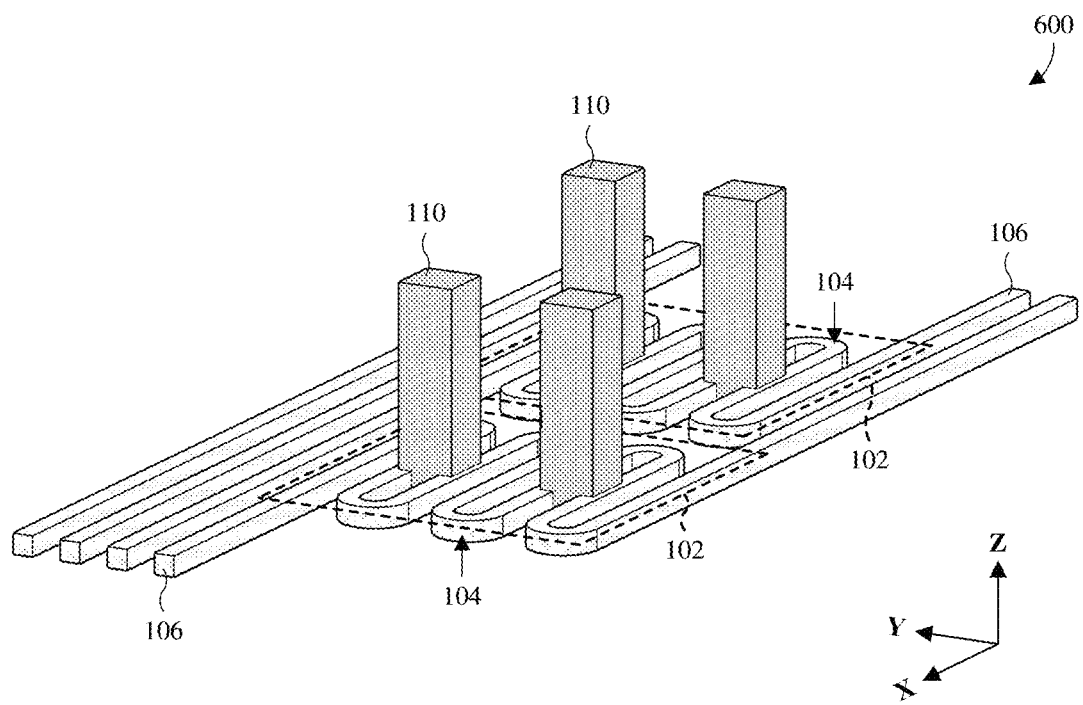
FIG. 6 illustrates a perspective view of some embodiments of the IC chip of FIG. 3.

With reference to FIG. 6, a perspective view 600 of some embodiments of the IC chip of FIG. 3 is provided.

Figure 7:
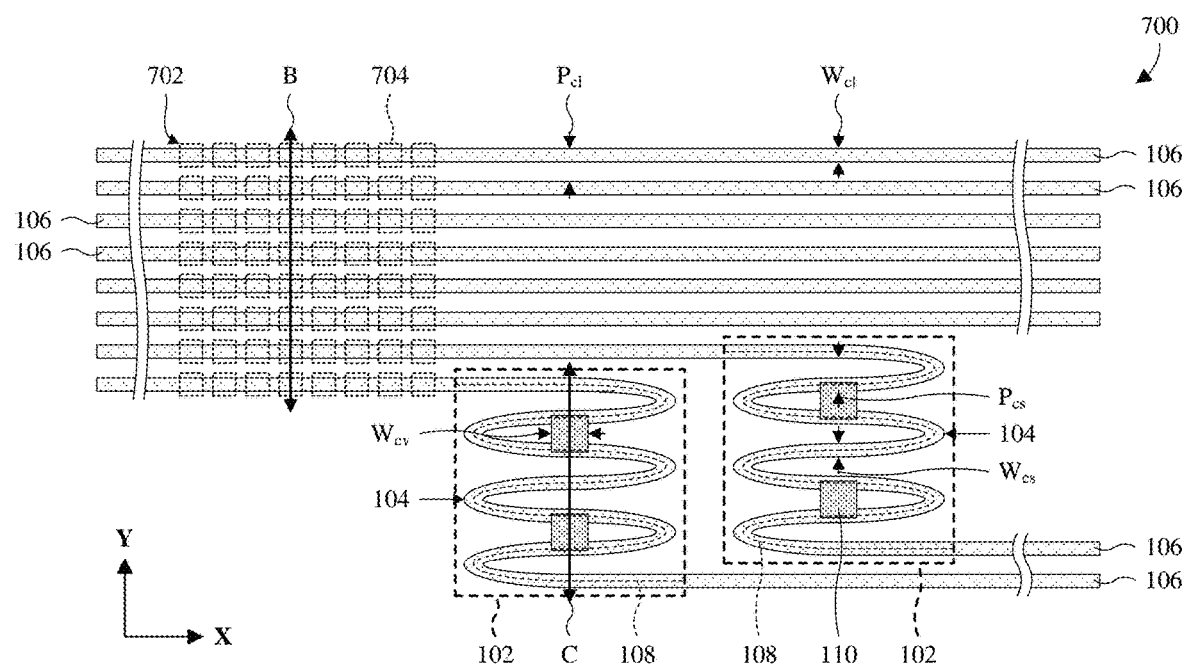
FIG. 7 illustrates a top layout view of some embodiments of the IC chip of FIG. 3 in which conductive lines partially form an array of semiconductor devices.

With reference to FIG. 7, a top layout view 700 of some embodiments of the IC chip of FIG. 3 is provided in which the IC chip has additional conductive lines 106 and in which the conductive lines 106 partially form an array 702 of semiconductor devices 704 with a plurality of rows and a plurality of columns. The semiconductor devices 704 may, for example, be or comprise memory cells, transistors, metal-insulator-metal (MIM) capacitors, other suitable types of semiconductor device(s), or any combination of the foregoing.

Figure 8:
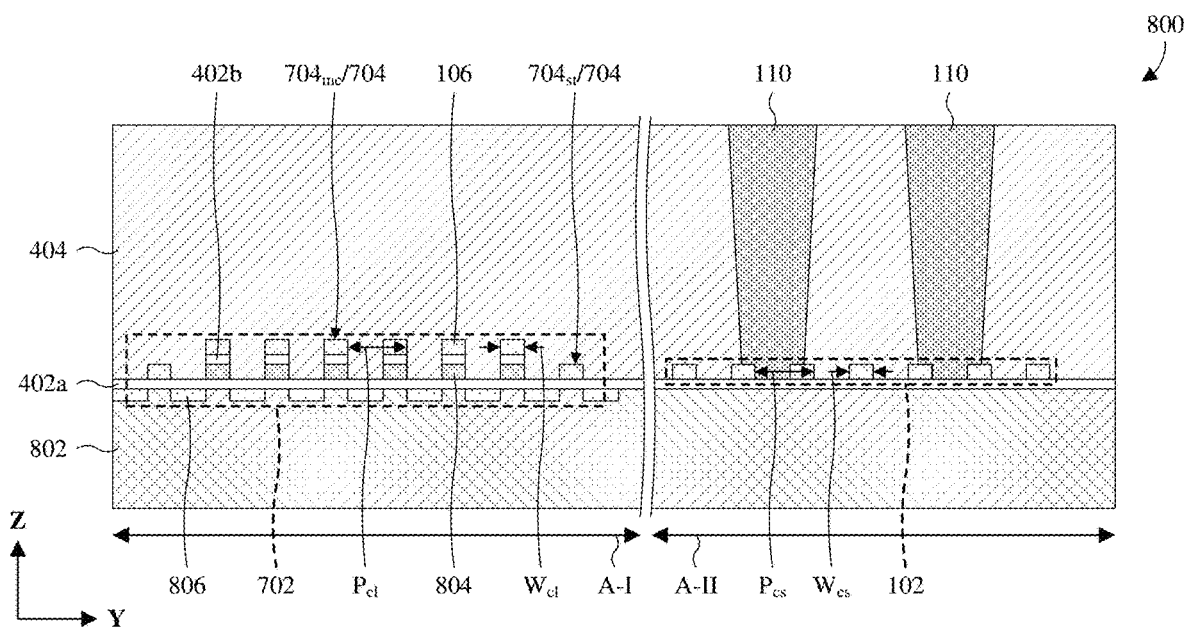
FIG. 8 illustrates a cross-sectional view of some embodiments of the IC chip of FIG. 7.

With reference to FIG. 8, a cross-sectional view 800 of some embodiments of the IC chip of FIG. 7 is provided. The cross-sectional view 800 has a first section A-I taken along line B in FIG. 7, and further has a second section A-II taken along line C in FIG. 7. The conductive sockets 102 and the array 702 overlie a semiconductor substrate 802, and the conductive sockets 102 are separated from the semiconductor substrate 802 by a first dielectric layer 402a.

The array 702 comprises a plurality of select transistors $704_{st}$ and a plurality of memory cells $704_{mc}$. The select transistors $704_{st}$ are at a periphery of the array 702, whereas the memory cells $704_{mc}$ are at an interior of the array 702 and are separated from the periphery by the select transistors $704_{st}$. The select transistors $704_{st}$ and the memory cells $704_{mc}$ are arranged according to a NAND memory architecture, but may alternatively be arranged according to a NOR memory architecture or some other suitable type of memory architecture.

The select transistors $704_{st}$ and the memory cells $704_{mc}$ are formed by the first dielectric layer 402a, a second dielectric layer 402b, a plurality of floating gate electrodes 804, the conductive lines 106, and a plurality of source/drain regions 806. The source/drain regions 806 are doped regions of the semiconductor substrate 802. The first dielectric layer 402a overlies the semiconductor substrate 802, the floating gate electrodes 804 overlie the first dielectric layer 402a, the second dielectric layer 402b overlies the floating gate electrodes 804, and the conductive lines 106 overlie the first dielectric layer 402a. The first and second dielectric layers 402a, 402b may, for example, be or comprise silicon oxide and/or some other suitable dielectric(s). The floating gate electrodes 804 are configured to store data and may, for example, be or comprise doped polysilicon and/or some other suitable material(s).

Each of the select transistors $704_{st}$ comprises a gate electrode formed by a corresponding one of the conductive lines 106 and separated from the semiconductor substrate 802 by the first dielectric layer 402a. Further, each of the select transistors $704_{st}$ comprises a pair of the source/drain regions 806 between which the gate electrode is laterally sandwiched. The select transistors $704_{st}$ may, for example, be metal-oxide-semiconductor field-effect transistors (MOSFETs) or some other suitable type of transistor. In some embodiments, the conductive lines 106 of the select transistors $704_{st}$ may be regarded as select lines.

Each of the memory cells $704_{mc}$ comprises a gate stack comprising a corresponding one of the floating gate electrodes 804 and a control gate electrode formed by a corresponding one of the conductive lines 106. The corresponding one of the floating gate electrodes 804 is separated from the control gate electrode and the semiconductor substrate 802 respectively by the first dielectric layer 402a and the second dielectric layers 402b. Further, each of the memory cells $704_{mc}$ comprises a pair of the source/drain regions 806 between which the gate stack is laterally sandwiched. The memory cells $704_{mc}$ may, for example, be flash memory cells or some other suitable type of memory cell. In some embodiments, the conductive lines 106 of the memory cells $704_{mc}$ may be regarded as word lines.

Figure 9:
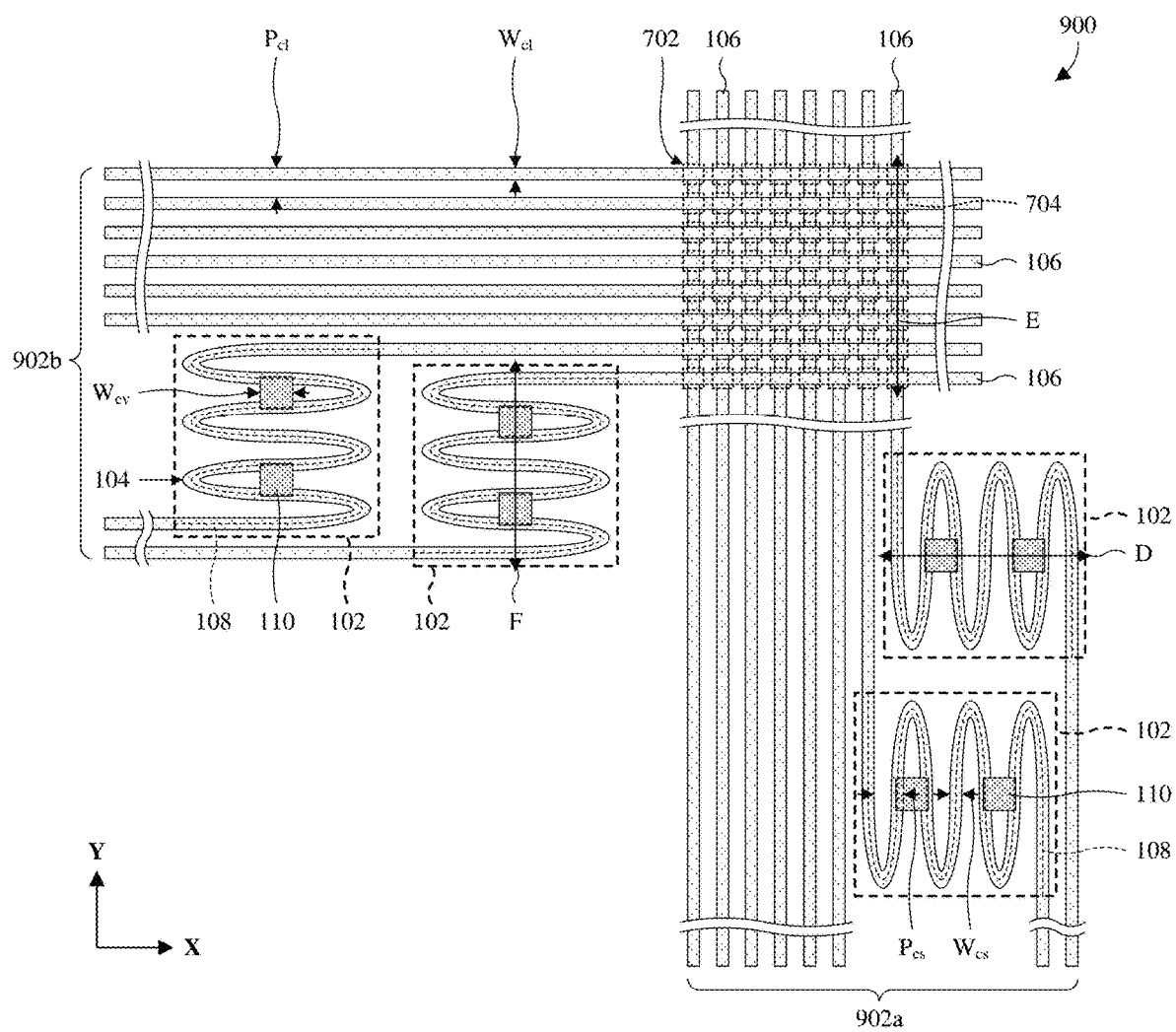
FIG. 9 illustrates a top layout view of some alternative embodiments of the IC chip of FIG. 7 in which the semiconductor devices are at cross points of the conductive lines.

With reference to FIG. 9, a top layout view 900 of some alternative embodiments of the IC chip of FIG. 7 is provided in which the IC chip has additional conductive lines and conductive sockets and in which the semiconductor devices 704 of the array 702 are at cross points of the conductive lines 106.

The conductive lines 106 and the conductive sockets 102 are grouped into a first deck 902a and a second deck 902b, which correspond to different elevations when the IC chip is viewed in profile or cross-section. The conductive lines 106 of the first deck 902a are elongated in parallel in a first dimension (e.g., a Y dimension), and the conductive sockets 102 of the first deck 902 extend from corresponding conductive lines of the first deck 902a in a second dimension (e.g., an X dimension) transverse to the first dimension. Similarly, the conductive lines 106 of the second deck 902b are elongated in parallel in the second dimension, and the conductive sockets 102 of the second deck 902b extend from corresponding conductive lines of the second deck 902b in the first dimension. In some embodiments, the conductive lines 106 of the first deck 902a may be regarded as word lines and the conductive lines 106 of the second deck 902b may be regarded as bit lines or vice versa.

As seen hereafter, an etch may be used to form the conductive lines 106 and the conductive sockets 102 for any given deck (e.g., the first deck 902a or the second deck 902b). Because the width $W_{cs}$ of the conductive sockets 102 and the width $W_{cl}$ of the conductive lines 106 may be the same or substantially the same, a sidewall spacer structure may be used as a mask to form both the conductive lines 106 and the conductive sockets 102 for the given deck during the etch. This, in turn, allows the conductive sockets 102 and the conductive lines 106 for the given deck to be formed using a common photomask or reticle (e.g., the photomask or reticle used to form a mandrel from which the sidewall spacer structure is formed) rather than separate photomasks or reticles. Accordingly, a top layout of the conductive sockets 102 may lead to at least a one-photomask/reticle savings per deck and may hence lead to at least a two-photomask/reticle savings in FIG. 9. This may, in turn, reduce costs.

Figure 10:
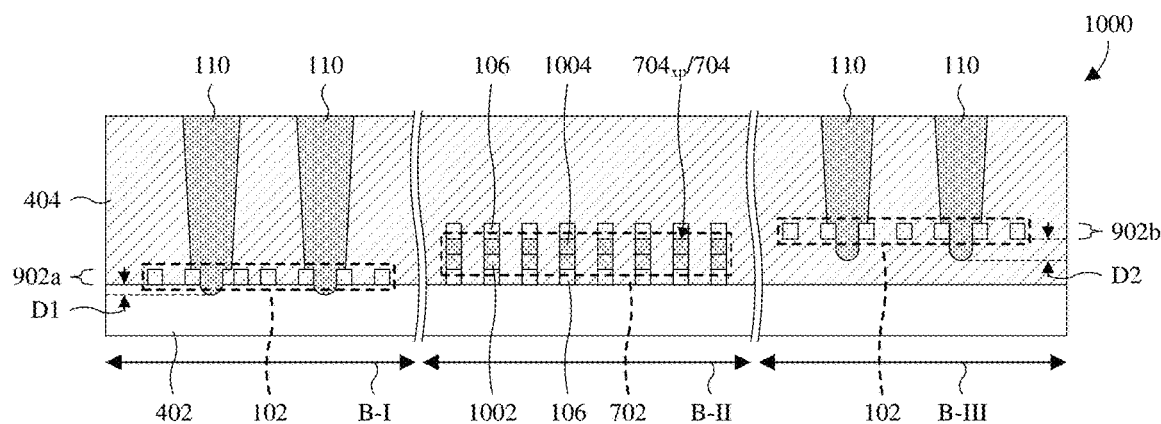
FIG. 10 illustrates a cross-sectional view of some embodiments of the IC chip of FIG. 9.

With reference to FIG. 10, a cross-sectional view 1000 of some embodiments of the IC chip of FIG. 9 is provided. The cross-sectional view 1000 has a first section B-I taken along line D in FIG. 9, a second section B-II taken along line E in FIG. 9, and a third section B-III taken along F in FIG. 9. The conductive lines 106 and the conductive sockets 102 overlie a dielectric layer 402 and are further covered by and surrounded by an interconnect dielectric layer 404. Further, the second deck 902b is elevated relative to the first deck 902a, and the array 702 of the semiconductor devices 704 is between the first and second decks 902a, 902b.

The array 702 comprises a plurality of crosspoint devices $704_{xp}$, each extending from a corresponding one of the conductive lines 106 in the first deck 902a to a corresponding one of the conductive lines 106 in the second deck 902b. The crosspoint devices $704_{xp}$ comprise individual selectors 1002 and individual memory cells 1004 respectively overlying the selectors 1002. Such a selector is configured to selectively conduct depending on whether a voltage across the selector exceeds a threshold voltage, and such a memory cell 1004 is configured to store data. The selectors 1002 may, for example, be ovonic threshold switches (OTSs) or the like. The memory cells 1004 may, for example, be resistive random-access memory (RRAM) cells, ferroelectric random-access memory (FeRAM) cells, phase change random-access memory (PCRAM), magnetoresistive random-access memory (MRAM), or the like.

The contacts/vias 110 overlie and electrically couple respectively to the conductive sockets 102. Further, the contacts/vias 110 extend through the conductive sockets 102. The contacts/vias 110 at the conductive sockets 102 in the first deck 902a extend into the dielectric layer 402 to a first depth D1, and the contacts/vias 110 at the conductive sockets 102 in the second deck 902b extend into the interconnect dielectric layer 404 to a second depth D2. In some embodiments, the first depth D1 is less than the second depth D2. In other embodiments, the first depth D1 is or is less than about 30 nanometers or some other suitable value, and/or the second depth D2 is or is less than about 40 nanometers or some other suitable value.

In alternative embodiments, the contacts/vias 110 at the conductive sockets 102 in the first deck 902a have individual bottom surfaces level with or elevated relative to a bottom surface of the conductive sockets 102 in the first deck 902a as in FIGS. 5A and 5B. Further, in alternative embodiments, the contacts/vias 110 at the conductive sockets 102 in the second deck 902b have individual bottom surfaces level with or elevated relative to a bottom surface of the conductive sockets 102 in the second deck 902b as in FIGS. 5A and 5B.

Figure 11:
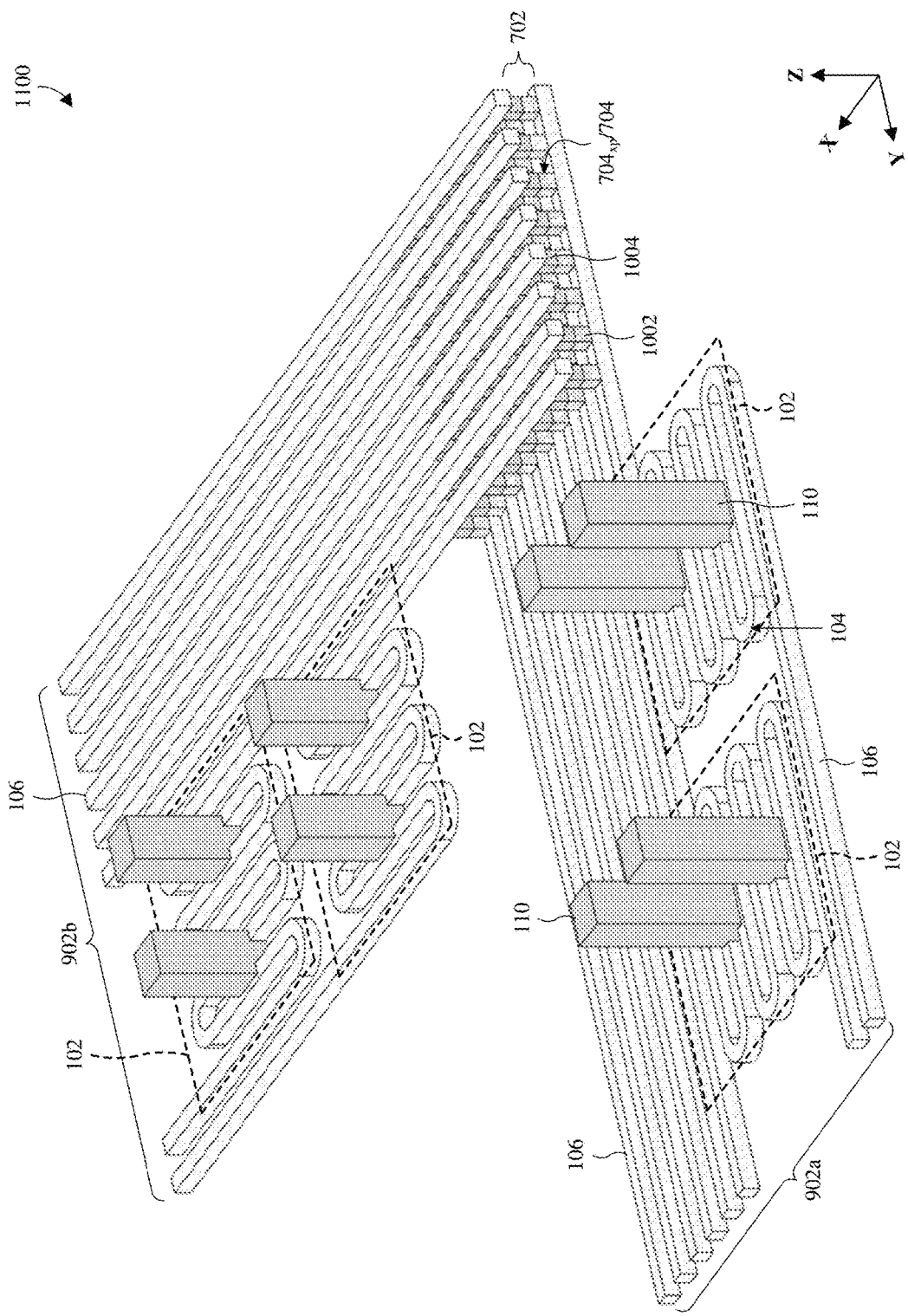
FIG. 11 illustrates a perspective view of some embodiments of the IC chip of FIG. 9.

With reference to FIG. 11, a perspective view 1100 of some embodiments of the IC chip of FIG. 9 is provided.

Figure 12:
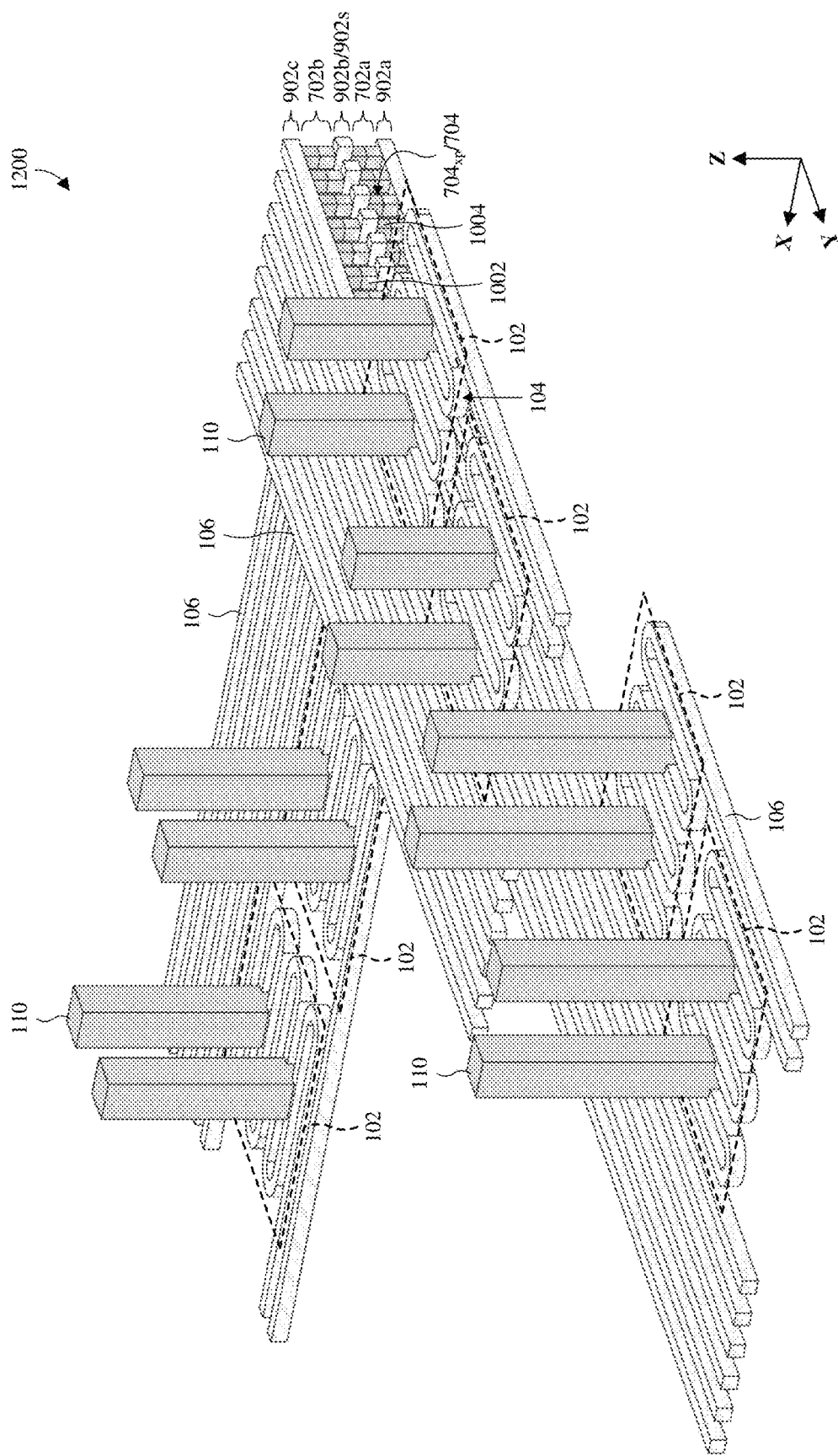
FIG. 12 illustrates a perspective view of some alternative embodiments of the IC chip of FIG. 9 in which multiple arrays of semiconductor devices are stacked with and share a deck of conductive lines and conductive sockets.

With reference to FIG. 12, a perspective view 1200 of some alternative embodiments of the IC chip of FIG. 9 is provided in which multiple arrays of semiconductor devices 704 are stacked with and share a deck 902s of conductive lines 106 and conductive sockets 102. The conductive lines 106 and the conductive sockets 102 are grouped into a first deck 902a, a second deck 902b, and a third deck 902c. The second deck 902b corresponds to the shared deck 902s and overlies the first deck 902a, and the third deck 902c overlies the second deck 902b. The first and second decks 902a, 902b are as illustrated and described with regard to FIGS. 9-11, and the third deck 902c is as the first deck 902a is illustrated and described with regard to FIGS. 9-11. However, conductive-line lengths may be different from FIGS. 9-11.

The multiple arrays comprise a first array 702a and a second array 702b overlying the first array 702a. The first array 702a is between the first and second decks 902a, 902b, and the second array 702b is between the second and third decks 902b, 902c. In some embodiments, the conductive lines 106 of the first and third decks 902a, 902c may be regarded as word lines, and the conductive lines 106 of the second deck 902b may be regarded as bit lines, or vice versa. The first and second arrays 702a, 702b are each as the array 702 is illustrated and described with regard to FIGS. 9-11 and hence the semiconductor devices 704 comprise individual selectors 1002 and individual memory cells 1004 respectively overlying the selectors 1002. Further, the semiconductor devices 704 are at cross points for corresponding conductive lines.

As noted above, a top layout of the conductive sockets 102 may lead to at least a one-photomask/reticle savings per deck and may hence lead to at least a three-photomask/reticle savings in FIG. 12. Further, by sharing a deck between arrays, one less deck may be formed compared to what would otherwise be formed. Therefore, by sharing the second deck 902b, there may be at least a one-photomask/reticle savings in FIG. 12. In total, the embodiments of FIG. 12 may have at a least a four-photomask/reticle savings.

Figure 13:
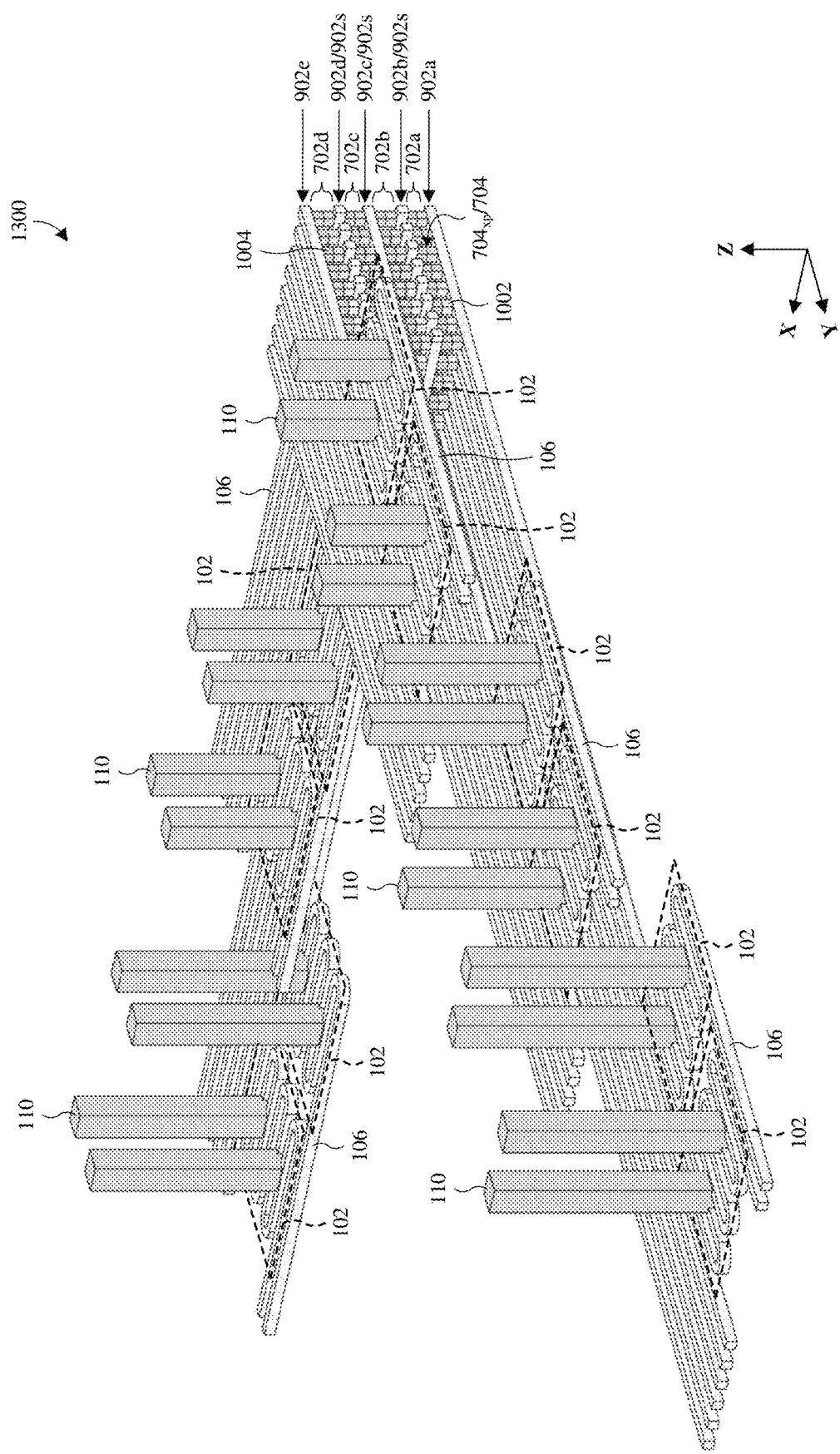
FIG. 13 illustrates a perspective view of some alternative embodiments of the IC chip of FIG. 9 in which multiple arrays of semiconductor devices are alternatingly stacked with and share multiple decks of conductive lines and conductive sockets.

With reference to FIG. 13, a perspective view 1300 of some alternative embodiments of the IC chip of FIG. 9 is provided in which multiple arrays of semiconductor devices 704 are alternatingly stacked with and share multiple decks 902s of conductive lines 106 and conductive sockets 102. The conductive lines 106 and the conductive sockets 102 are grouped into a first deck 902a, a second deck 902b overlying the first deck 902a, a third deck 902c overlying the second deck 902b, a fourth deck 902d overlying the third deck 902c, and a fifth deck 902e overlying the fourth deck 902d. Further, the second, third, and fourth decks 902b-902d correspond to the shared decks 902s. The first and second decks 902a, 902b are as illustrated and described with regard to FIGS. 9-11, except conductive-line lengths may be different. Further, the third and fifth decks 902c, 902e are as the first deck 902a is illustrated and described with regard to FIGS. 9-11, and the fourth deck 902d is as the second deck 902b is illustrated and described with regard to FIGS. 9-11, except conductive-line lengths may be different.

The multiple arrays comprise a first array 702a, a second array 702b overlying the first array 702a, a third array 702c overlying the second array 702b, and a fourth array 702d overlying the third array 702c. The first array 702a is between the first and second decks 902a, 902b, the second array 702b is between the second and third decks 902b, 902c, the third array 702c is between the third and fourth decks 902c, 902d, and the fourth array 702d is between the fourth and fifth decks 902d, 902e. In some embodiments, the conductive lines 106 of the first, third, and fifth decks 902a, 902c, 902e may be regarded as word lines, and the conductive lines 106 of the second and fourth decks 902b, 902d may be regarded as bit lines, or vice versa. The first, second, third, and fourth arrays 702a-702d are each as the array 702 is illustrated and described with regard to FIGS. 9-11. Hence, the semiconductor devices 704 are at cross points for corresponding conductive lines and comprise individual selectors 1002 and individual memory cells 1004 respectively overlying the selectors 1002.

As noted above, a top layout of the conductive sockets 102 may lead to at least a one-photomask/reticle savings per deck and may hence lead to at least a five-photomask/reticle savings in FIG. 13. Further, as noted above, one less deck is formed per shared deck, thereby leading to at least a three-photomask/reticle savings in FIG. 13. Therefore, the embodiments of FIG. 13 may lead to at least an eight-photomask/reticle savings or more.

Figure 14:
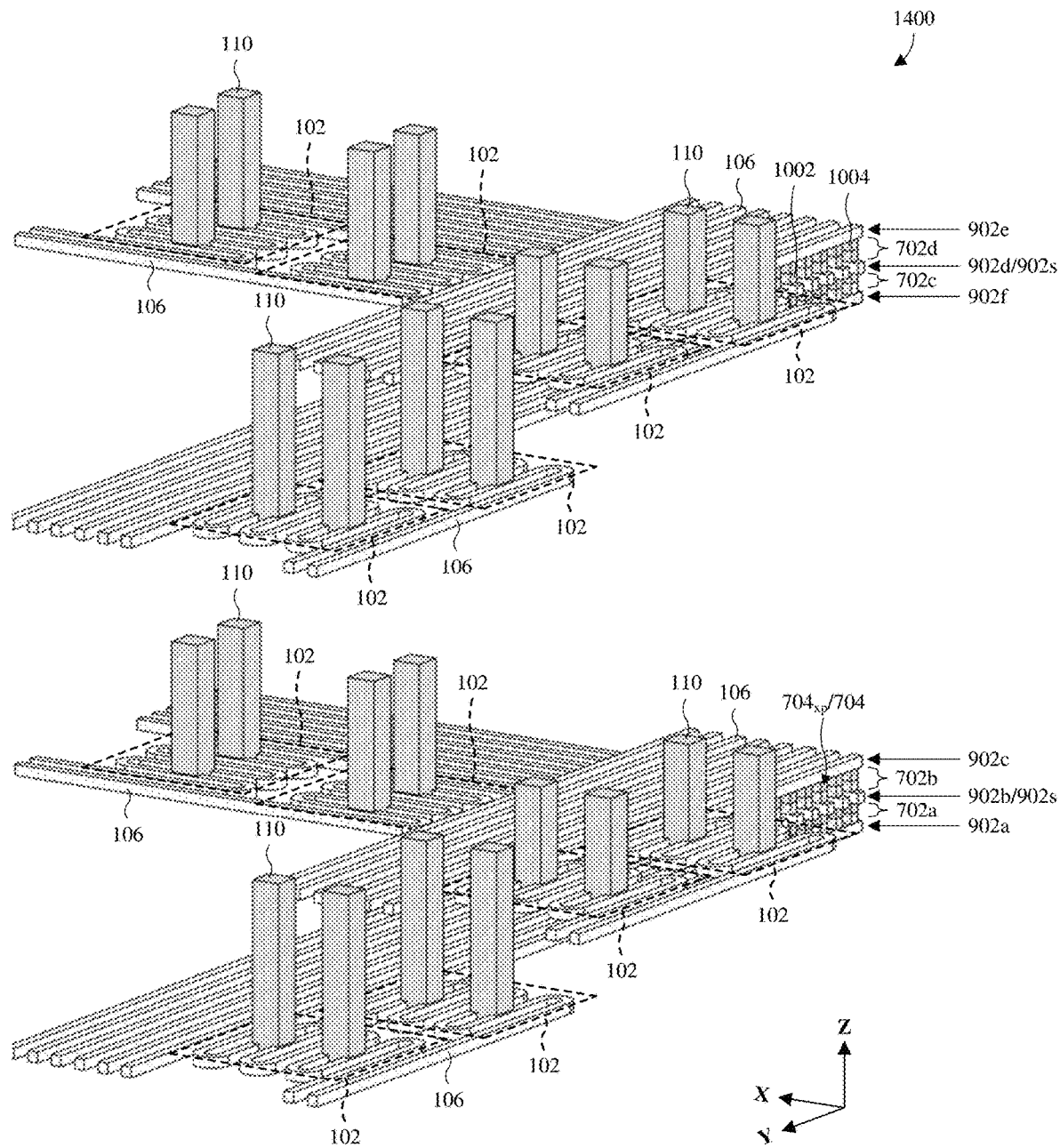
FIG. 14 illustrates a perspective view of some alternative embodiments of the IC chip of FIG. 13.

With reference to FIG. 14, a perspective view 1400 of some alternative embodiments of the IC chip of FIG. 13 is provided in which the second and third arrays 702b, 702c no longer share the third deck 902c. Instead, the third deck 902c is individual to the second array 702b, and the third array 702c has a sixth deck 902f in place of the third deck 902c. The sixth deck is as the first deck 902a is illustrated and described with regard to FIGS. 9-11, except conductive-line lengths may be different. In some embodiments, a level of conductive wires (not shown) separates the third and sixth decks 902c, 902f. The contacts/vias 110 of the first, second, and third decks 902a-902c may, for example, extend respectively to the conductive wires.

Figure 15:
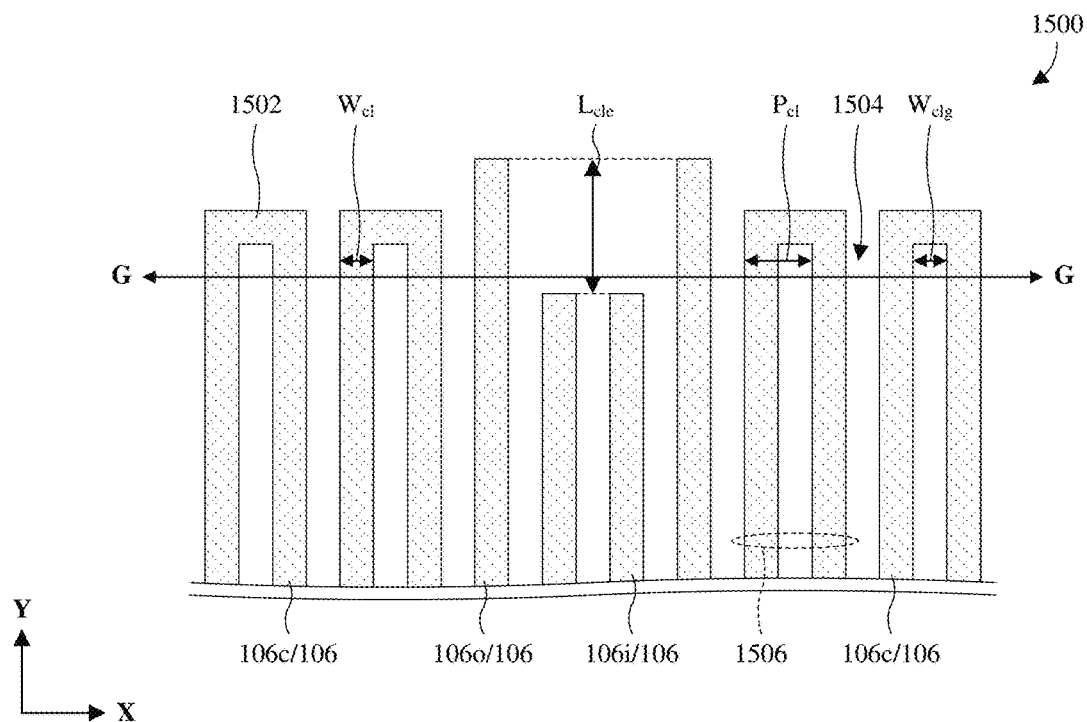
FIG. 15 illustrates a top layout view of some embodiments of an IC chip in which cut inner conductive lines have ends laterally offset from ends of cut outer conductive lines in a dimension along which the cut outer conductive lines are elongated.

With reference to FIG. 15, a top layout view 1500 of some embodiments of an IC chip is provided in which two cut inner conductive lines 106i bordering each other are between and border two cut outer conductive lines 106o. Further, the cut outer conductive lines 106o have individual ends laterally offset from individual ends of the cut inner conductive lines 106i by a length $L_{cle}$ in a first dimension (e.g., an X dimension) along which the cut inner and outer conductive lines 106i, 106o are elongated in parallel.

The cut inner and outer conductive lines 106i, 106o are part of a plurality of conductive lines 106, which further include a plurality of connected conductive lines 106c elongated in parallel with the cut inner and outer conductive lines 106i, 106o in the first dimension. The connected conductive lines 106c are grouped into non-overlapping, neighboring pairs that are connected at ends by corresponding conductive bridges 1502. The conductive bridges 1502 each extend between the connected conductive lines of a corresponding pair in a second dimension (e.g., a Y dimension) transverse to the first dimension to connect the connected conductive lines. In contrast, the cut inner and outer conductive lines 106i, 106o are disconnected from each other and have no conductive bridges. Hence, the cut inner and outer conductive lines 106i, 106o are cut in the sense that the cut inner and outer conductive lines 106i, 106o are disconnected. The plurality of conductive lines 106 may, for example, be or comprise metal and/or some other suitable conductive material(s). In alternative embodiments, the conductive lines 106 are dielectric or some other suitable type of material and would hence be referred to as dielectric lines or by some other suitable name.

The plurality of conductive lines 106 are separated by a pitch $P_{cl}$ in the second dimension. In some embodiments, the pitch $P_{cl}$ is two times a width $W_{cs}$ of the conductive lines 106, whereby conductive-line gaps 1504 separating the conductive lines 106 may have a width $W_{clg}$ that is the same or substantially the same as the width $W_{cl}$ of the conductive lines 106. By substantially the same, it is meant that the width $W_{clg}$ of the conductive-line gaps 1504 is within about 5%, 10%, 20%, or some other suitable percentage of the width $W_{cl}$ of the conductive lines 106. In other embodiments, the width $W_{cl}$ of the conductive lines 106 and the width $W_{clg}$ of the conductive-line gaps 1504 are different and not substantially the same.

As seen hereafter, a self-aligned double patterning process may be performed to form the conductive lines 106 with small widths $W_{cl}$ and a small pitch $P_{cl}$. However, forming the conductive lines 106 according to the self-aligned double patterning process may result in ends of the conductive lines 106 being connected (e.g., as illustrated for the connected conductive lines $106_c$). For at least some of the conductive lines 106, it may be useful for the conductive lines (e.g., the cut inner and outer conductive lines 106i, 106o) to be disconnected from each other. A process for disconnecting conductive lines may, for example, comprise a photolithography/etching process to cut an end of a sidewall spacer structure which is used as a mask to form the conductive lines. However, depending on a top layout of the sidewall spacer structure, and a top layout of a mandrel from which the sidewall spacer structure is formed, an overlay window for the photolithography/etching process may be small.

Figure 16:
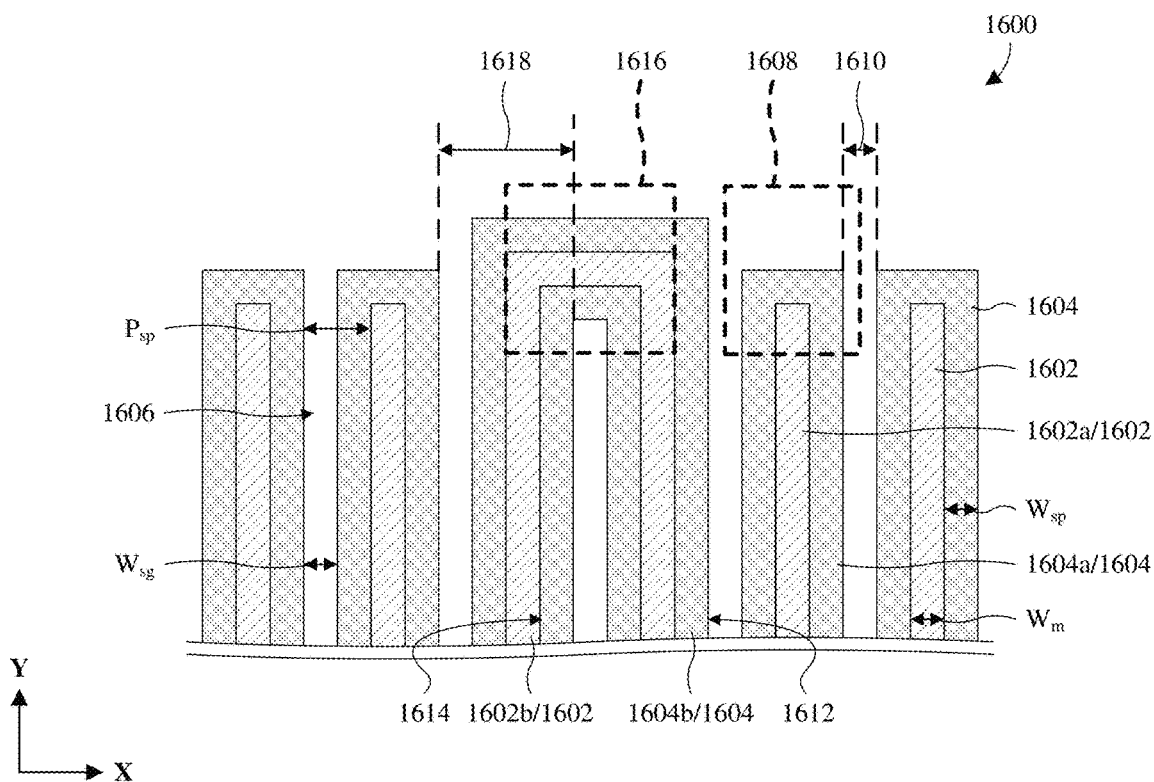
FIG. 16 illustrates a top layout view of some embodiments of a mandrel and a sidewall spacer structure from which the cut inner and outer conductive lines of FIG. 15 may be formed.

With reference to FIG. 16, a top layout view 1600 of some embodiments of mandrels 1602 and sidewall spacer structures 1604 from which the conductive lines 106 of FIG. 15 may be formed is provided to illustrate disconnecting conductive lines. The sidewall spacer structures 1604 are elongated in a first dimension (e.g., a Y dimension) and are separated by spacer gaps 1606 in a second dimension (e.g., an X dimension) transverse to a first dimension. Further, the sidewall spacer structures 1604 repeat with a pitch $P_{sp}$ in the second dimension.

The sidewall spacer structure 1604, the mandrels 1602, and the spacer gaps 1606 respectively have a width $W_{sp}$, a width $W_m$, and a width $W_{sg}$, which are the same. In alternative embodiments, any two of the widths $W_{sp}$, $W_{sg}$, $W_m$ share a common value different than a value of a remaining one of the widths $W_{sp}$, $W_{sg}$, $W_m$. Further, in alternative embodiments, the three widths $W_{sp}$, $W_{sg}$, $W_m$ are different from each other. In some embodiments, the width $W_{sp}$ of the sidewall spacer structure 1604 is the same as the width $W_{cs}$ of the conductive lines 106 of FIG. 15. In some embodiments, the width $W_{sg}$ of the spacer gaps 1606 and/or the width $W_m$ of the mandrels 1602 is/are the same as the width $W_{clg}$ of the conductive-line gaps 1504 of FIG. 15. In some embodiments, the length $L_{cle}$ of FIG. 15 is greater than the width $W_m$ of the mandrels 1602 plus two times the width $W_{sp}$ of the sidewall spacer structure 1604.

As noted above, a self-aligned double patterning process may be performed to form the conductive lines 106 in FIG. 15. For example, to form a pair 1506 of the connected conductive lines 106c from FIG. 15, a first mandrel 1602a having a line-shaped top layout may be formed by a photolithography/etching process, and a first sidewall spacer structure 1604a may subsequently be formed on sidewalls of the first mandrel 1602a by a self-aligned process. The first mandrel 1602a may be removed, and an etch may be performed into a conductive layer (not shown) using the first sidewall spacer structure 1604a as a mask to form the pair 1506 of the connected conductive lines 106c. Hence, the first sidewall spacer structure 1604a may have a same top layout as the pair 1506 of connected conductive lines 106c in FIG. 15.

While the connected conductive lines 106c of the pair 1506 are illustrated as being connected in FIG. 15, the connected conductive lines may alternatively be disconnected by cutting the first sidewall spacer structure 1604a before the etch. To cut the first sidewall spacer structure 1604a, a first photoresist mask having a first opening 1608 may be formed overlying end of the first sidewall spacer structure 1604a. Opposing sidewalls of the first opening 1608 extending in a dimension (e.g., the Y dimension) along which the first sidewall spacer structure 1604a is elongated may be placed respectively on opposite sides of the first sidewall spacer structure 1604a and respectively at centers of the spacer gaps 1606 separating the first sidewall spacer structure 1604a from neighboring ones of the sidewall spacer structures 1604.

If the opposing sidewalls of the first opening 1608 move left or right outside the spacer gaps 1606 (e.g., due to overlay error), one of the neighboring sidewall spacer structures and the corresponding conductive line may be unintentionally cut. This may result in increased resistance or an open circuit. Therefore, the spacer gaps 1606 define a first overlay window 1610. Further, because of use of self-aligned double patterning, the spacer gaps 1606 and hence the first overlay window 1610 may be small. Therefore, the first photoresist mask having the first opening 1608 may depend on a high-resolution photolithography process and/or a high-grade photomask/reticle, which increases costs and reduces throughput.

To form the cut inner and outer conductive lines 106i, 106o in FIG. 15, a process similar to that described for forming and cutting the pair 1506 of the connected conductive lines 106c may be employed. However, instead of using the first mandrel 1602a, a second mandrel 1602b having a top layout that turns at a U-shaped end is used. This results in a second sidewall spacer structure 1604b having an outer spacer segment 1612 and an inner spacer segment 1614. The outer and inner spacer segments 1612, 1614 have top layouts that turn at U-shaped ends, and the inner spacer segment 1614 is nested in the outer spacer segment 1612.

While cutting the second sidewall spacer structure 1604b, a second photoresist mask having a second opening 1616 may be formed overlying an end of the second sidewall spacer structure 1604b. Opposing sidewalls of the second opening 1616 extending in a dimension (e.g., the Y dimension) along which the second sidewall spacer structure 1604b is elongated may be placed respectively on opposite sides of the inner spacer segment 1614. Further, the opposing sidewalls may be placed respectively at sidewalls of the outer spacer segment 1612 that are respectively on the opposite sides and that face the inner spacer segment 1614.

As can be seen, the second opening 1616 may move left or right (e.g., due to overlay error) without unintentionally cutting a neighboring spacer structure so long as the one of the opposing sidewalls in a second overlay window 1618 remains therein. The nested arrangement between the outer and inner spacer segments 1612, 1614, and the U-shaped ends of the outer and inner spacer segments 1612, 1614, allow the second overlay window 1618 to be large compared to the first overlay window 1610 and further allow the second opening 1616 to be large compared to the first opening 1608. Therefore, the second photoresist mask having the second opening 1616 may depend on a low-resolution photolithography process and/or a low-grade photomask/reticle. This may, in turn, reduce costs and/or increase throughput.

Because the widths $W_{sp}$, $W_m$, $W_{sg}$ respectively of the sidewall spacer structures 1604, the mandrels 1602, and the spacer gaps 1606 share a common value in the illustrated embodiments, the first overlay window 1610 may be regarded as +/−½ of the common value and/or +/−¼ of the pitch $P_{sp}$ of the sidewall spacer structures 1604. Further, the second overlay window 1618 may be regarded as +/−2 times the common value and/or +/− the pitch $P_{sp}$ of the sidewall spacer structures 1604. Therefore, the second overlay window 1618 is about 4 times larger than the first overlay window 1610.

In view of the discussion of FIGS. 15 and 16, a mandrel having a top layout that turns at a U-shaped end may be used to form four adjacent conductive lines that are to be disconnected. The U-shaped end leads to a large overlay window when cutting an end of a sidewall spacer structure from which the conductive lines are formed and results in ends of the conductive lines being uneven as illustrated for the cut inner and outer conductive lines 106i, 106o of FIG. 15. Further, as seen hereafter, the mandrel layout may be modified for use forming six, eight, or some other even number of adjacent conductive lines that are to be disconnected.

Figure 17A:
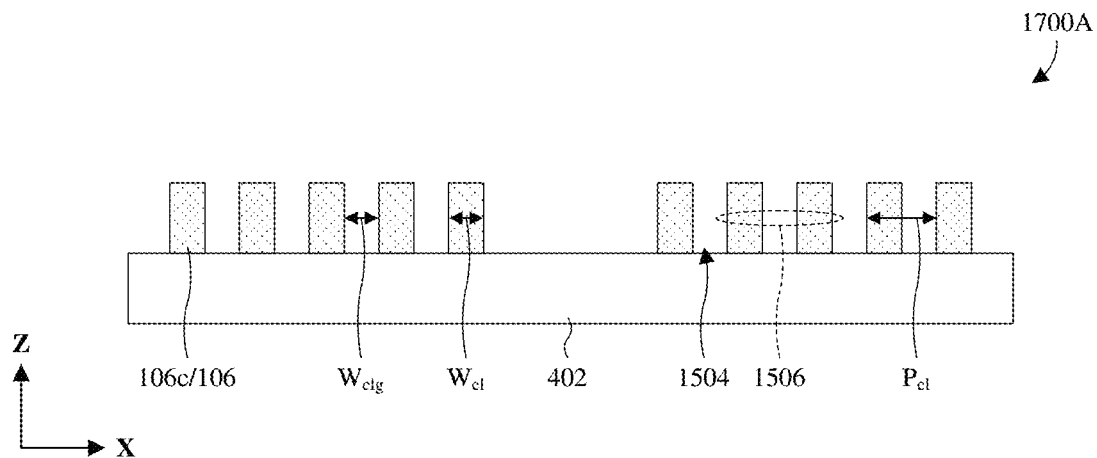
FIGS. 17A and 17B illustrate various views of some embodiments of the IC chip of FIG. 15.
Figure 17B:
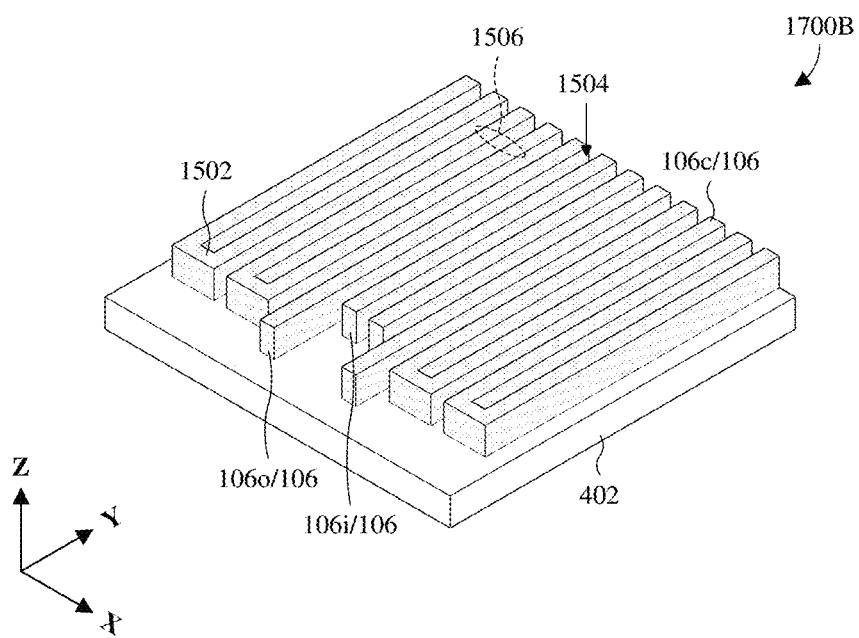

With reference to FIGS. 17A and 17B, various views of some embodiments of the IC chip of FIG. 15 are provided in which the conductive lines 106 and the conductive bridges 1502 are on a dielectric layer 402. FIG. 17A provides a cross-sectional view 1700A along line G of FIG. 15, whereas FIG. 17B provides a perspective view 1700B of FIG. 15.

Figure 18A:
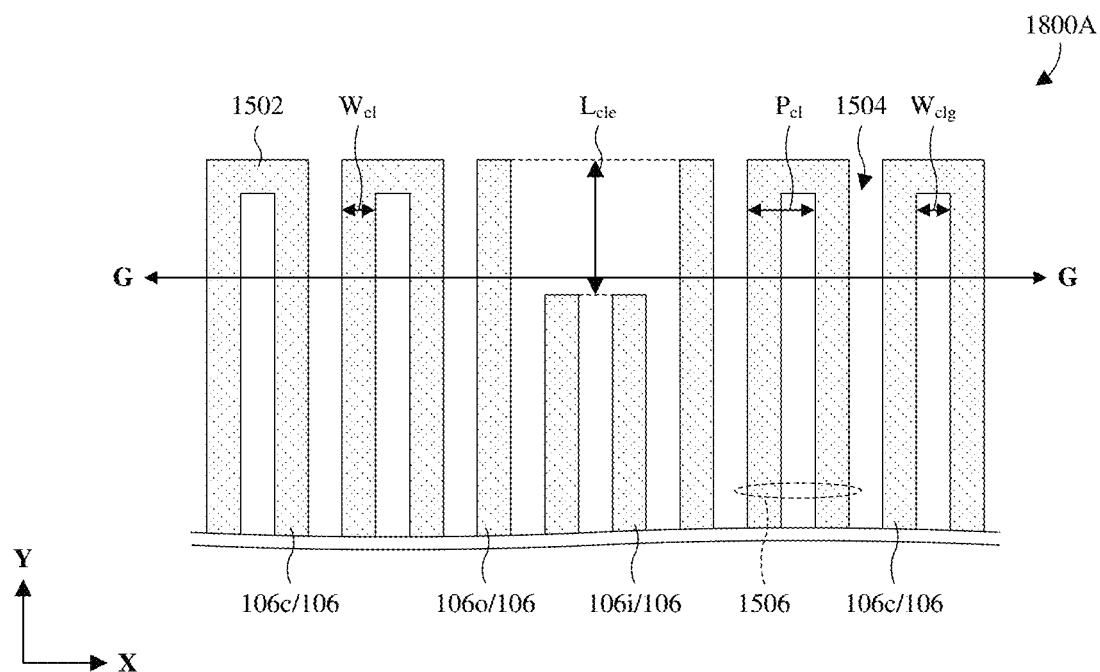
FIGS. 18A-18F illustrate top layout views of some alternative embodiments of the IC chip of FIG. 15.
Figure 18B:
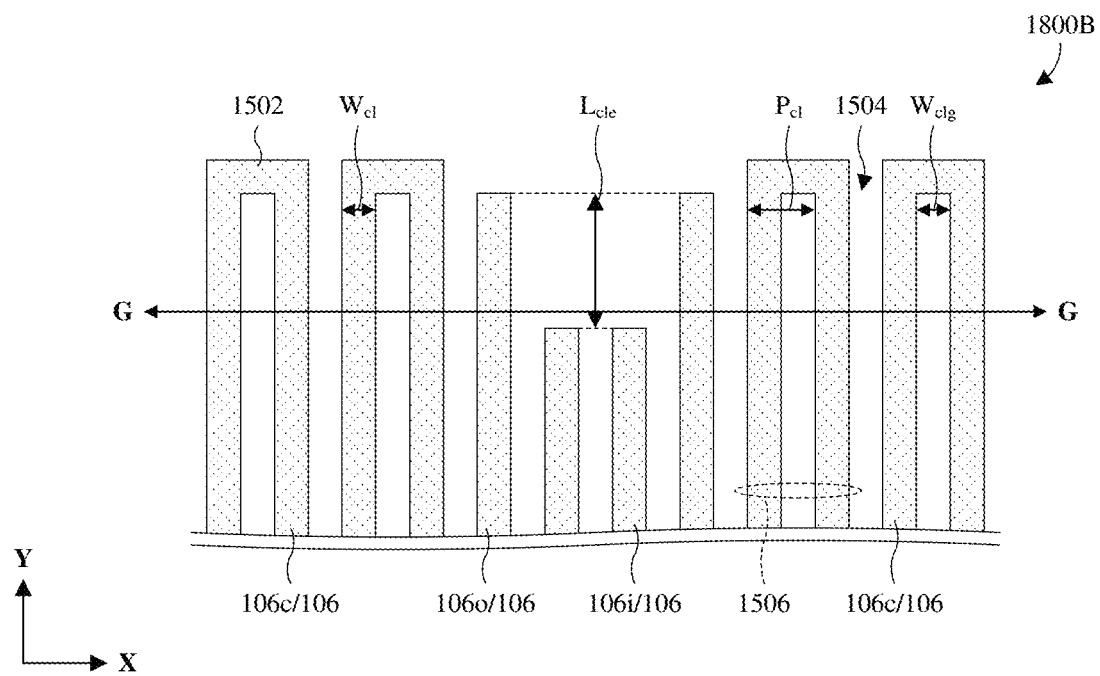
Figure 18C:
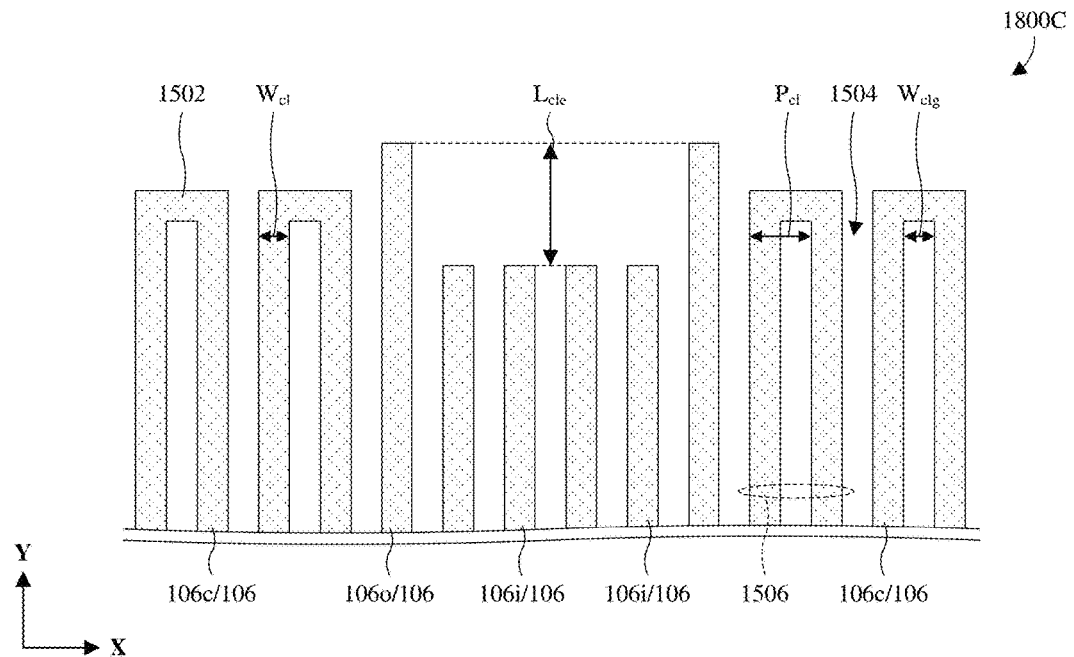
Figure 18D:
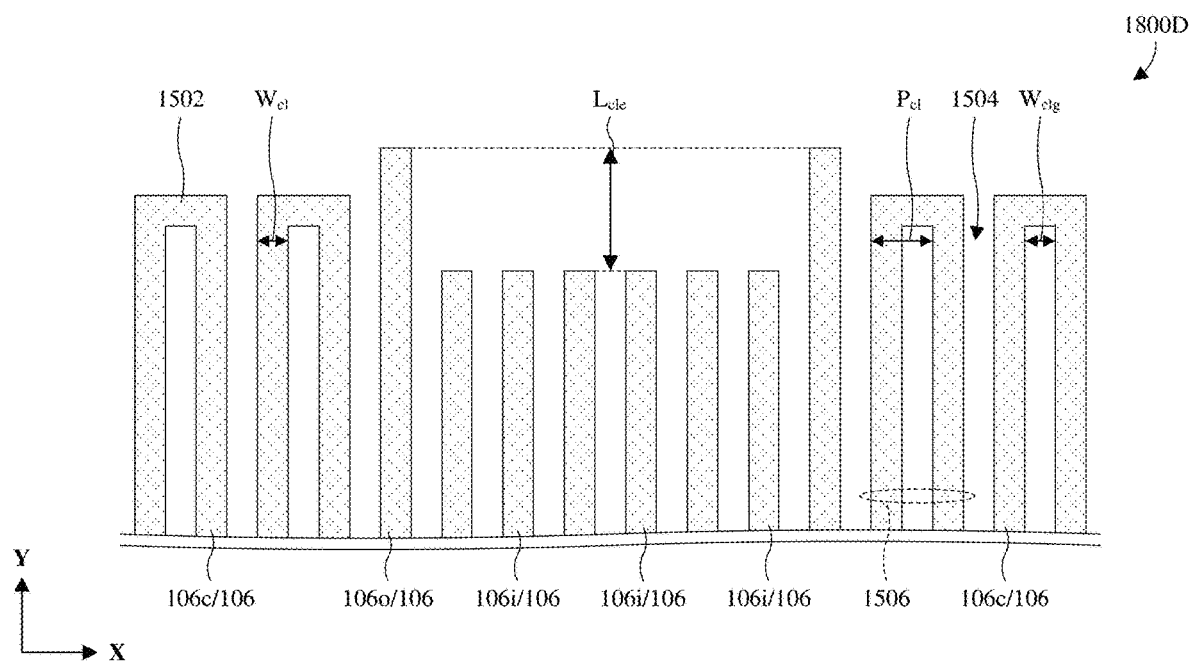
Figure 18E:
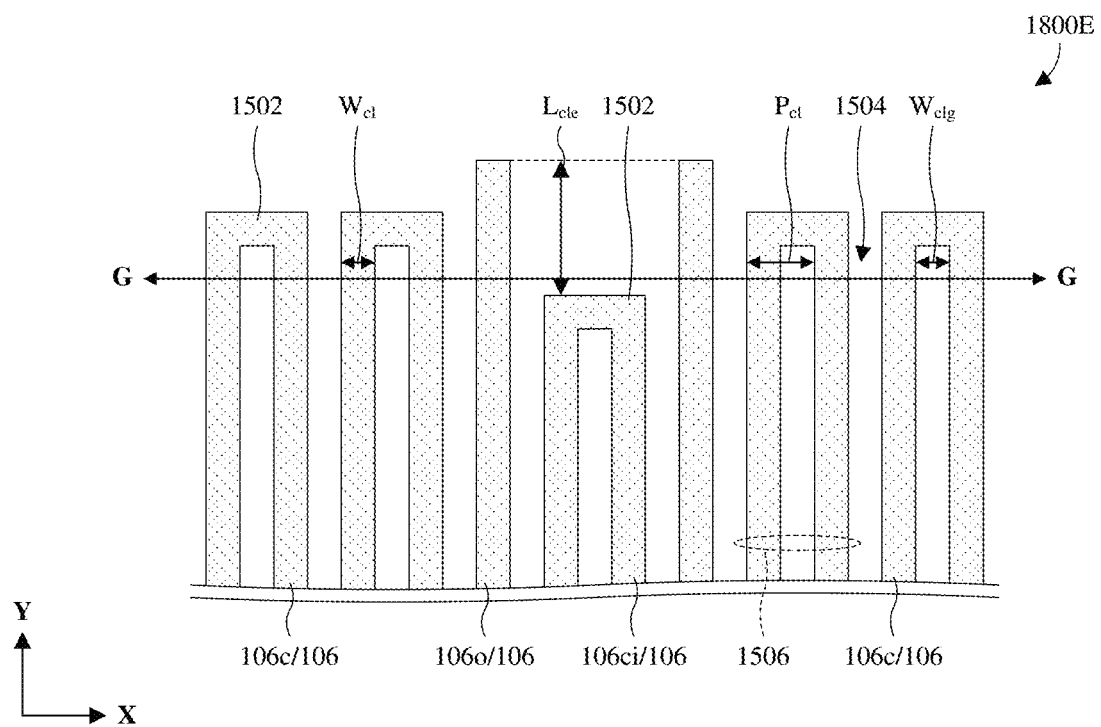
Figure 18F:
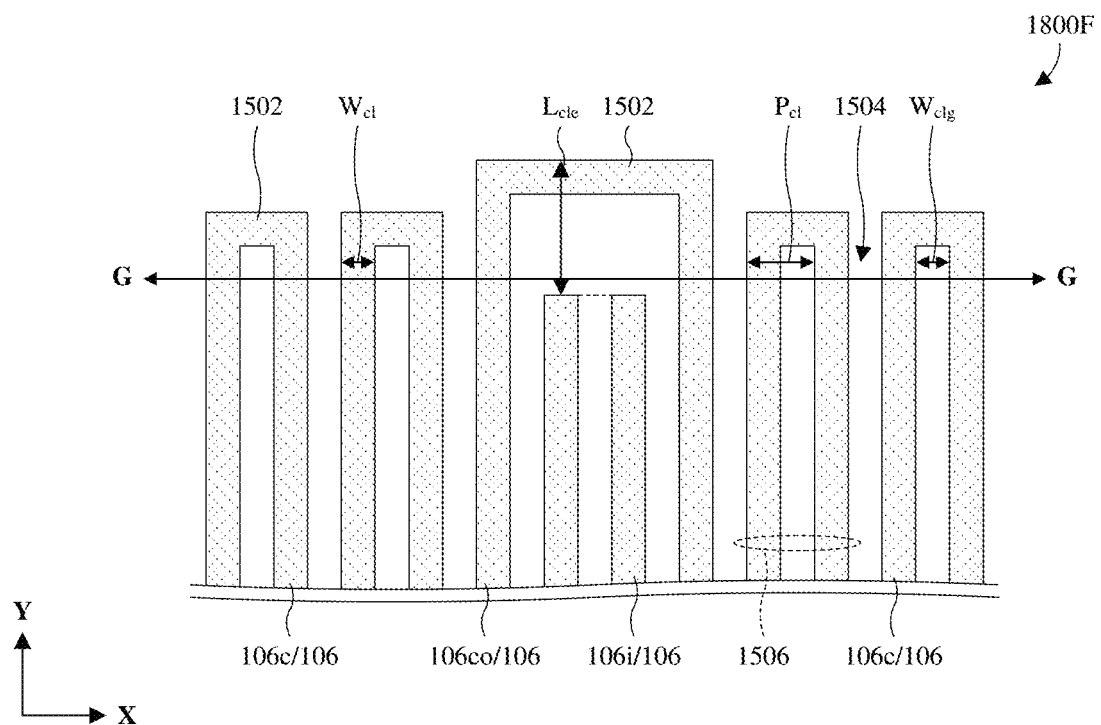

With reference to FIGS. 18A-18E, top layout views 1800A-1800E of some alternative embodiments of the IC chip of FIG. 15 are provided. In FIG. 18A, the cut outer conductive lines 106o have ends that are even with ends of the connected conductive lines 106c. In FIG. 18B, the cut outer conductive lines 106o have ends that offset from and between the ends of the connected conductive lines 106c and the ends of the cut inner conductive lines 106i in a dimension along which the conductive lines 106 are elongated. In FIG. 18C, four cut inner conductive lines 106i are between the cut outer conductive lines 106o. In FIG. 18D, six cut inner conductive lines 106i are between the cut outer conductive lines 106o. In alternative embodiments, an even number of cut inner conductive lines 106i greater than six is between the cut outer conductive lines 106o. In FIG. 18E, the cut inner conductive lines 106i are replaced with connected inner conductive lines 106ci having ends connected to each other by a corresponding bridge 1502. In FIG. 18F, the cut outer conductive lines 106o are replaced with connected outer conductive lines 106co having ends connected to each other by a corresponding bridge 1502.

With reference to FIGS. 19A-19E, top layout views 1900A-1900E of some embodiments of mandrels 1602 and sidewall spacer structures 1604 from which the conductive lines 106 respectively of FIGS. 18A-18E may be formed is provided. For example, the top layout view 1900A of FIG. 19A corresponds to FIG. 18A, the top layout view 1900B of FIG. 19B corresponds to FIG. 18B, and so on. FIGS. 19A-19E are as FIG. 16 is described except as follows.

Figure 19A:
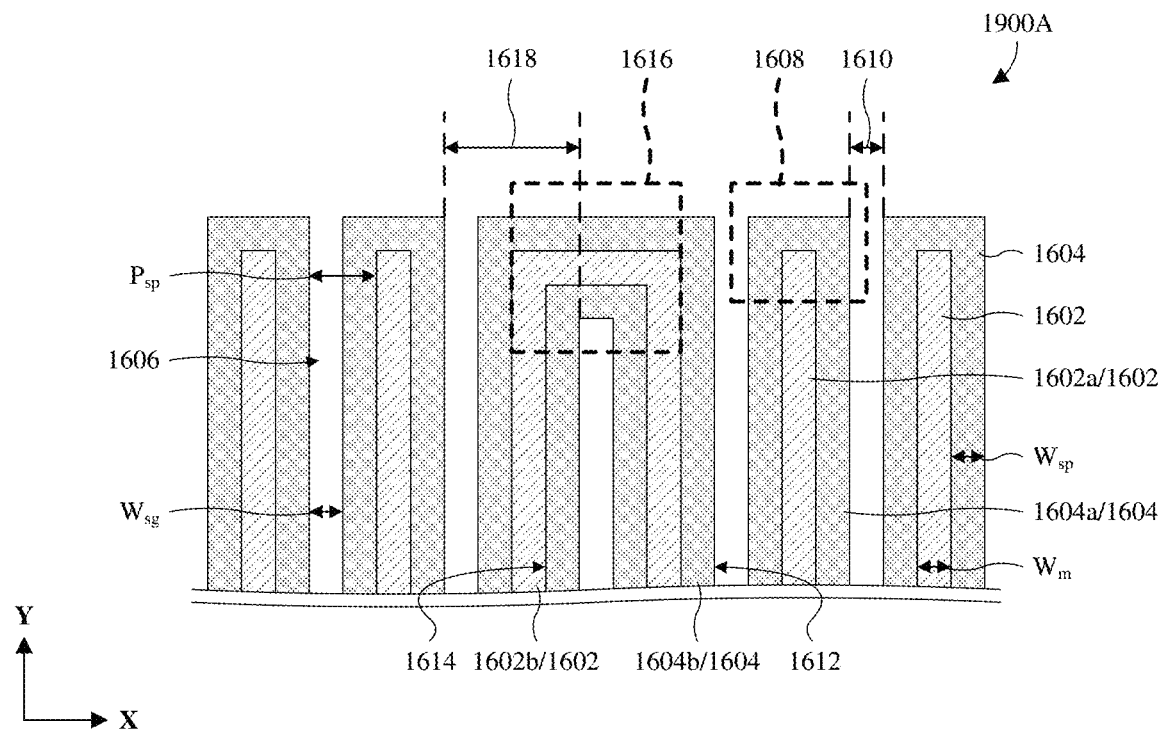
FIGS. 19A-19F illustrate top layout views of some embodiments of mandrels and sidewall spacer structures from which the cut inner and outer conductive lines of FIGS. 18A-18F may respectively be formed.
Figure 19B:
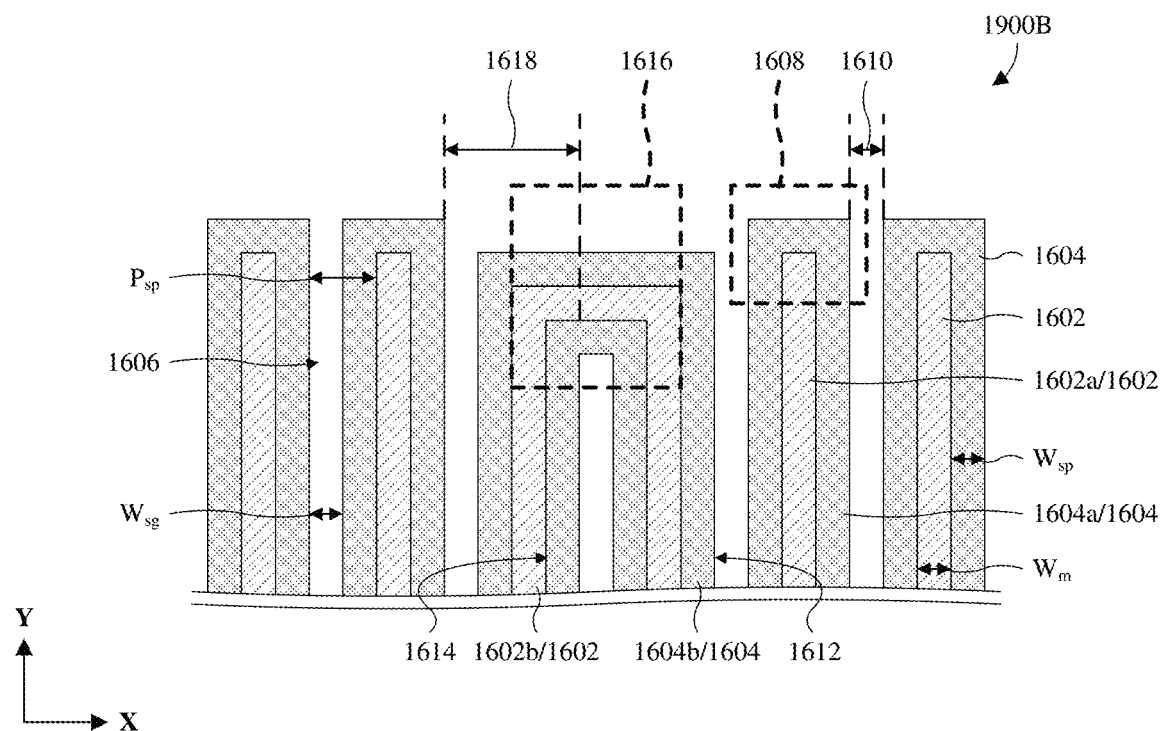
Figure 19C:
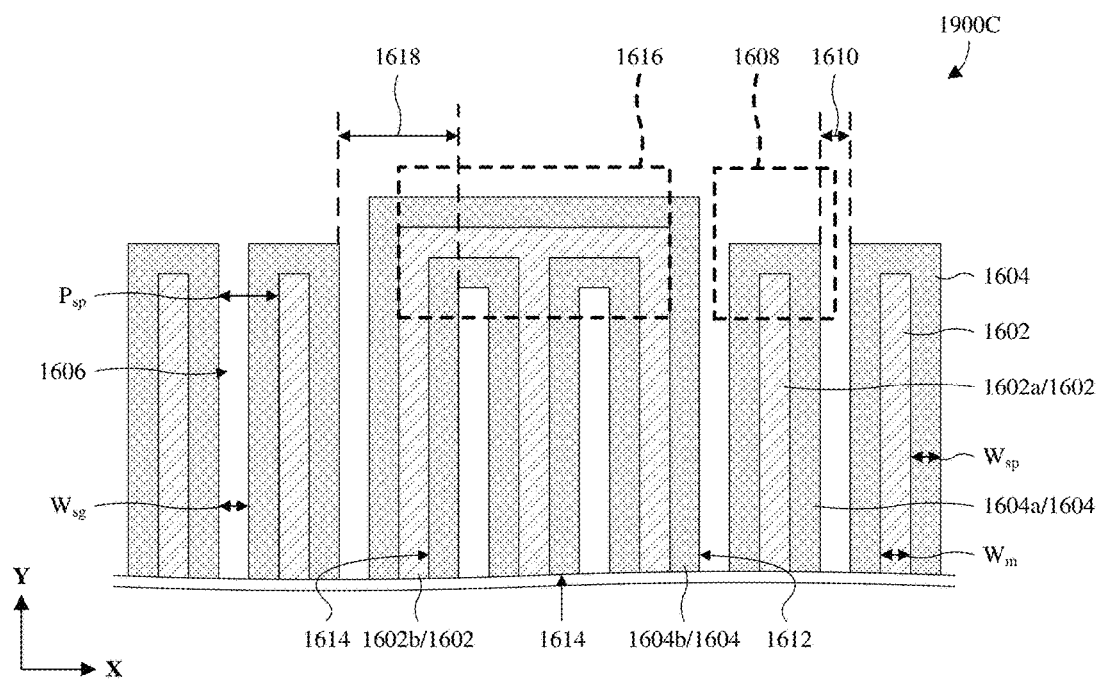
Figure 19D:
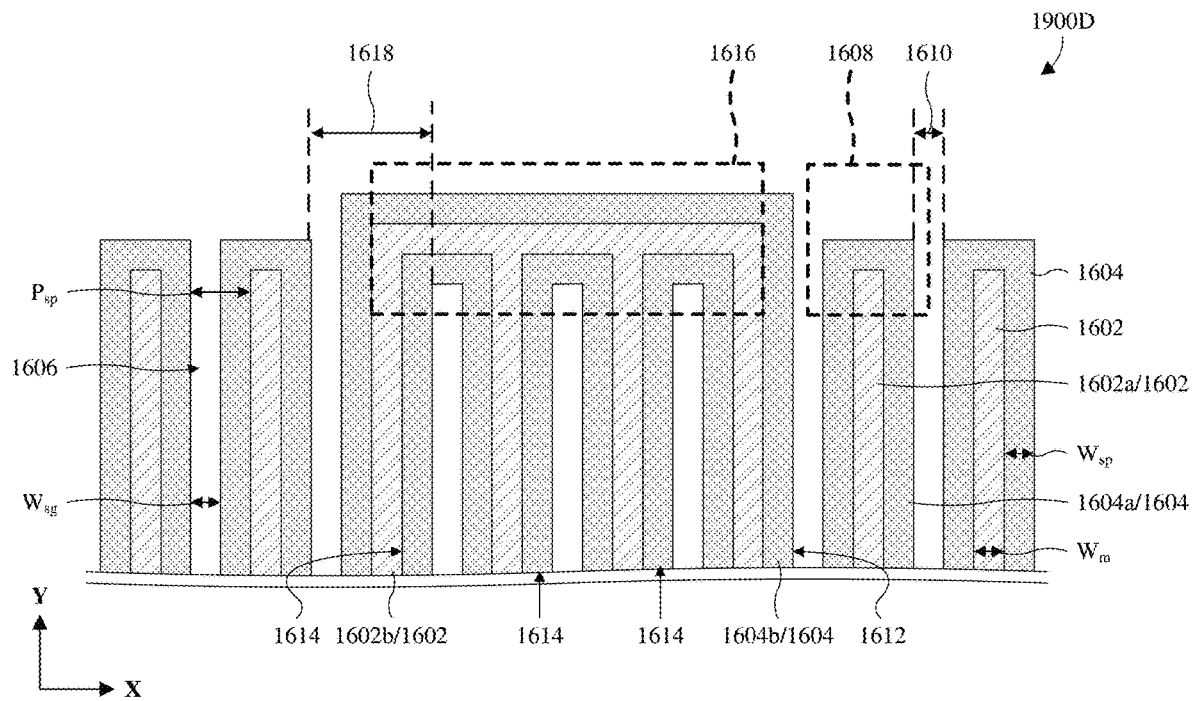

In FIG. 19A, the first and second mandrels 1602a, 1602b have ends that are even with. Further, the outer spacer segment 1612 of the second sidewall spacer structure 1604b has an end that is even with an end of the first sidewall spacer structure 1604a. In FIG. 19B, the second mandrel 1602b has an end offset from and between an end of the first mandrel 1602a and an end of the inner spacer segment 1614 in a dimension along with the mandrels 1602 and the sidewall spacers structures 1604 are elongated. Similarly, the outer spacer segment 1612 has an end offset from and between an end of the first sidewall spacer structure 1604a and the inner spacer segment 1614 in the dimension. In FIG. 19C, the second mandrel 1602b has two U-shaped turns overlapping with each other at an end of the second mandrel 1602b. Further, the second sidewall spacer structure 1604b has two inner spacer segments 1614 nested in the outer spacer segment 1612. In FIG. 19D, the second mandrel 1602b has three U-shaped turns overlapping with each other at an end of the second mandrel 1602b. Further, the second sidewall spacer structure 1604b has three inner spacer segments 1614 nested in the outer spacer segment 1612.

In alternative embodiments, the second mandrel 1602b may have four or more U-shaped turns that overlap at an end of the second mandrel 1602b. As should be appreciated, the number of U-shaped turns is half the number of cut inner conductive lines 106i to be formed with the second overlay window 1618. Further, the second sidewall structure 1604b has a number of inner spacer segments 1614 that is one less than the number of U-shaped turns, and the inner spacer segments 1614 are nested in the outer spacer segment 1612.

Figure 19E:
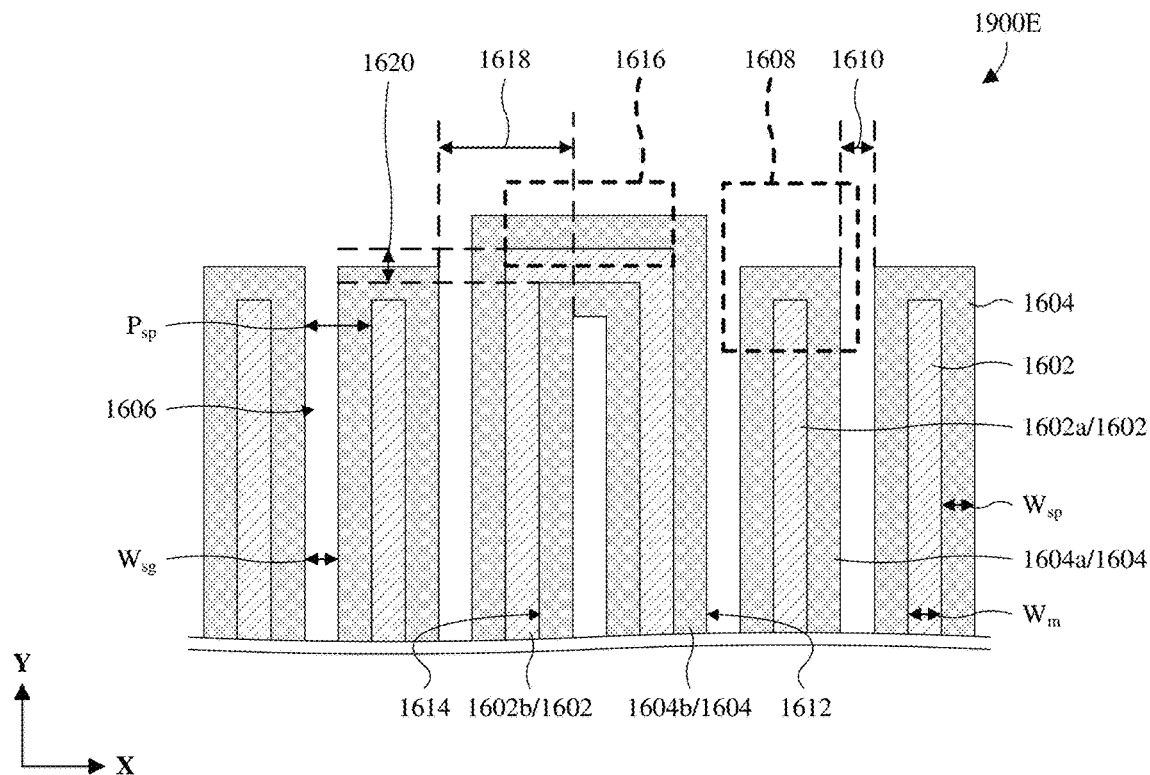
Figure 19F:
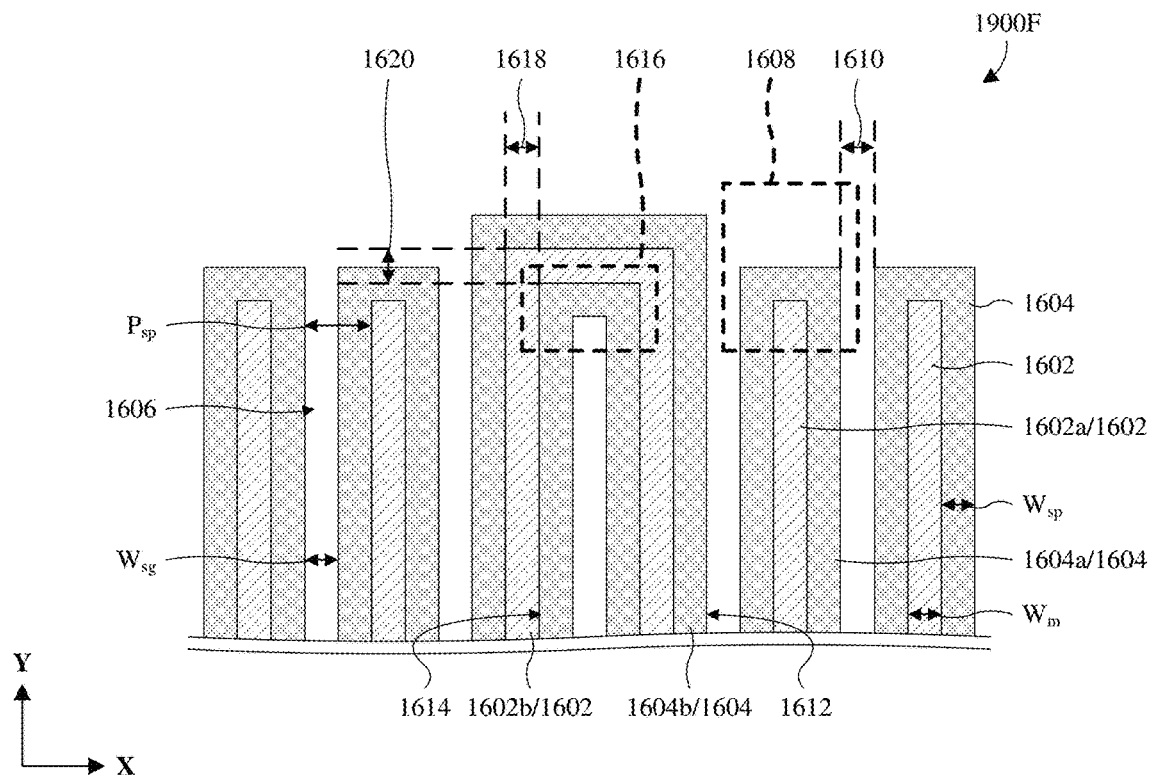

In FIG. 19E, a sidewall of the second opening 1616 that extends in a dimension (e.g., an X dimension) crosswise to length of the mandrels 1602 (e.g., in the Y dimension) is confined to a third overlay window 1620 overlying the second mandrel 1602b. For the sidewall to move outside the third overlay window 1620 may lead to unintentionally cutting of the inner spacer segment 1614 or incomplete cutting of the outer spacer segment 1612. In FIG. 19F, a sidewall of the second opening 1616 that extends in a dimension (e.g., a X dimension) crosswise to length of the mandrels 1602 is confined to the third overlay window 1620 overlying the second mandrel 1602b. Further, the second overlay window 1618 is reduced in size and overlies the second mandrel 1602b. For sidewalls of the second opening 1616 to move outside the second and third overlay windows 1618, 1620 may lead to unintentionally cutting of the outer spacer segment 1612 or incomplete cutting of the inner spacer segment 1614.

Figure 20:
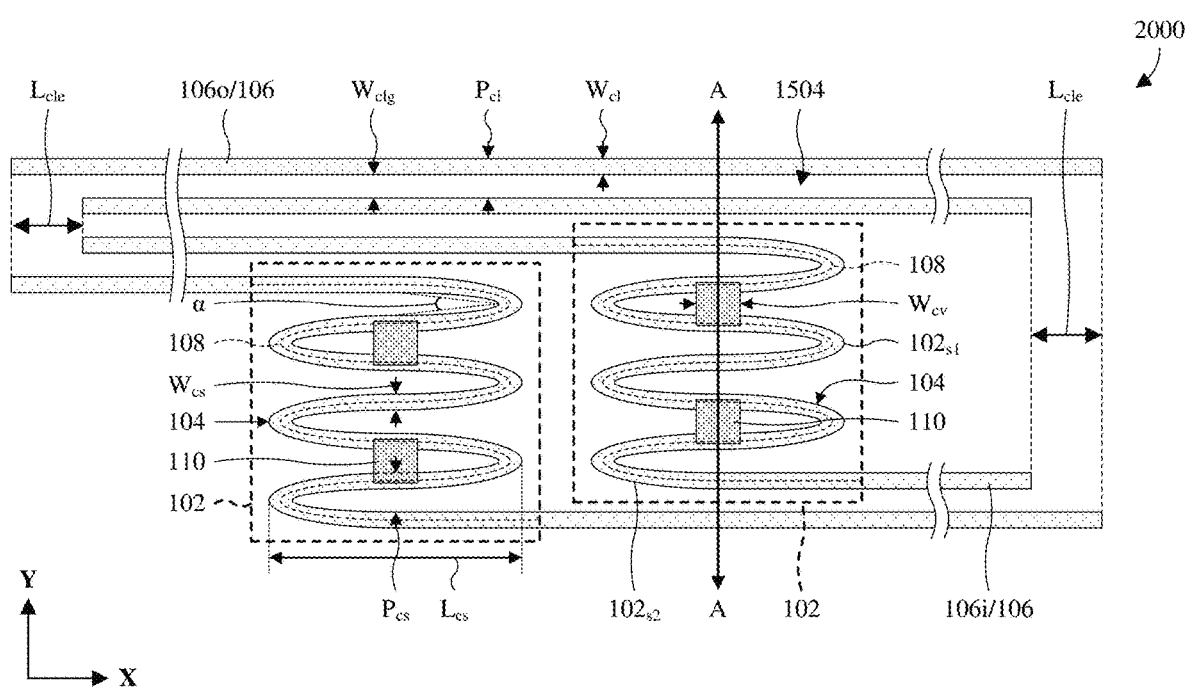
FIG. 20 illustrates a top layout view of some embodiments of the IC chip of FIG. 3 in which cut inner conductive lines have ends laterally offset from ends of cut outer conductive lines in a dimension along which the cut outer conductive lines are elongated.

With reference to FIG. 20, a top layout view 2000 of some embodiments of the IC chip of FIG. 3 is provided in which the conductive lines 106 comprise two cut inner conductive lines 106i and two cut outer conductive lines 106o. The cut inner and outer conductive lines 106i, 106o are as described with regard to FIG. 15 and may be disconnected with a large overlay window as described with regard to FIGS. 15 and 16 using a mandrel having a U-shaped turn.

With reference to FIGS. 21A and 21B to FIGS. 28A and 28B, a series of views of some embodiments of a method for forming an IC chip comprising a plurality of conductive sockets coupled with conductive lines and having a plurality of turns is provided. Figures labeled with a suffix of A correspond to top views, and figures labeled with a suffix of B correspond to cross-sectional views along line H in like numbered figures with a suffix of A. The method may, for example, be employed to form the IC chip of FIG. 3 and/or FIG. 4, or some other suitable IC chip.

Figure 21A:
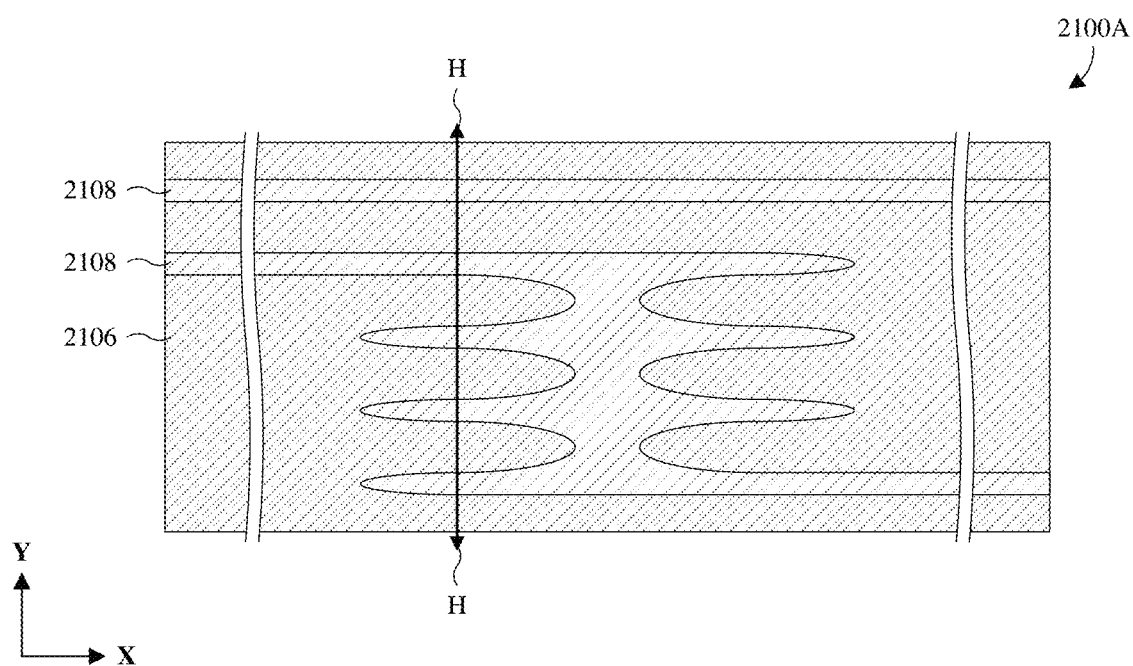
Figure 21B:
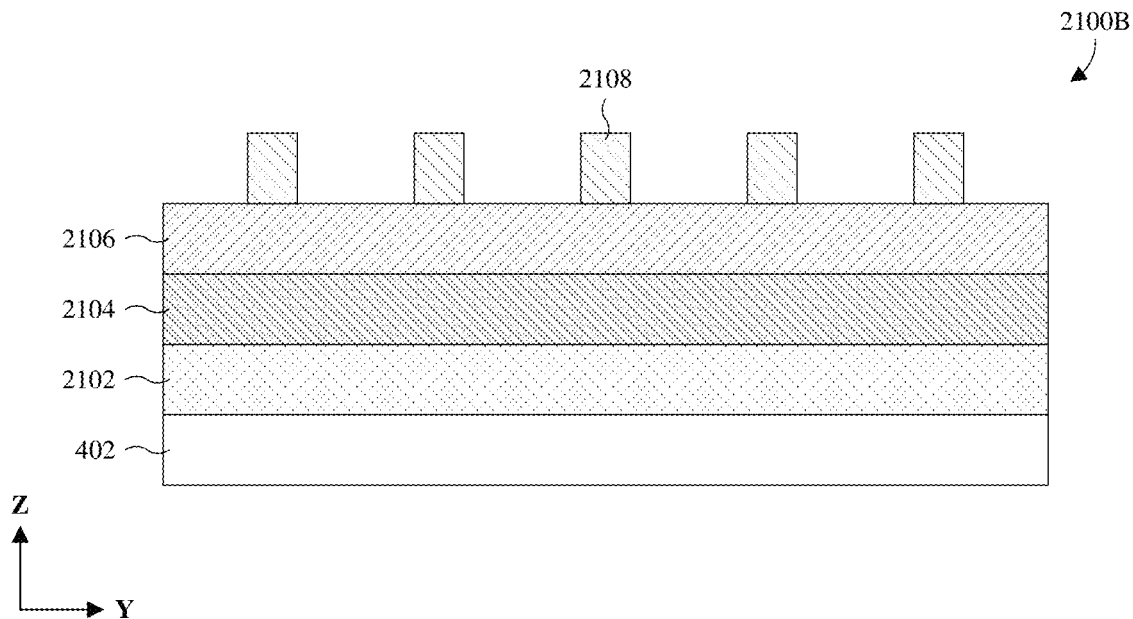

As illustrated by the views 2100A, 2100B of FIGS. 21A and 21B, a conductive layer 2102, a hard mask layer 2104, and a mandrel layer 2106 are sequentially deposited stacked overlying a dielectric layer 402. The hard mask layer 2104 is deposited overlying the conductive layer 2102, and the mandrel layer 2106 is deposited overlying the hard mask layer 2104. In alternative embodiments, the hard mask layer 2104 is omitted. In some embodiments, the hard mask layer 2104 and/or the mandrel layer 2106 is/are dielectric. Further, in some embodiments, the hard mask layer 2104 and the mandrel layer 2106 are different material types.

Also illustrated by the views 2100A, 2100B of FIGS. 21A and 21B, a photoresist mask 2108 is formed overlying the mandrel layer 2106. The photoresist mask 2108 has a mandrel layout, which is to be transferred to the mandrel layer 2106 to form mandrels and which is described hereafter. The photoresist mask may, for example, be formed by a photolithography process or some other suitable process.

Figure 22A:
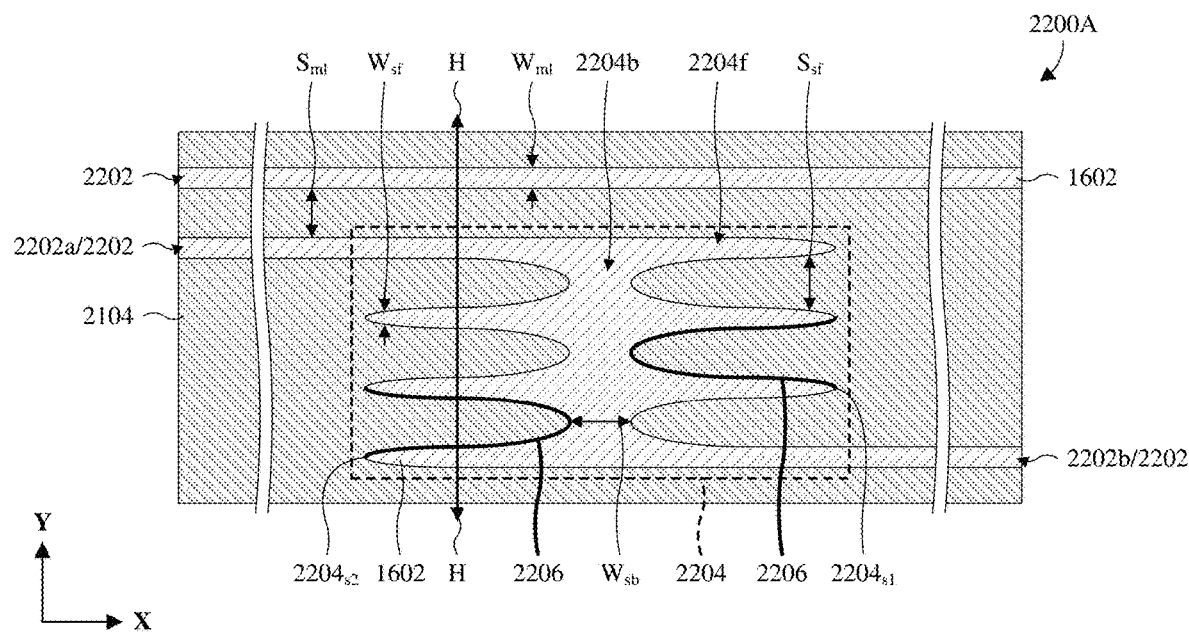
Figure 22B:
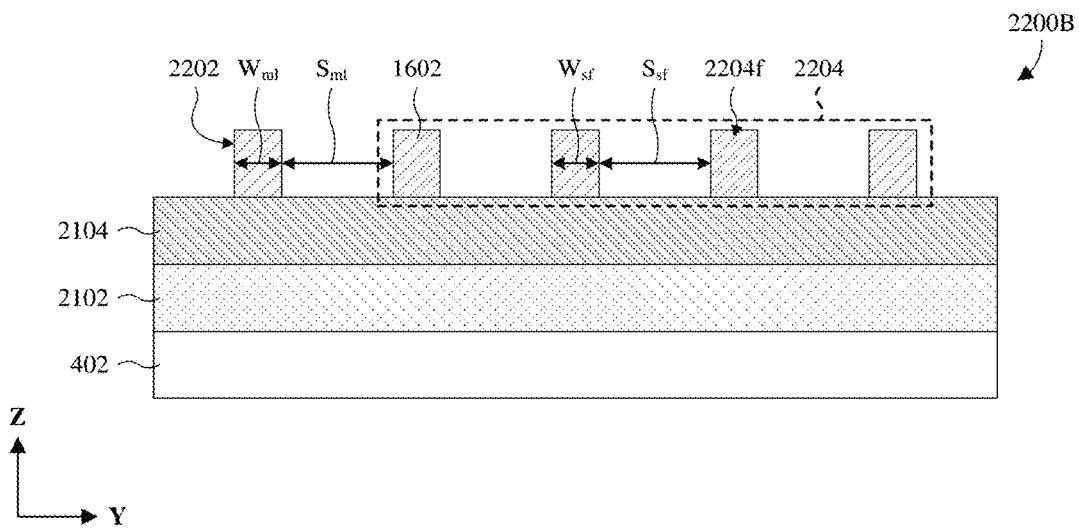

As illustrated by the views 2200A, 2200B of FIGS. 22A and 22B, a first mandrel etch is performed into the mandrel layer 2106 (see, e.g., FIGS. 21A and 21B) with the photoresist mask 2108 (see, e.g., FIGS. 21A and 21B) in place. The first mandrel etch transfers a layout of the photoresist mask 2108 to the mandrel layer 2106 to form a plurality of mandrels 1602. Further, the first mandrel etch stops on the hard mask layer 2104. The plurality of mandrels 1602 have a plurality of mandrel lines 2202 elongated in parallel in a first dimension (e.g., an X dimension) and spaced in a second dimension (e.g., a Y dimension) transverse to the first dimension. Further, the plurality of mandrels 1602 have a mandrel socket 2204.

The mandrel socket 2204 has a first sidewall $2204_{s1}$ and a second sidewall $2204_{s2}$. The first and second sidewalls $2204_{s1}$, $2204_{s2}$ are respectively on opposite sides of the mandrel socket 2204 and extend from, or from even with, a first mandrel line 2202a of the plurality of mandrel lines 2202 to, or to even with, a second mandrel line 2202b of the plurality of mandrel lines 2202. Further, the first and second sidewalls $2204_{s1}$, $2204_{s2}$ each have a plurality of turns 2206. The turns 2206 have a U-shaped or V-shaped layout but may alternatively have some other suitable layout. Put another way, the mandrel socket 2204 has a socket body 2204b extending in the second dimension from, or from even with, the first mandrel line 2202a to, or to even with, the second mandrel line 2202b. Further, the mandrel socket 2204 has a plurality of socket fingers 2204f. The socket fingers 2204f are on opposite sides of the socket body 2204b and extend from the socket body 2204b in the first dimension.

In some embodiments, the mandrel lines 2202 and/or the socket fingers 2204f are evenly spaced in the second dimension (e.g., the Y dimension). In some embodiments, the mandrel lines 2202 are evenly spaced in the second dimension with a spacing $S_{ml}$, and the socket fingers 2204f are evenly spaced in the second dimension with a spacing $S_{sf}$ that is the same or substantially the same as the spacing $S_{ml}$ of the mandrel lines 2202. In some embodiments, a width $W_{sf}$ of the socket fingers 2204f is the same as or substantially the same as a width $W_{ml}$ of the mandrel lines 2202, and/or a width $W_{sb}$ of the socket body 2204b is the same as or greater than the width $W_{ml}$ of the mandrel lines 2202.

Also illustrated by the views 2200A, 2200B of FIGS. 22A and 22B, the photoresist mask 2108 (see, e.g., FIGS. 21A and 21B) is removed. The removal may, for example, be performed by the first mandrel etch or after the first mandrel etch by plasma ashing or the like.

Figure 23A:
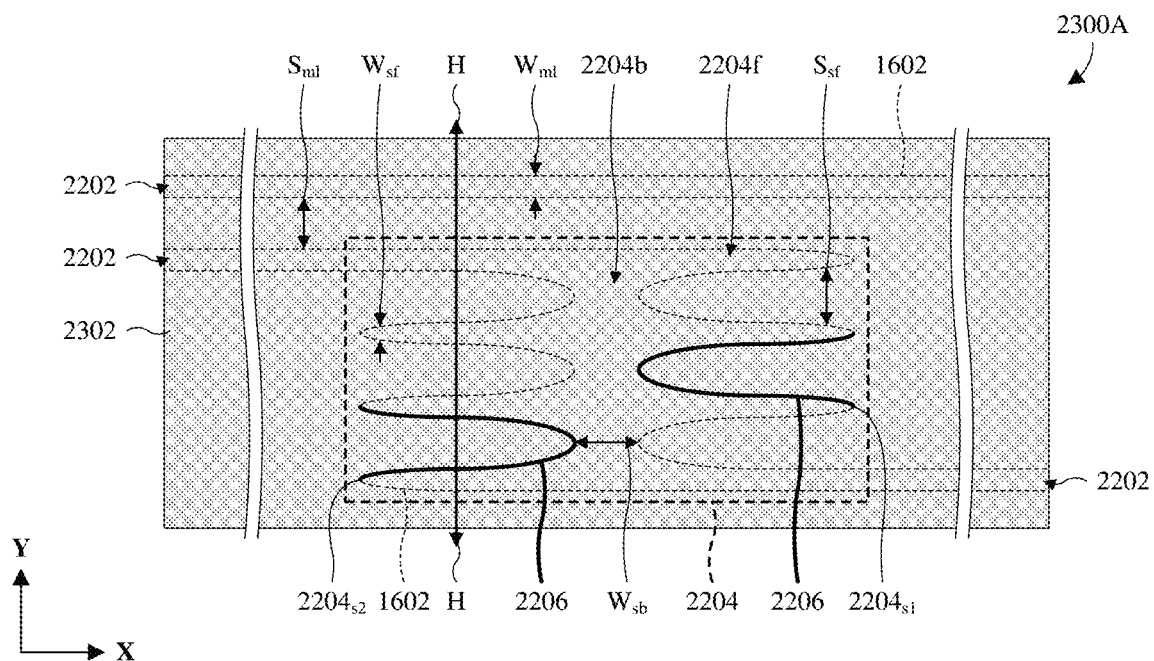
Figure 23B:
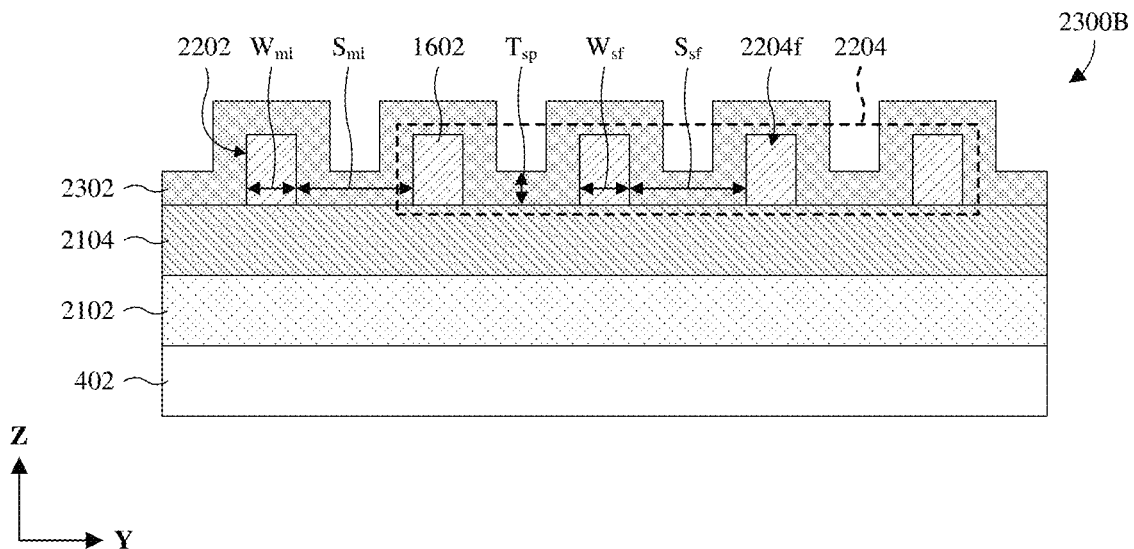

As illustrated by the views 2300A, 2300B of FIGS. 23A and 23B, a spacer layer 2302 is deposited overlying the mandrels 1602 and the hard mask layer 2104, and further lining sidewalls of the mandrels 1602. The spacer layer 2302 may, for example, be or comprise silicon nitride and/or some other suitable dielectric(s). In some embodiments, the spacer layer 2302 is deposited with a thickness $T_{sp}$ that is uniform or substantially uniform, and/or that is the same as or substantially the same as the width $W_{ml}$ of the mandrel lines 2202 and/or the width $W_{sf}$ of the socket fingers 2204f. By substantially the same, it is meant that the thickness $T_{sp}$ is within about 5%, 10%, 20%, or some other suitable percentage of the width $W_{ml}$ of the mandrel lines 2202 and/or the width $W_{sf}$ of the socket fingers 2204f.

Figure 24A:
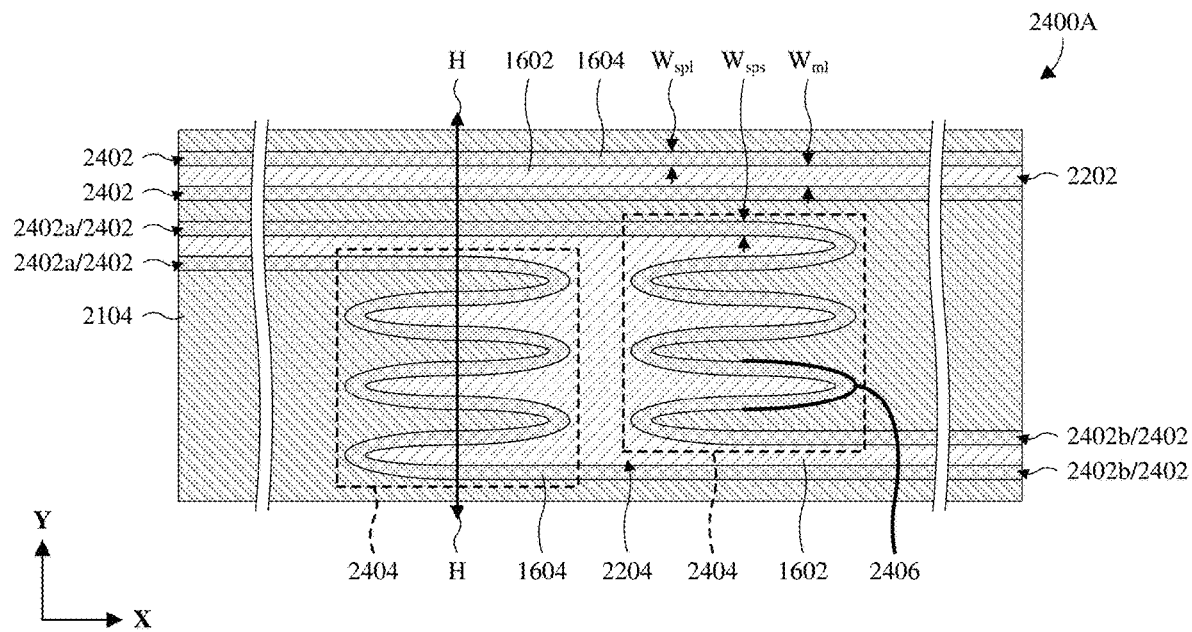
Figure 24B:
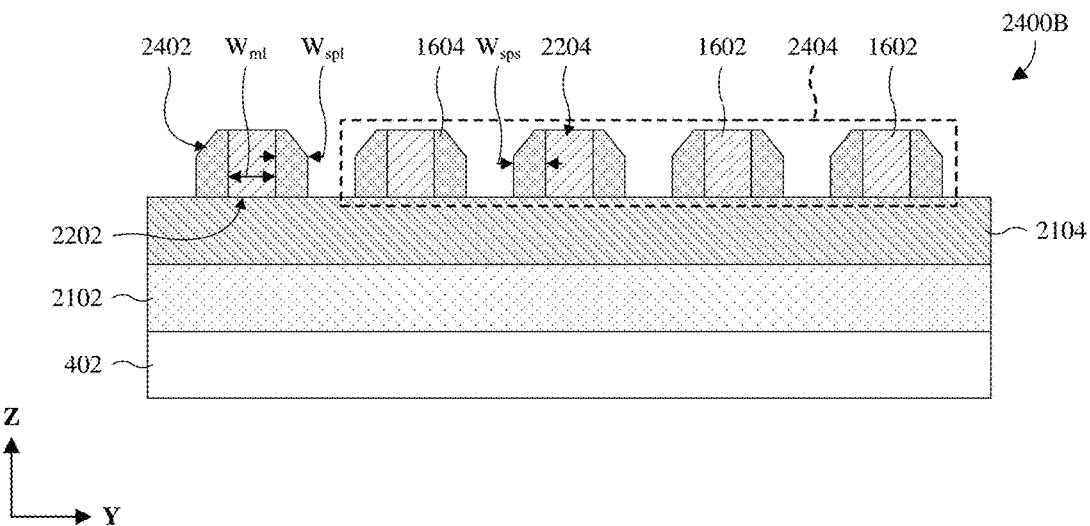

As illustrated by the views 2400A, 2400B of FIGS. 24A and 24B, a first spacer etch is performed into the spacer layer 2302 (see, e.g., FIGS. 23A and 23B). The first spacer etch etches back the spacer layer 2302 to remove the spacer layer 2302 from atop the mandrels 1602 and to remove horizontal segments of the spacer layer 2302. Further, the first spacer etch forms sidewall spacer structures 1604 from vertical segments of the spacer layer 2302. The sidewall spacer structures 1604 are on and conform to sidewalls of the mandrels 1602. Further, the sidewall spacer structures 1604 have a target layout which is complementary to the mandrel layout of the mandrels 1602 and which is to be transferred to the hard mask layer 2104 and the conductive layer 2102 to form conductive lines and conductive sockets. The sidewall spacer structures 1604 have a plurality of spacer lines 2402 and a plurality of spacer sockets 2404.

The spacer lines 2402 are elongated in a parallel in a first dimension (e.g., an X dimension). The spacer sockets 2404 extend in a second dimension (e.g., a Y dimension) transverse to the first dimension respectively from first spacer lines 2402a respectively to second spacer lines 2402b. Further, the spacer sockets 2404 are respectively on opposite sides of and conform to the mandrel socket 2204. By conforming to the mandrel socket 2204, the spacer sockets 2404 have multiple turns 2406 forming serpentine patterns respectively from the first spacer lines 2402a respectively to the second spacer lines 2402b. In alternative embodiments, the spacer sockets 2404 may have some other suitable layout and/or some other suitable number of turns. For example, the spacer sockets 2404 may have one or more turns.

A width $W_{sps}$ of the spacer sockets 2404 is the same as or about the same as a width $W_{spl}$ of the spacer lines 2402. By substantially the same, it is meant that the width $W_{sps}$ of the spacer sockets 2404 is within about 5%, 10%, 20%, or some other suitable percentage of the width $W_{spl}$ of the spacer lines 2402. In some embodiments, the width $W_{spl}$ of the spacer lines 2402 and/or the width $W_{sps}$ of the spacer sockets 2404 is/are the same as or substantially the same as the width $W_{ml}$ of the mandrel lines 2202.

Figure 25A:
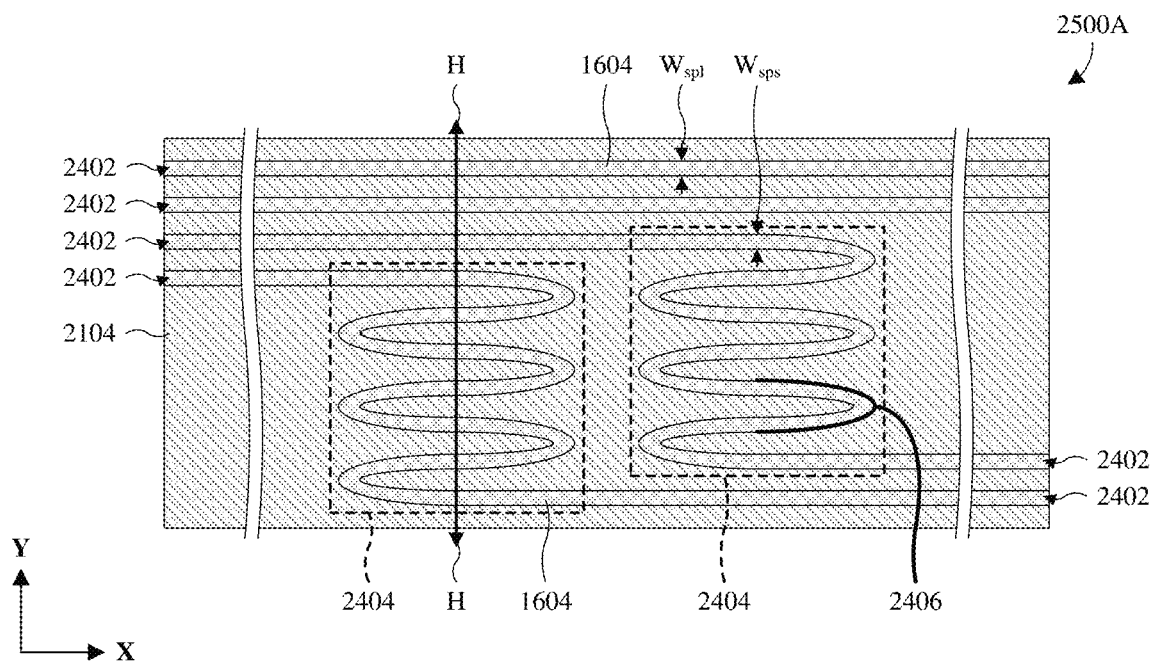
Figure 25B:
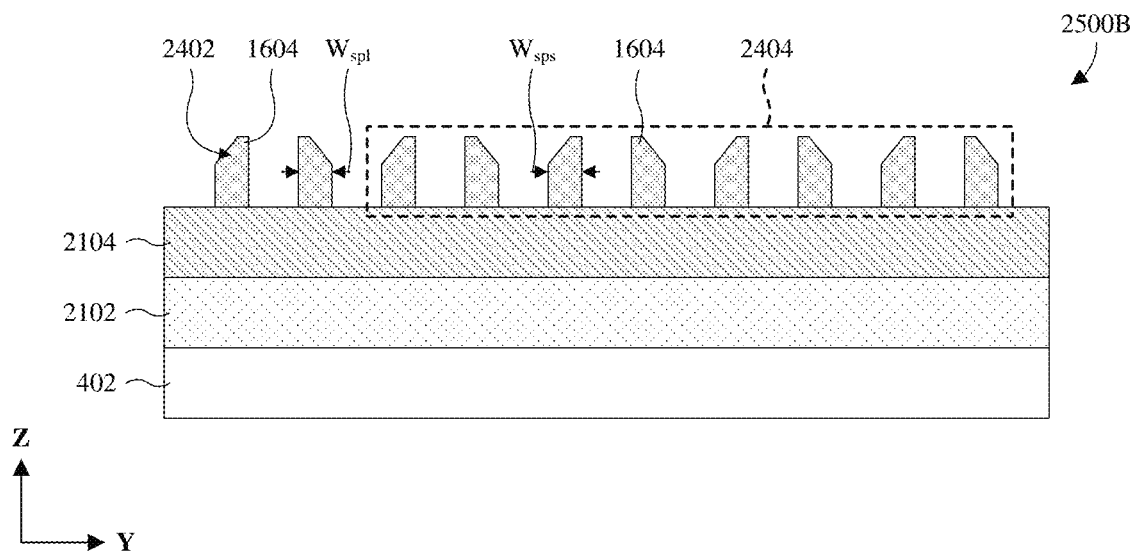

As illustrated by the views 2500A, 2500B of FIGS. 25A and 25B, a second mandrel etch is performed into the mandrels 1602 (see, e.g., FIGS. 24A and 24B) to remove the mandrels 1602. The second mandrel etch employs an etchant having a high selectivity for the mandrels 1602 relative to the sidewall spacer structures 1604 and the hard mask layer

2104. As such, the sidewall spacer structures 1604 and the hard mask layer 2104 are minimally etched.

Figure 26A:
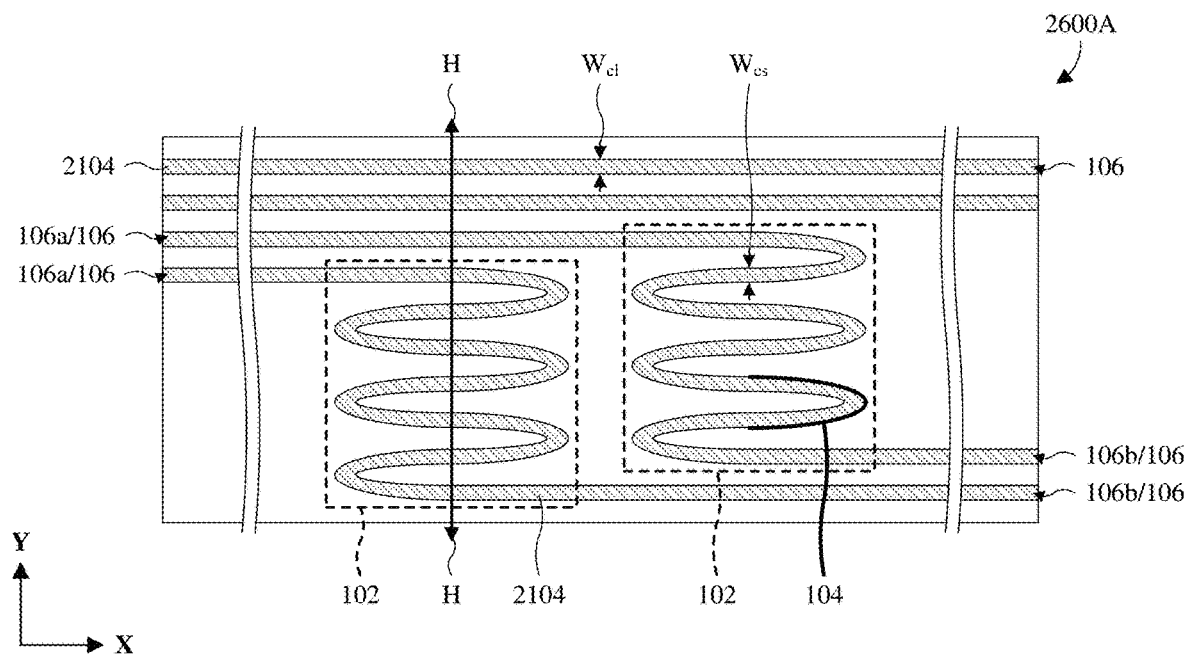
Figure 26B:
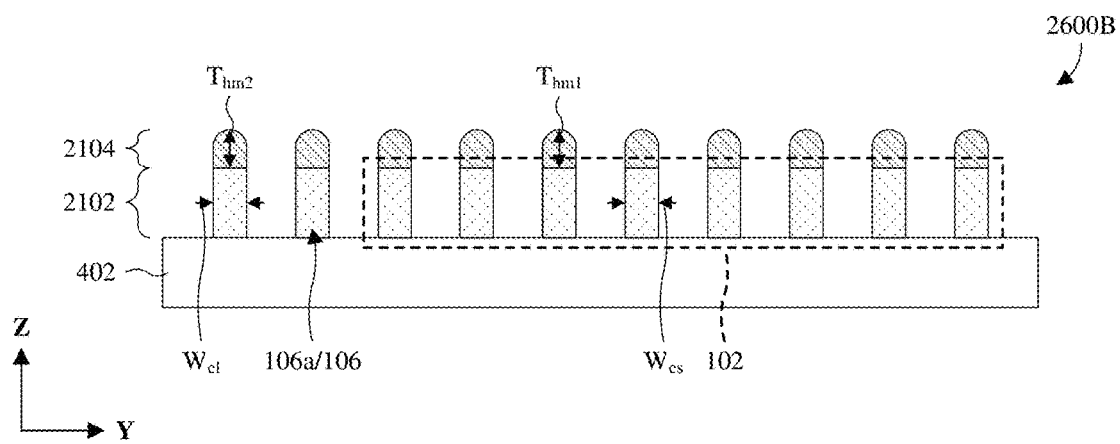

As illustrated by the views 2600A, 2600B of FIGS. 26A and 26B, a target etch is performed into the hard mask layer 2104 and the conductive layer 2102 with the sidewall spacer structures 1604 (see, e.g., FIGS. 25A and 25B) in place. The target etch employs the sidewall spacer structures 1604 as masks to transfer a target layout from the sidewall spacer structures 1604 to the hard mask layer 2104 and the sidewall spacer structures 1604. Further, the target etch removes the sidewall spacer structures 1604 and erodes the hard mask layer 2104.

By transferring the target layout to the hard mask layer 2104 and the conductive layer 2102, a plurality of conductive sockets 102 and a plurality of conductive lines 106 masked by the hard mask layer 2104 are formed. The conductive lines 106 share a top layout with the spacer lines 2402 of FIGS. 25A and 25B, and the conductive sockets 102 share a top layout with the spacer sockets 2404 of FIGS. 25A and 25B. Hence, the conductive sockets 102 have a serpentine layout extending respectively from first conductive lines 106a respectively to second conductive lines 106b with multiple turns 104 and with a width $W_{cs}$ that is the same as or substantially the same as a width $W_{cl}$ of the conductive lines 106.

Because a layout of the conductive sockets 102 extends along a path with at least one turn and has a width $W_{cs}$ that is the same or substantially the same as a width $W_{cl}$ of the conductive lines 106, loading during the target etch is the same or substantially the same at the conductive sockets 102 as at the conductive lines 106. As such, an etch rate during the target etch may be the same or substantially the same at the conductive sockets 102 as at the conductive lines 106. Because the etch rate may be the same or substantially the same at the conductive sockets 102 and the conductive lines 106, a first thickness $T_{hm1}$ of the hard mask layer 2104 at the conductive sockets 102 may be the same as or substantially the same as a second thickness $T_{hm2}$ of the hard mask layer 2104 at the conductive lines 106 upon completion of the target etch. In contrast, forming the conductive sockets 102 with large, rectangular layouts may result in high loading at the conductive sockets 102 compared to the conductive lines 106, thereby resulting in the first and second thicknesses $T_{hm1}$, $T_{hm2}$ being substantially different.

Because the sidewall spacer structures 1604 are used as a mask for forming both the conductive sockets 102 and the conductive lines 106, the conductive sockets 102 and the conductive lines 106 may be formed using a common photomask or reticle rather than separate photomasks or reticles. For example, the common photomask or reticle may correspond to that used to form the mandrels 1602 (see, e.g., FIGS. 21A and 21B to FIGS. 22A and 22B) from which the sidewall spacer structures 1604 are formed. By using the common photomask or reticle for forming both the conductive sockets 102 and the conductive lines 106, cost may be reduced compared to processes that use the sidewall spacer structures 1604 as a mask for the conductive lines 106 and a photoresist mask as a mask for the conductive sockets 102.

In alternative embodiments, instead of using the sidewall spacer structures 1604 as a mask for the target etch, extreme ultraviolet lithography (EUV) may be used to directly form a photoresist mask atop the hard mask layer 2104. This photoresist mask has the top layout of the conductive lines 106 and the conductive sockets 102 and is used as a mask for the target etch. In these alternative embodiments, the photoresist mask 2108 and the mandrel layer 2106 of FIGS. 21A and 21B are not formed. Further, the acts described with regard to FIGS. 22A and 22B to FIGS. 25A and 25B are not performed.

Figure 27A:
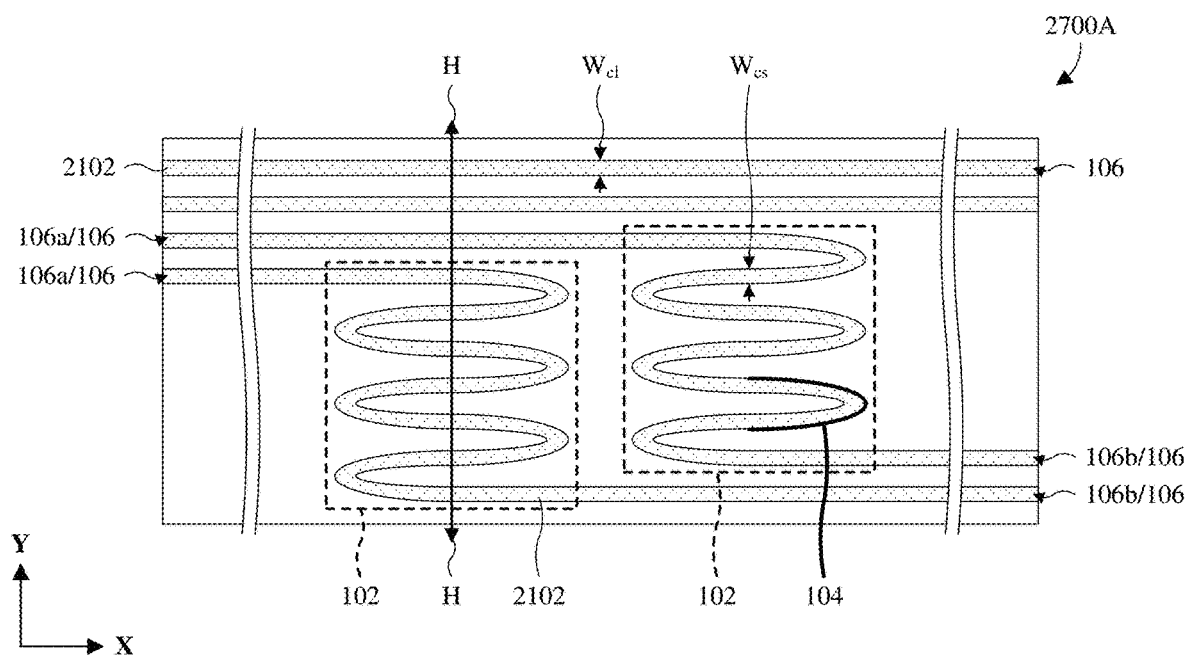
Figure 27B:
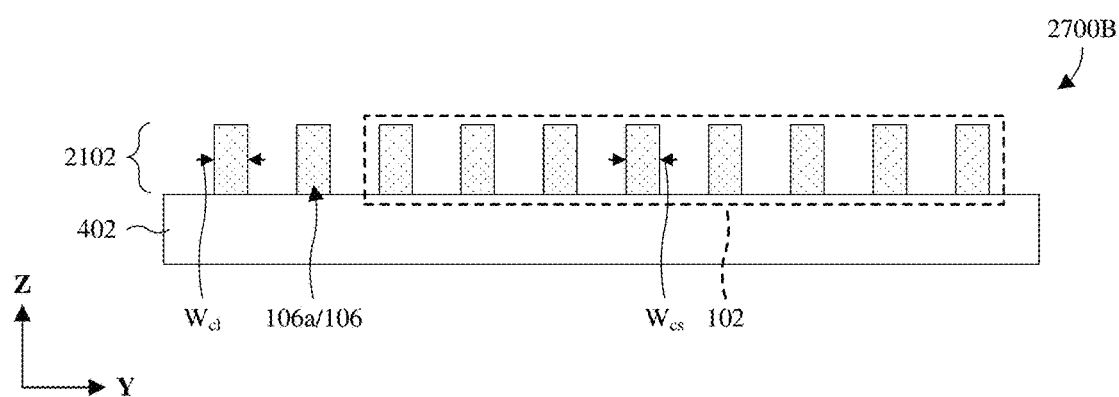

As illustrated by the views 2700A, 2700B of FIGS. 27A and 27B, the hard mask layer 2104 is removed from atop the conductive layer 2102. In some embodiments, the removal is performed by a hard-mask etch. In other embodiments, the removal is performed by a CMP. In other embodiments, the removal is performed by some other removal process.

Because a layout of the conductive sockets 102 extends along a path with at least one turn and has a width $W_{cs}$ that is the same or substantially the same as a width $W_{cl}$ of the conductive lines 106, loading during the removal is the same or substantially the same at the conductive sockets 102 as at the conductive lines 106. As such, a removal rate during the removal may be the same or substantially the same at the conductive sockets 102 as at the conductive lines 106. Because of the same or substantially the same removal rates at the conductive sockets 102 and the conductive lines 106, and because the thicknesses $T_{hm1}$, $T_{hm2}$ of the hard mask layer 2104 (see, e.g., FIGS. 26A and 26B) respectively at the conductive sockets 102 and the conductive lines 106 are the same as or substantially the same, the likelihood of over removal (e.g., over etching) or under removal (e.g., under etching) is low. Over removal may thin the conductive lines 106 and negatively increase resistance. Under removal may leave the hard mask layer 2104 on the conductive sockets 102, which may prevent contacts/vias from landing on the conductive sockets 102 and which may lead to open circuit.

Figure 28A:
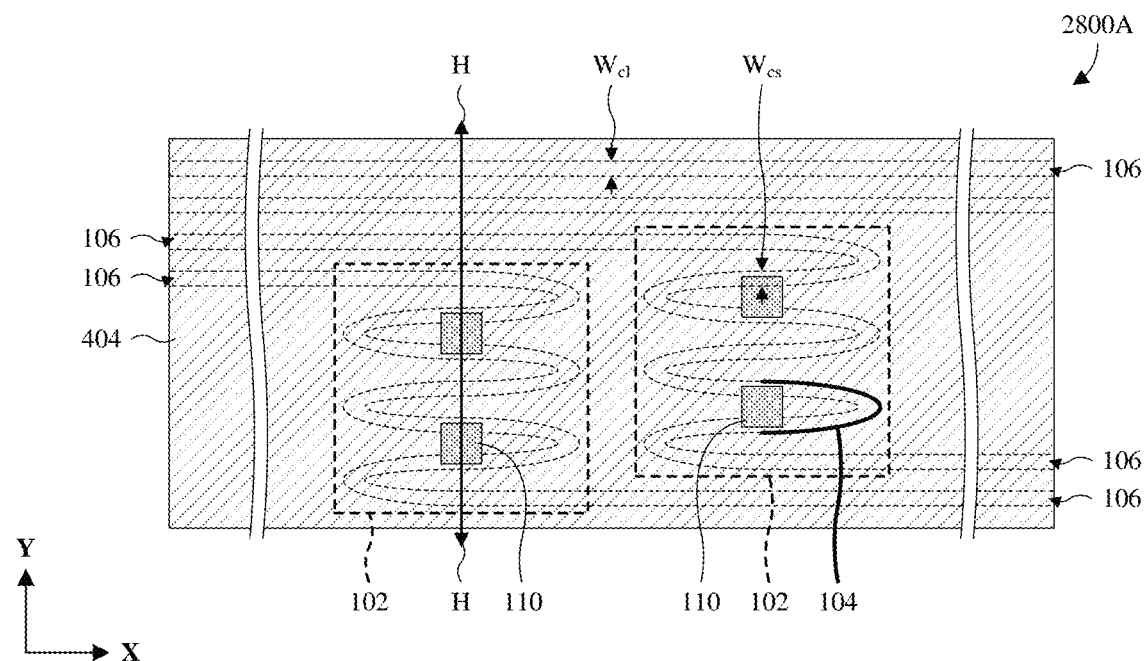
Figure 28B:
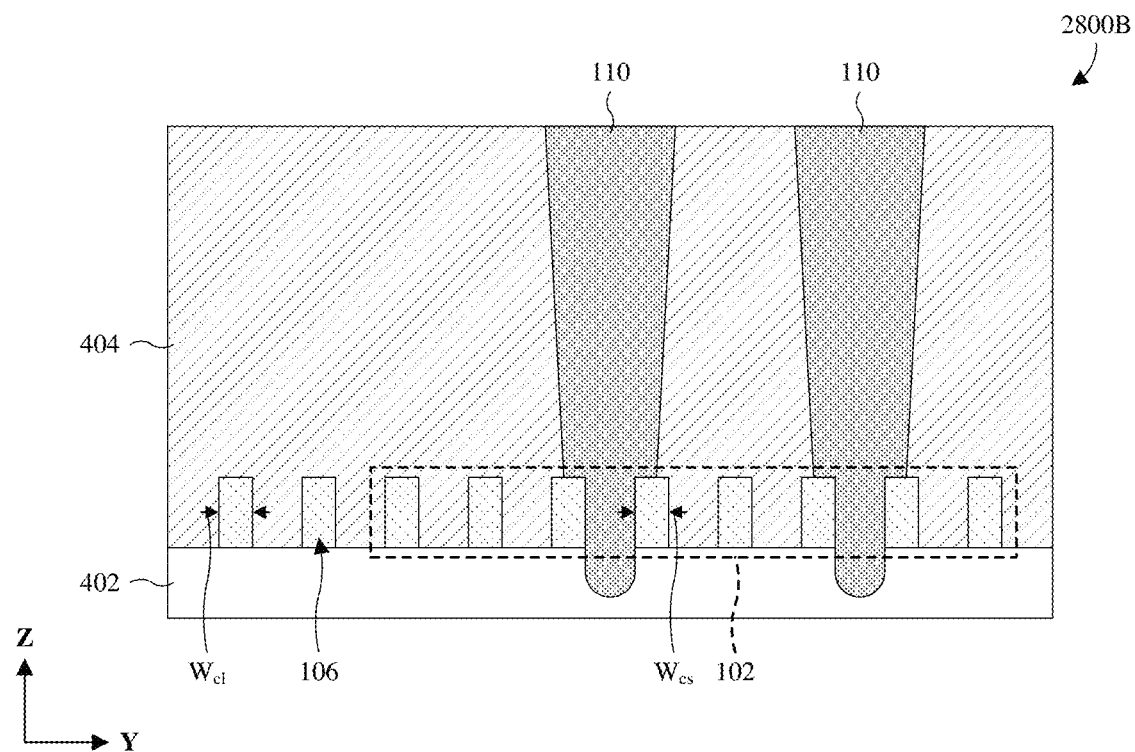

As illustrated by the views 2800A, 2800B of FIGS. 28A and 28B, an interconnect dielectric layer 404 is deposited over the conductive lines 106 and the conductive sockets 102. Further, contacts/vias 110 are formed extending through the interconnect dielectric layer 404 to the conductive sockets 102. The contacts/vias 110 electrically couple to the conductive sockets 102 and extend through the conductive sockets 102, such that a bottom surface of the contacts/vias 110 is recessed relative to that of the conductive sockets 102. In other embodiments, the bottom surface of the contacts/vias 110 is level with that of the conductive sockets 102 as in FIG. 5A. In other embodiments, the bottom surface of the contacts/vias 110 is over a top surface of the conductive sockets 102 as in FIG. 5B.

A process for forming the contacts/vias 110 may, for example, comprise: patterning the interconnect dielectric layer 404 to form contact/via openings exposing the conductive sockets 102; depositing a conductive material filling the contact/via openings and covering the interconnect dielectric layer 404; and performing a planarization into the conductive material to remove the conductive material from atop the interconnect dielectric layer 404. Other suitable processes for forming the contacts/vias 110 are, however, amenable.

While FIGS. 21A and 21B to FIGS. 28A and 28B are described with reference to a method, it will be appreciated that the structures shown in FIGS. 21A and 21B to FIGS. 28A and 28B are not limited to the method but rather may stand alone separate of the method. While FIGS. 21A and 21B to FIGS. 28A and 28B are described as a series of acts, it will be appreciated that the order of the acts may be altered in other embodiments. While FIGS. 21A and 21B to FIGS. 28A and 28B illustrate and describe as a specific set of acts, some acts that are illustrated and/or described may be omitted in other embodiments. Further, acts that are not illustrated and/or described may be included in other embodiments.

Figure 29:
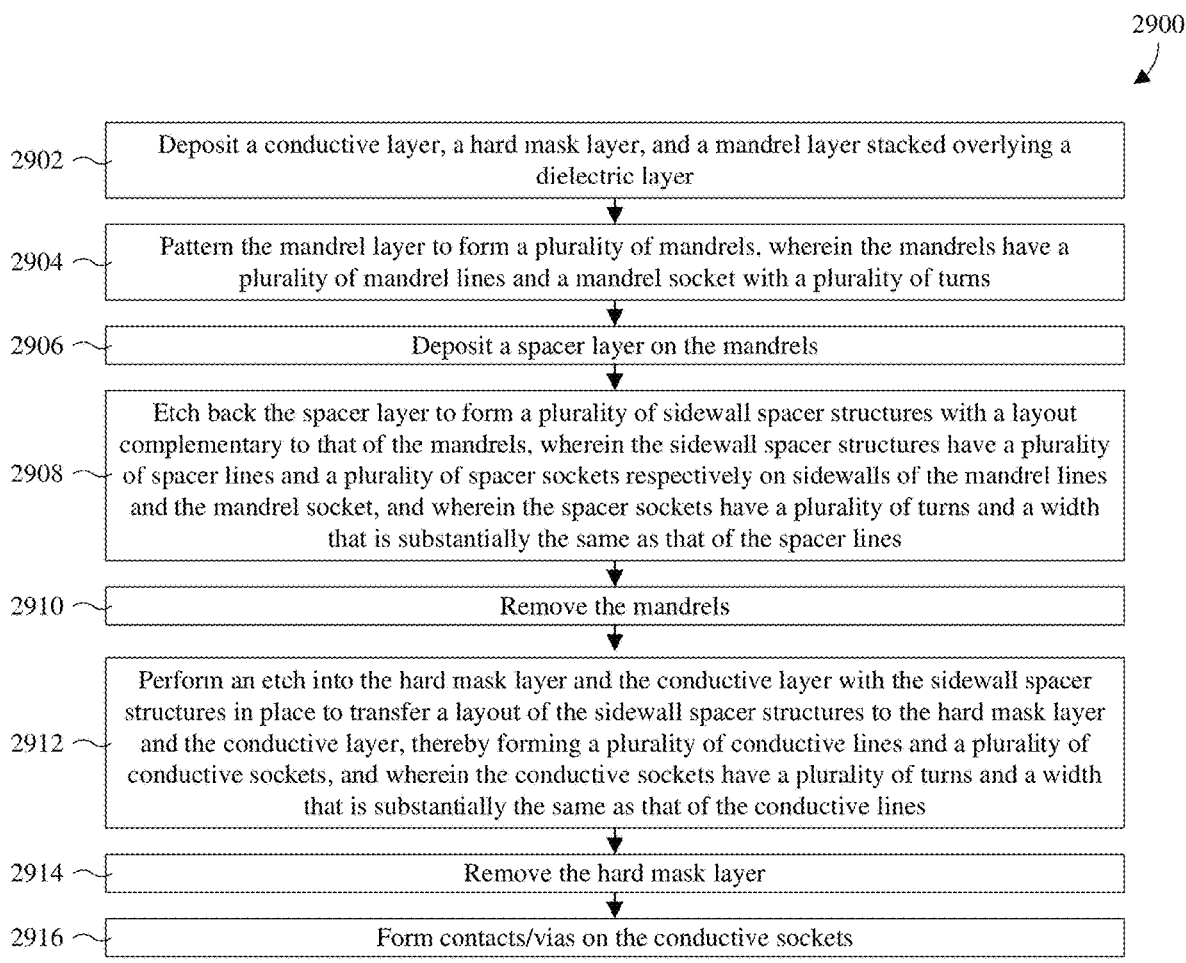
FIG. 29 illustrates a block diagram of some embodiments of the method of FIGS. 21A and 21B to FIGS. 28A and 28B.

With reference to FIG. 29, a block diagram 2900 of some embodiments of the method of FIGS. 21A and 21B to FIGS. 28A and 28B is provided.

At 2902, a conductive layer, a hard mask layer, and a mandrel layer are deposited stacked overlying a dielectric layer. See, for example, FIGS. 21A and 21B.

At 2904, the mandrel layer is patterned to form a plurality of mandrels, wherein the mandrels have a plurality of mandrel lines and a mandrel socket with a plurality of turns. See, for example, FIGS. 21A and 21B to FIGS. 22A and 22B.

At 2906, a spacer layer is deposited on the mandrels. See, for example, FIGS. 23A and 23B.

At 2908, the spacer layer is etched back to form a plurality of sidewall spacer structures with a layout complementary to that of the mandrels, wherein the sidewall spacer structures have a plurality of spacer lines and a plurality of spacer sockets respectively on sidewalls of the mandrel lines and the mandrel socket, and wherein the spacer sockets have a plurality of turns and a width that is substantially the same as that of the spacer lines. See, for example, FIGS. 24A and 24B.

At 2910, the mandrels are removed. See, for example, FIGS. 25A and 25B.

At 2912, an etch is performed into the hard mask layer and the conductive layer with the sidewall spacer structures in place to transfer a layout of the sidewall spacer structures to the hard mask layer and the conductive layer, thereby forming a plurality of conductive lines and a plurality of conductive sockets, and wherein the conductive sockets have a plurality of turns and a width that is substantially the same as that of the conductive lines. See, for example, FIGS. 26A and 26B.

At 2914, the hard mask layer is removed. See, for example, FIGS. 27A and 27B.

At 2916, contacts/vias are formed on the conductive sockets. See, for example, FIGS. 28A and 28B.

While the block diagram 2900 of FIG. 29 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 30:
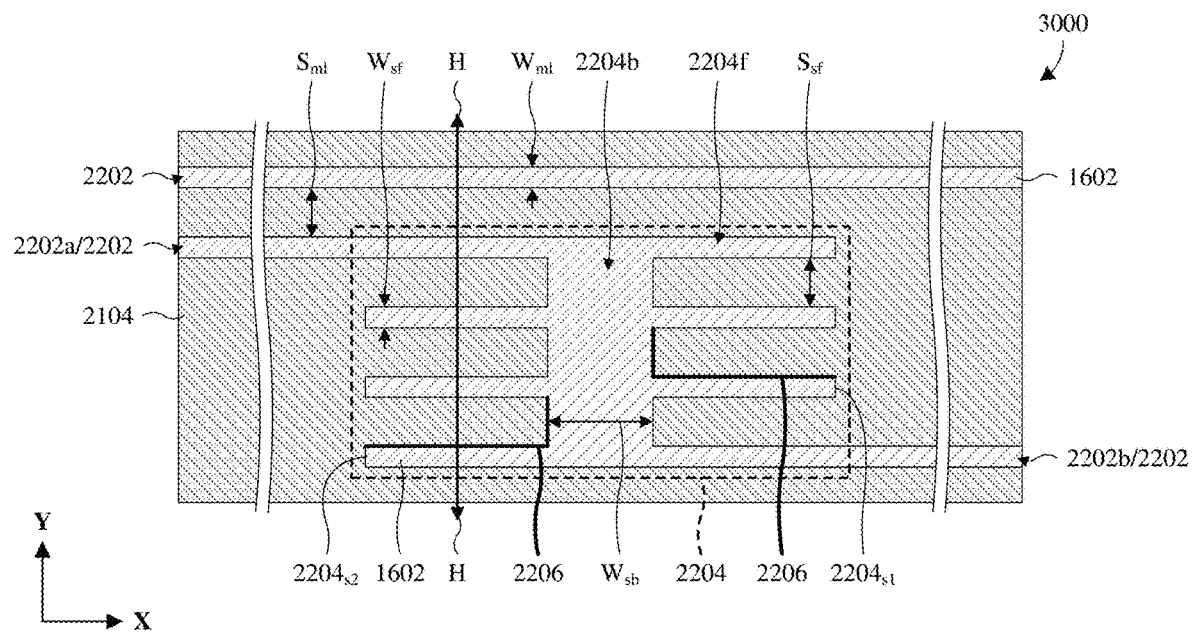
FIG. 30 illustrates a top layout view of some alternative embodiments of a mandrel socket of FIG. 22A in which the mandrel socket is more rectilinear.

With reference to FIG. 30, a top layout view 3000 of some alternative embodiments of mandrel socket 2204 of FIG. 22A is provided in which the mandrel socket 2204 is more rectilinear compared to in FIG. 22A. Alternative embodiments of the method of FIGS. 21A and 21B to FIGS. 28A and 28B may use these embodiments of the mandrel socket 2204 in place of embodiments of the mandrel socket 2204 at FIG. 22A.

Figure 31:
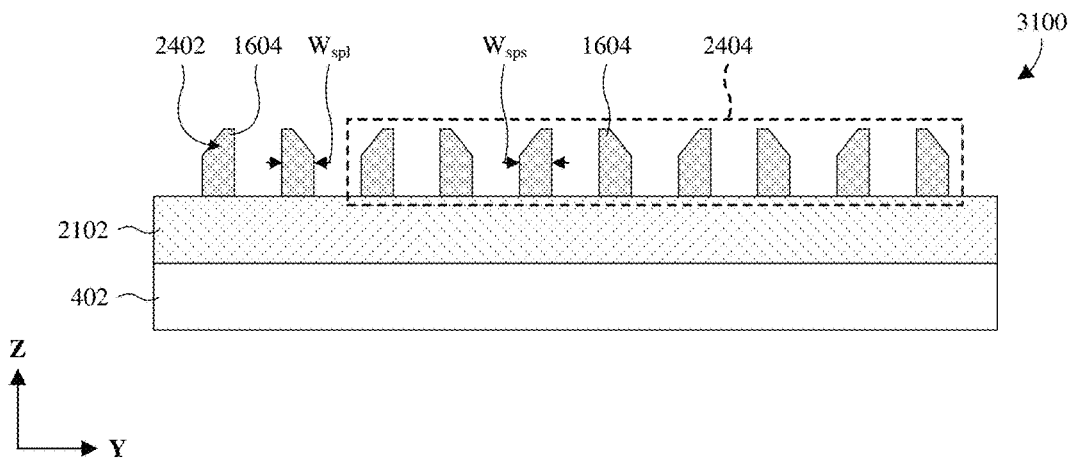
FIGS. 31-33 illustrate a series of cross-sectional views of some alternative embodiments of the method of FIGS. 21A and 21B to FIGS. 28A and 28B.
Figure 32:
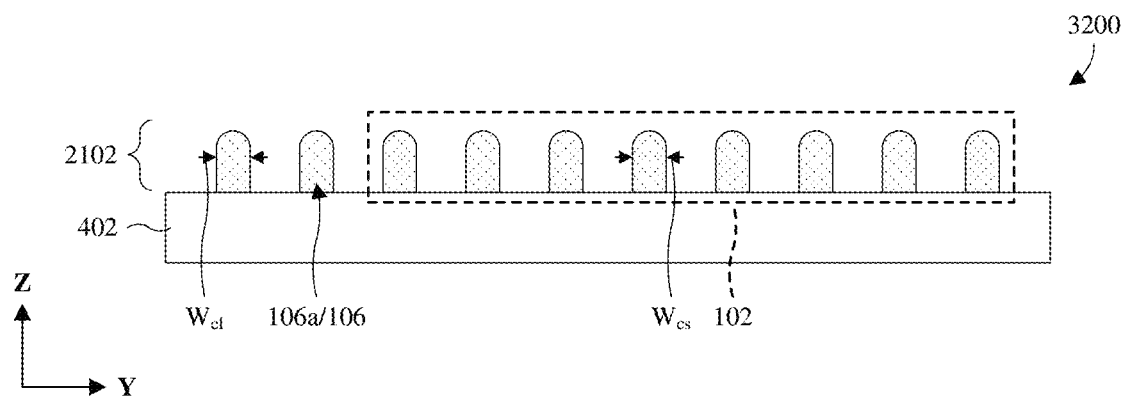
Figure 33:
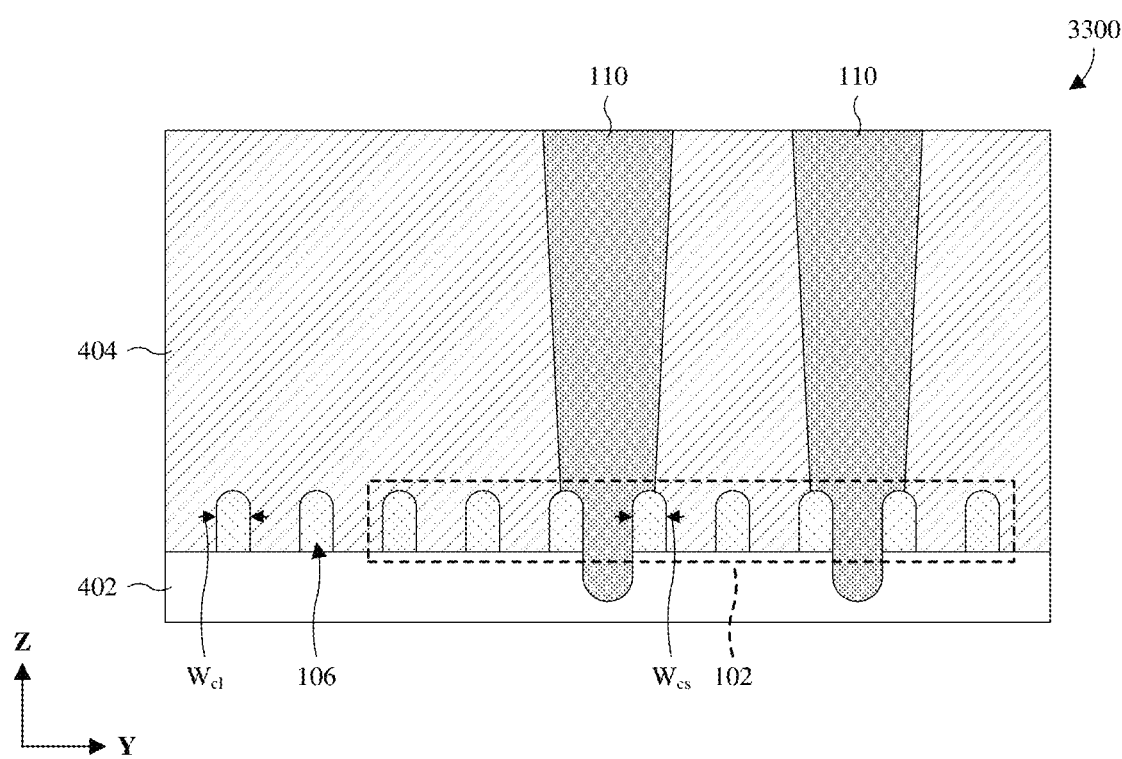

With reference to FIGS. 31-33, a series of cross-sectional views 3100-3300 of some alternative embodiments of the method of FIGS. 21A and 21B to FIGS. 28A and 28B is provided in which the hard mask layer 2104 (see, e.g., FIGS. 21A and 21B) is omitted.

As illustrated by the cross-sectional view 3100 of FIG. 31, the acts described with regard to FIGS. 21A and 21B to 25A and 25B are performed as described and illustrated above, except that the hard mask layer 2104 is not deposited. As a result, the plurality of sidewall spacer structures 1604 is directly on the conductive layer 2102.

As illustrated by the cross-sectional view 3200 of FIG. 32, the acts described with regard to FIGS. 26A and 26B are performed as described and illustrated above. As a result, the plurality of conductive lines 106 and the plurality of conductive sockets 102 are formed on the dielectric layer 402. Further, top surfaces of the conductive lines 106 and the conductive sockets 102 are rounded because there was no hard mask layer providing protection.

As illustrated by the cross-sectional view 3300 of FIG. 33, the acts described with regard to FIGS. 28A and 28B are performed as described and illustrated above. As a result, the plurality of contacts/vias 110 are formed on the conductive sockets 102.

With reference to FIGS. 34-36, 37A-37C to 40A-40C, and 41-43, a series of views of some embodiments of a method for forming an IC chip is provided in which cut inner conductive lines have ends laterally offset from ends of cut outer conductive lines in a dimension along which the cut outer conductive lines are elongated. Figures labeled with a suffix of A correspond to perspective views, figures labeled with a suffix of B correspond to top views for like numbered figures with a suffix of A, and figures labeled with a suffix of C correspond to cross-sectional views along line I in like numbered figures with a suffix of B. Figures with labels that are not suffixed with A, B, or C correspond to perspective views. The method may, for example, be employed to form the IC chip of FIG. 15 or some other suitable IC chip.

Figure 34:
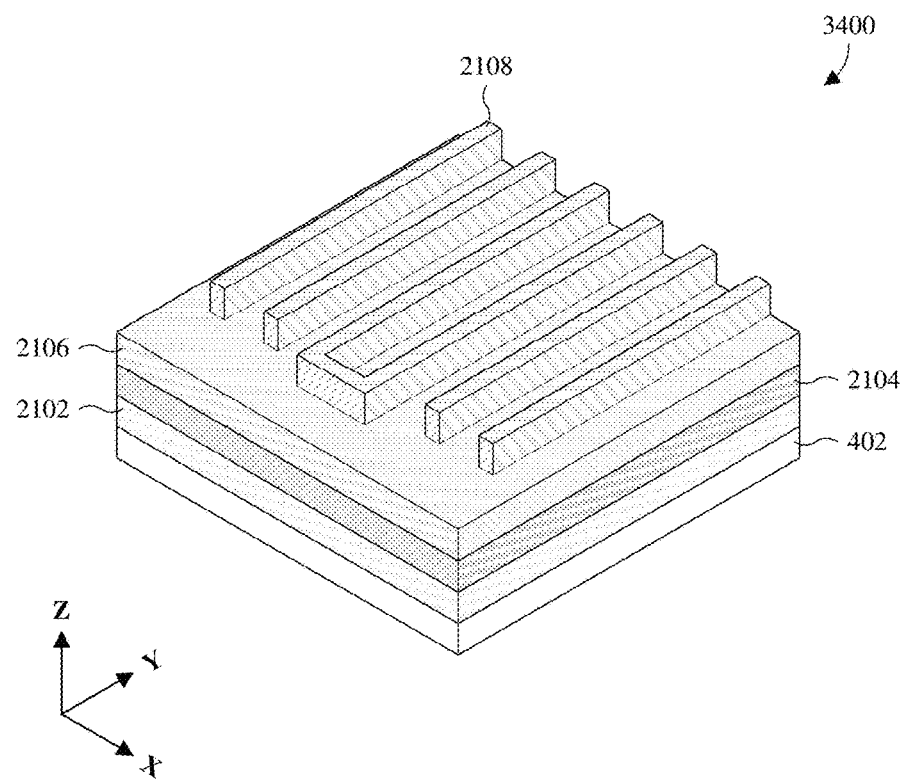
FIGS. 34-36, 37A-37C to 40A-40C, and 41-43 illustrate a series of views of some embodiments of a method for forming an IC chip in which cut inner conductive lines have ends laterally offset from ends of cut outer conductive lines in a dimension along which the cut outer conductive lines are elongated.

As illustrated by the perspective view 3400 of FIG. 34, a conductive layer 2102, a hard mask layer 2104, and a mandrel layer 2106 are sequentially deposited stacked overlying a dielectric layer 402. Further, a photoresist mask 2108 is formed overlying the mandrel layer 2106. The photoresist mask 2108 has a mandrel layout, which is to be transferred to the mandrel layer 2106 and which is described hereafter. The photoresist mask may, for example, be formed by a photolithography process or some other suitable process.

Figure 35:
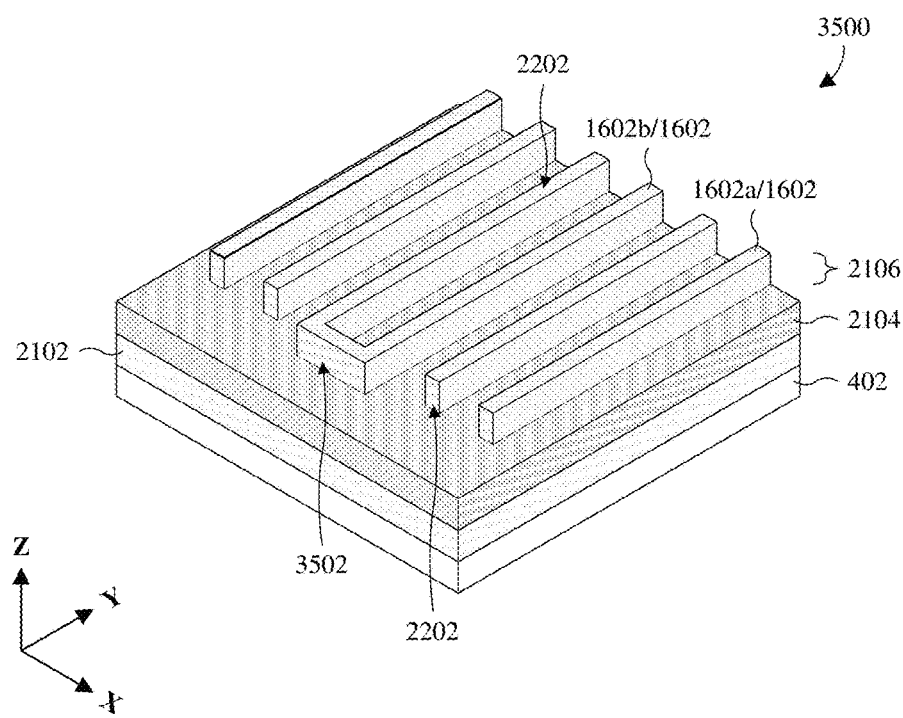

As illustrated by the perspective view 3500 of FIG. 35, a first mandrel etch is performed into the mandrel layer 2106 with the photoresist mask 2108 (see, e.g., FIG. 34) in place to transfer a mandrel layout from the photoresist mask 2108 to the mandrel layer 2106. The first mandrel etch stops on the hard mask layer 2104 and forms a plurality of mandrels 1602.

The plurality of mandrels 1602 have a plurality of first mandrels 1602a with line-shaped ends elongated in parallel in a first dimension (e.g., a Y dimension), and further have a second mandrel 1602b with a U-shaped end elongated in parallel with the first mandrels 1602a in the first dimension. Put another way, the mandrels 1602 have a plurality of mandrel lines 2202, as well as a mandrel bridge 3502 connecting neighboring mandrel lines at the second mandrel 1602b but not at the first mandrels 1602a. The mandrel lines 2202 are elongated in the first dimension, and the mandrel bridge 3502 is elongated in a second dimension (e.g., an X dimension) transverse to the first dimension. In some embodiments, the mandrel lines 2202 are evenly spaced in the second dimension. Notwithstanding the illustrated layout for the second mandrel 1602b, other suitable layouts having an end with at least one turn are amenable. As seen hereafter, the layout of the second mandrel 1602b facilitates cutting of ends of sidewall spacer structures hereafter formed with a large process window.

Also illustrated by the perspective view 3500 of FIG. 35, the photoresist mask 2108 (see, e.g., FIG. 34) is removed. The removal may, for example, be performed by the first mandrel etch or after the first mandrel etch by plasma ashing or the like.

Figure 36:
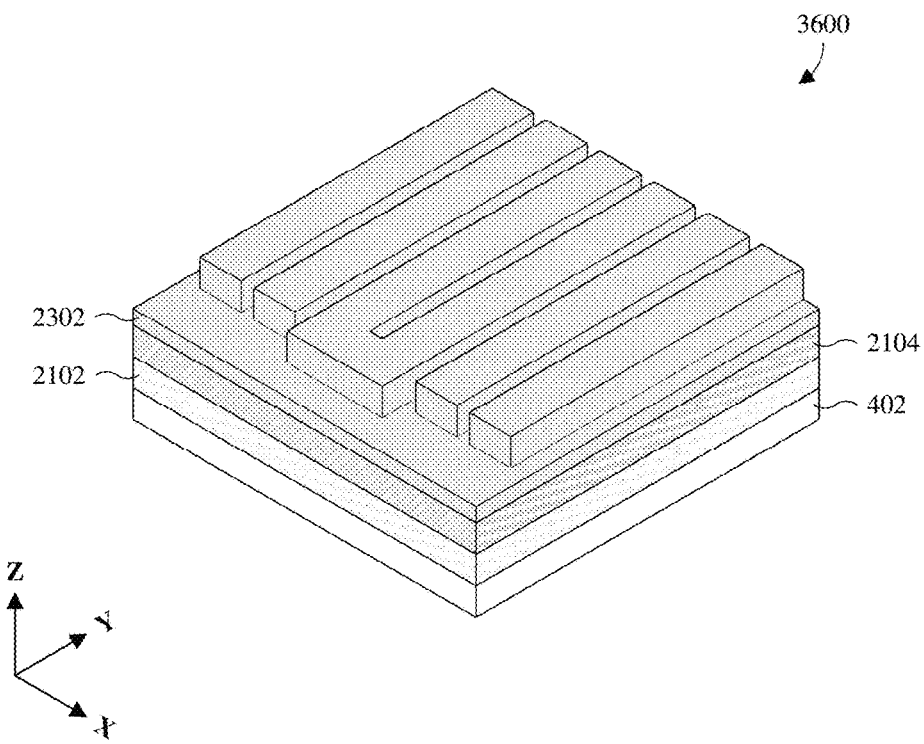

As illustrated by the perspective view 3600 of FIG. 36, a spacer layer 2302 is deposited overlying the mandrels 1602 (see, e.g., FIG. 35) and the hard mask layer 2104, and further lining sidewalls of the mandrels 1602.

Figure 37A:
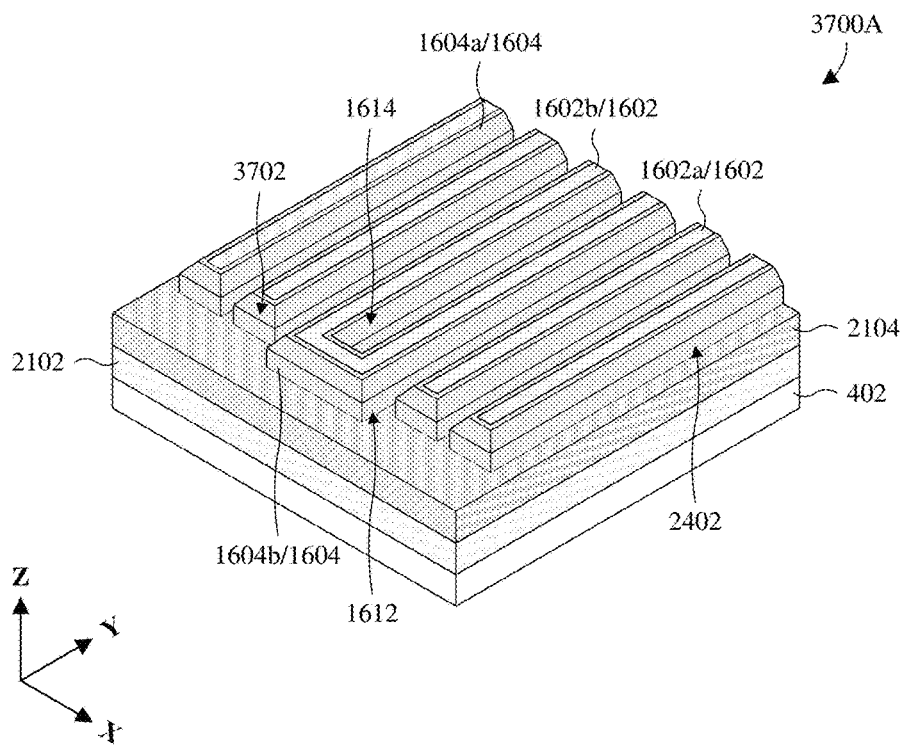
Figure 37B:
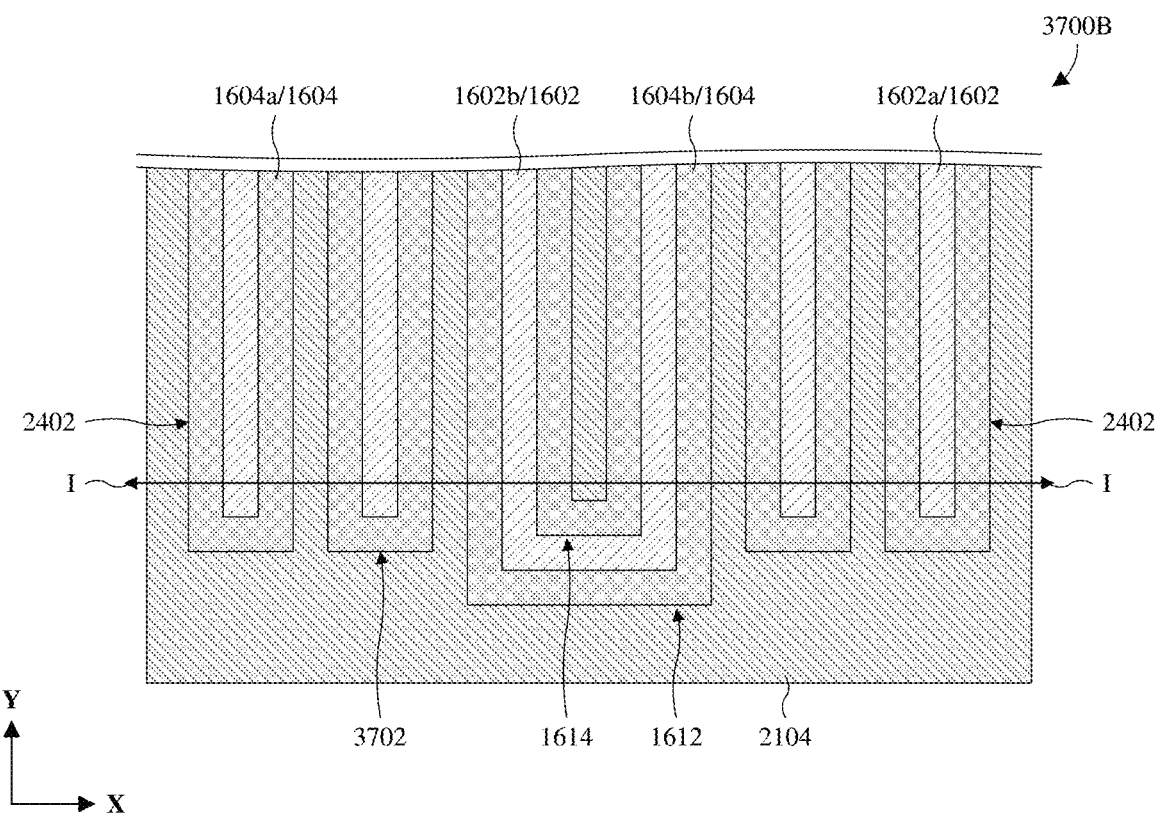
Figure 37C:
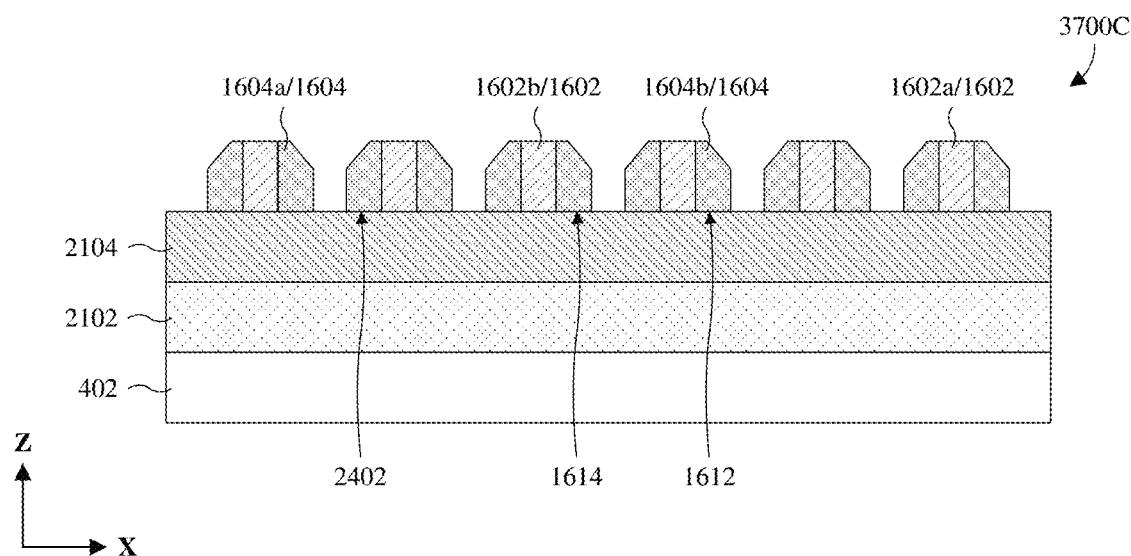

As illustrated by the views 3700A-3700C of FIGS. 37A-37C, a first spacer etch is performed into the spacer layer 2302 (see, e.g., FIG. 36). The first spacer etch etches back the spacer layer 2302 to remove the spacer layer 2302 from atop the mandrels 1602 and to remove horizontal segments of the spacer layer 2302. Further, the first spacer etch forms sidewall spacer structures 1604 from vertical segments of the spacer layer 2302.

The sidewall spacer structures 1604 are on and conform to sidewalls of the mandrels 1602. Further, the sidewall spacer structures 1604 have a target layout which is complementary to the mandrel layout of the mandrels 1602 and which is to be transferred to the hard mask layer 2104 and the conductive layer 2102 to form conductive lines and conductive sockets. The sidewall spacer structures 1604 are elongated in parallel in a first dimension (e.g., a Y dimension) and have a plurality of first sidewall spacer structures 1604a with U-shaped ends wrapping around ends respectively of the first mandrels 1602a. Further, the sidewall spacer structures 1604 have a second sidewall spacer structure 1604b surrounding the second mandrel 1602b. The second sidewall spacer structure 1604a has an outer spacer segment 1612 wrapping around an end of the second mandrel 1602b, and further has an inner spacer segment 1614 nested within the outer spacer segment 1612 and the second mandrel 1602b.

Put another way, the sidewall spacer structures 1604 have a plurality of spacer lines 2402, as well as a plurality of spacer bridges 3702 connecting neighboring spacer lines. The spacer lines 2402 are elongated in the first dimension, and the spacer bridges 3702 are elongated in a second dimension (e.g., an X dimension) transverse to the first dimension. In some embodiments, the spacer lines 2402 are evenly spaced in the second dimension.

Figure 38A:
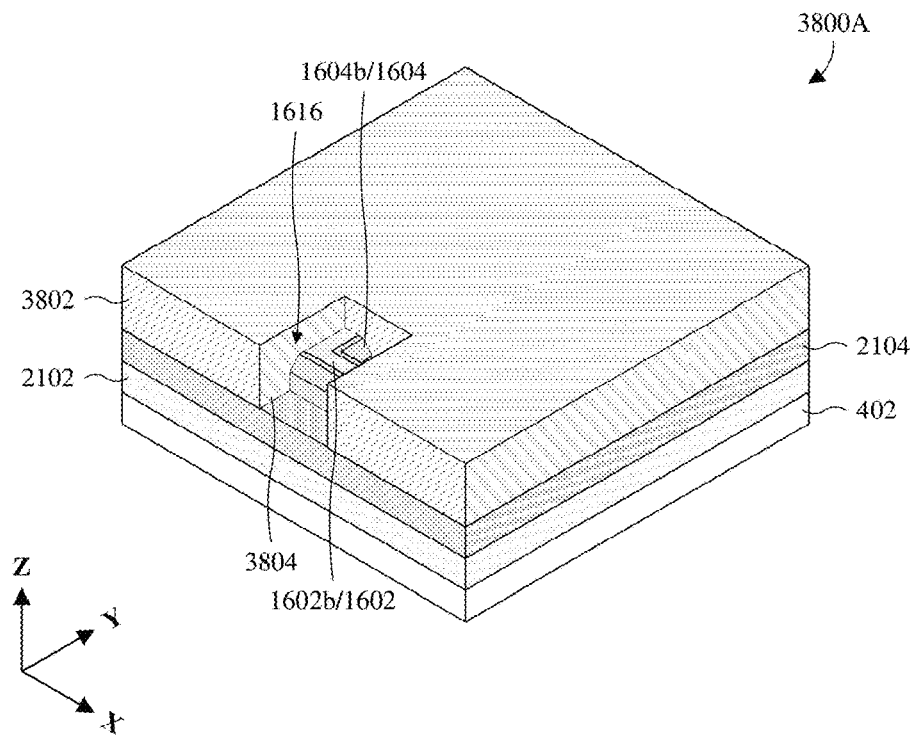
Figure 38B:
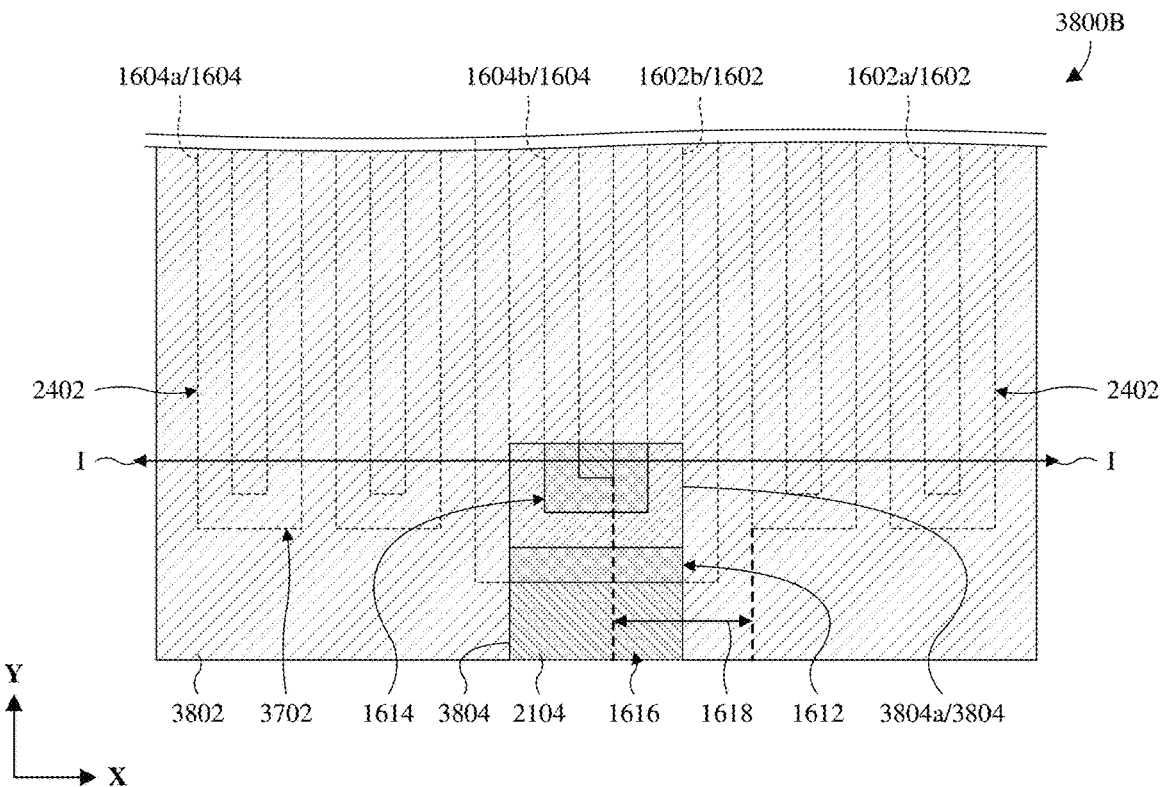
Figure 38C:
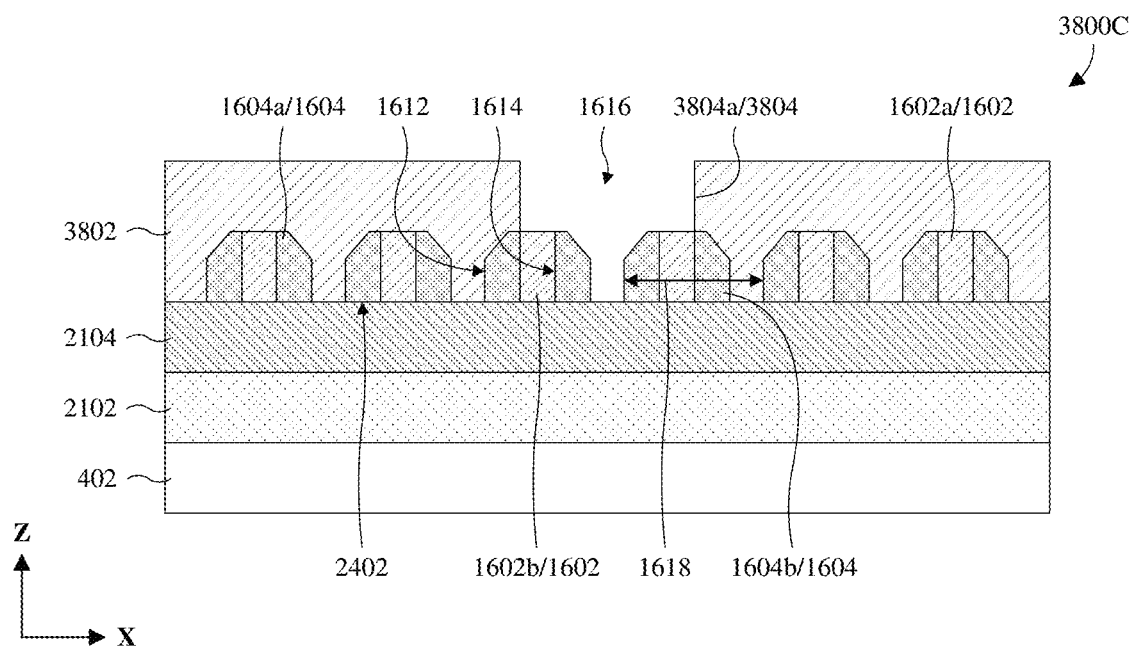

As illustrated by the views 3800A-3800C of FIGS. 38A-38C, a second photoresist mask 3802 with an opening 1616 overlying an end of the second sidewall spacer structure 1604b and the second mandrel 1602b is formed. Opposing sidewalls 3804 of the second opening 1616, which extend in a dimension (e.g., the Y dimension) along which the second sidewall spacer structure 1604b is elongated, may be placed respectively on opposite sides of the inner spacer segment 1614. Further, the opposing sidewalls 3804 may be placed respectively at sidewalls of the outer spacer segment 1612 that are respectively on the opposite sides and that face the inner spacer segment 1614. The second photoresist mask 3802 may, for example, be formed by a photolithography process or some other suitable process.

Figure 39A:
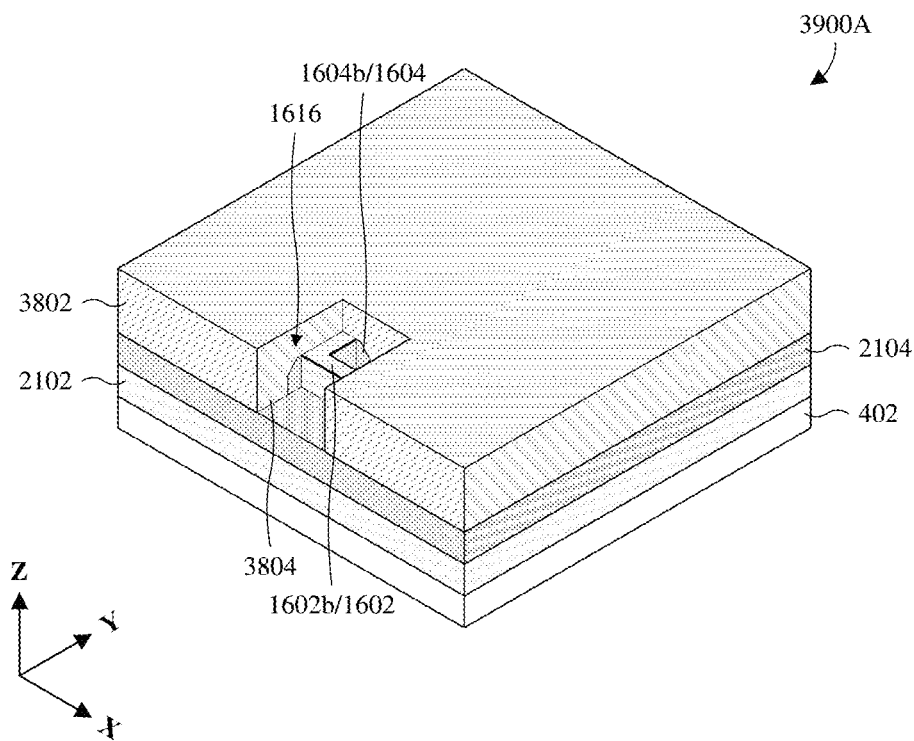
Figure 39B:
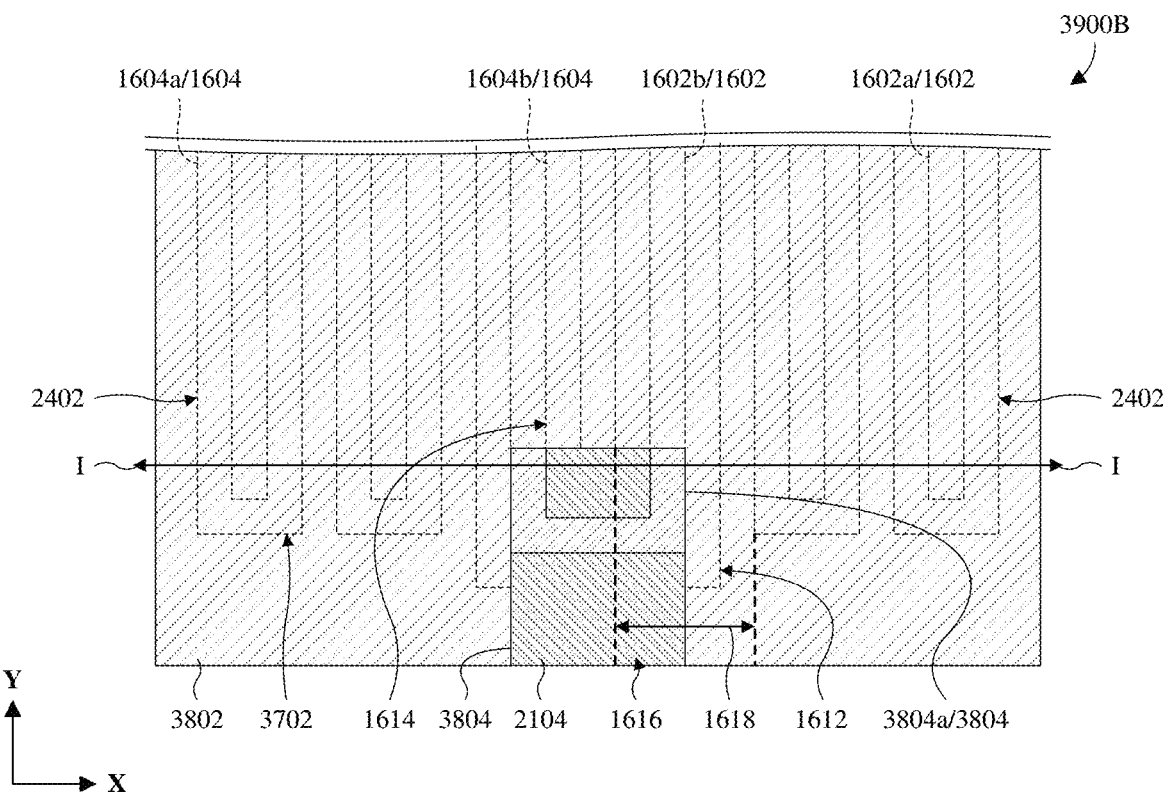
Figure 39C:
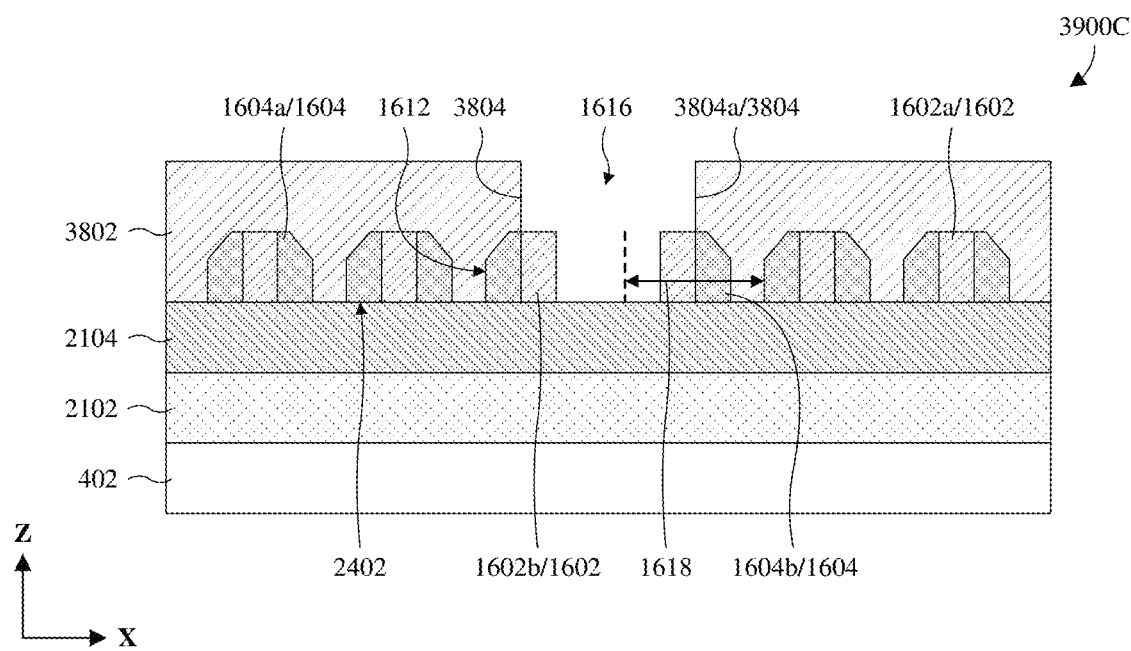

As illustrated by the views 3900A-3900C of FIGS. 39A-39C, a second spacer etch is performed into the second sidewall spacer structure 1604b with the second photoresist mask 3802 in place. The second spacer etch stops on the hard mask layer 2104 and cuts an end of the second sidewall spacer structure 1604b to disconnects the spacer lines 2402 of the second sidewall spacer structure 1604b. The second spacer etch employs an etchant having a high selectivity for the sidewall spacer structures 1604 relative to the mandrels 1602 and the hard mask layer 2104 so the mandrels 1602 and the hard mask layer 2104 are minimally etched.

As can be seen at FIGS. 38A-38C and FIGS. 39A-39C, the opening 1616 may move in a dimension (e.g., an X dimension) transverse to a length of the sidewall spacer structures 1604 (e.g., due to overlay error) without unintentionally cutting a neighboring sidewall spacer structure so long as a first one 3804a of the opposing sidewalls 3804 remains within an overlay window 1618. The nested arrangement between the outer and inner spacer segments 1612, 1614 of the second sidewall spacer structure 1604b, and the U-shaped ends of the outer and inner spacer segments 1612, 1614, allow the overlay window 1618 to be large compared to what it would be if cutting an end of one of the first sidewall spacer structures 1604a as explained with regard to FIGS. 15 and 16. Because of the large overlay window 1618, the second photoresist mask 3802 may depend on a low-resolution photolithography process and/or a low-grade photomask/reticle. This may, in turn, reduce costs and/or increase throughput.

Figure 40A:
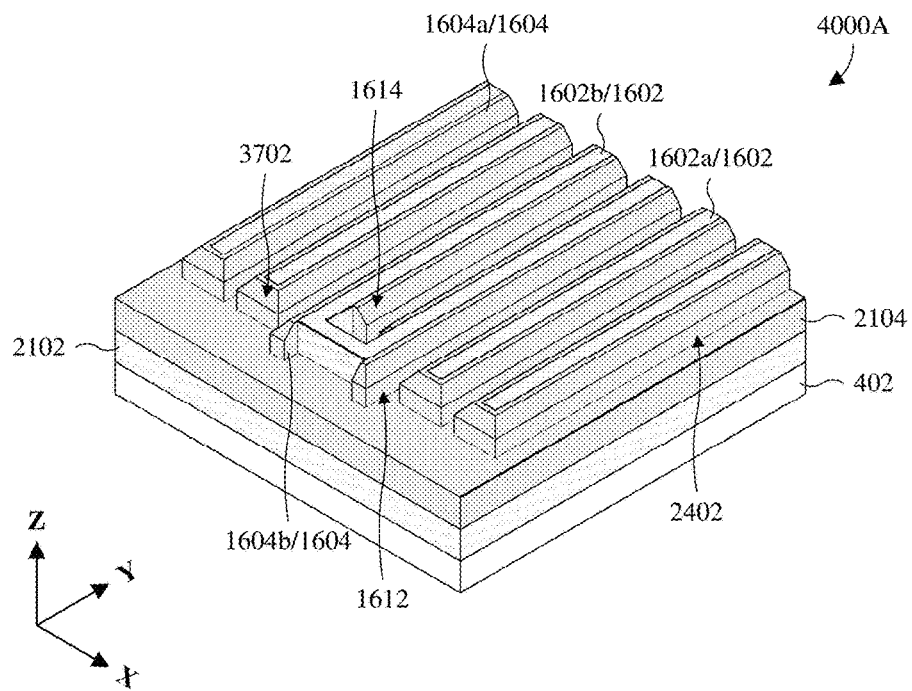
Figure 40B:
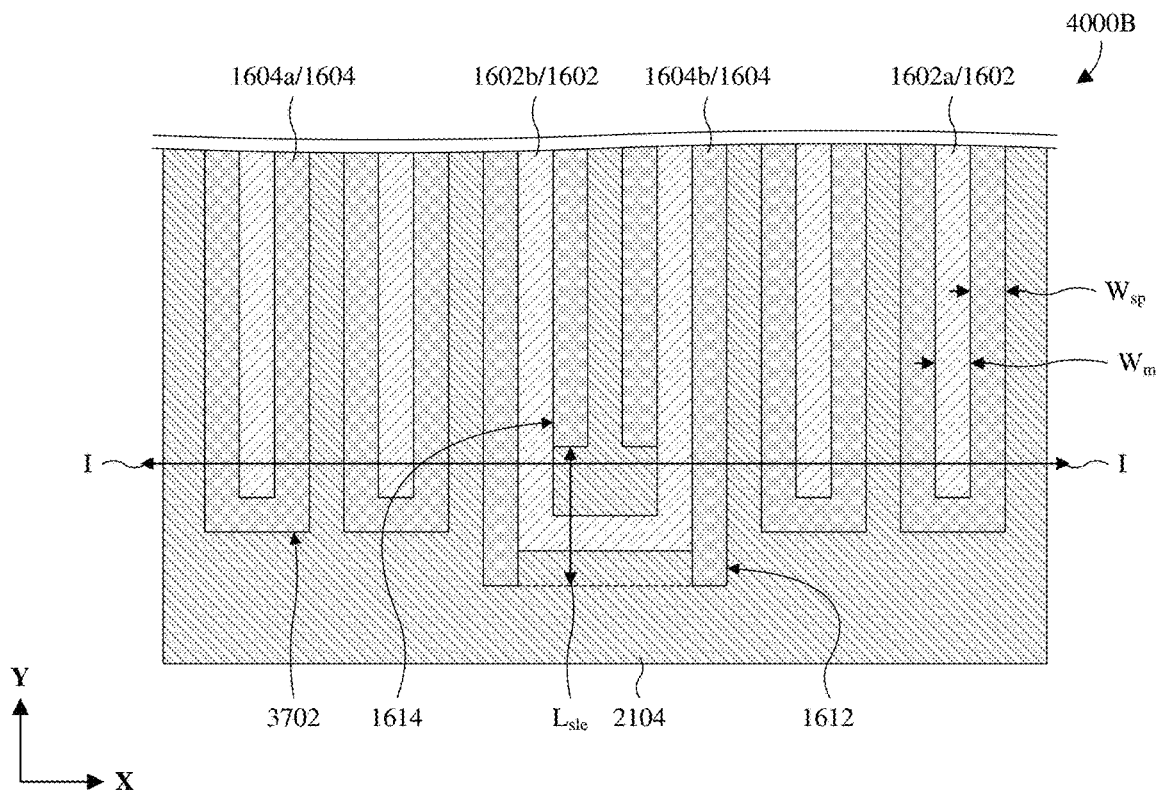
Figure 40C:
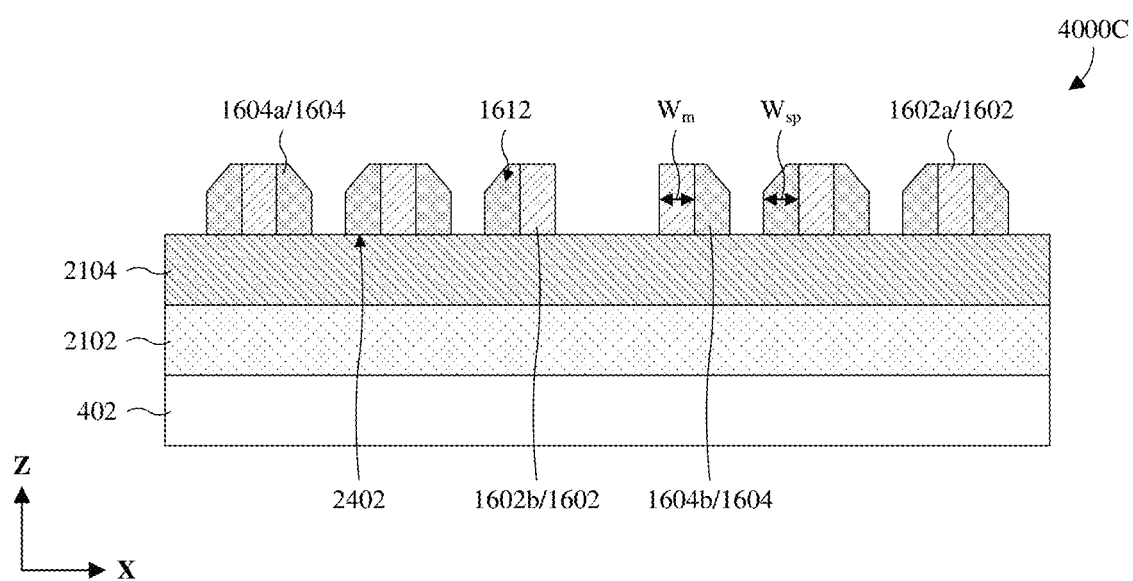

As illustrated by the views 4000A-4000C of FIG. 40A-40C, the second photoresist mask 3802 is removed. The removal may, for example, be performed by the second spacer etch or after the second spacer etch by plasma ashing or the like. Removal of the second photoresist mask 3802 exposes cut ends of the second sidewall spacer structure 1604b, which are offset along a length of the second sidewall spacer structure 1604b by a length $L_{sle}$. In some embodiments, the length $L_{sle}$ is equal to or greater than the width $W_m$ of the mandrels 1602 plus two times the width $W_{sp}$ of the sidewall spacer structure 1604.

Figure 41:
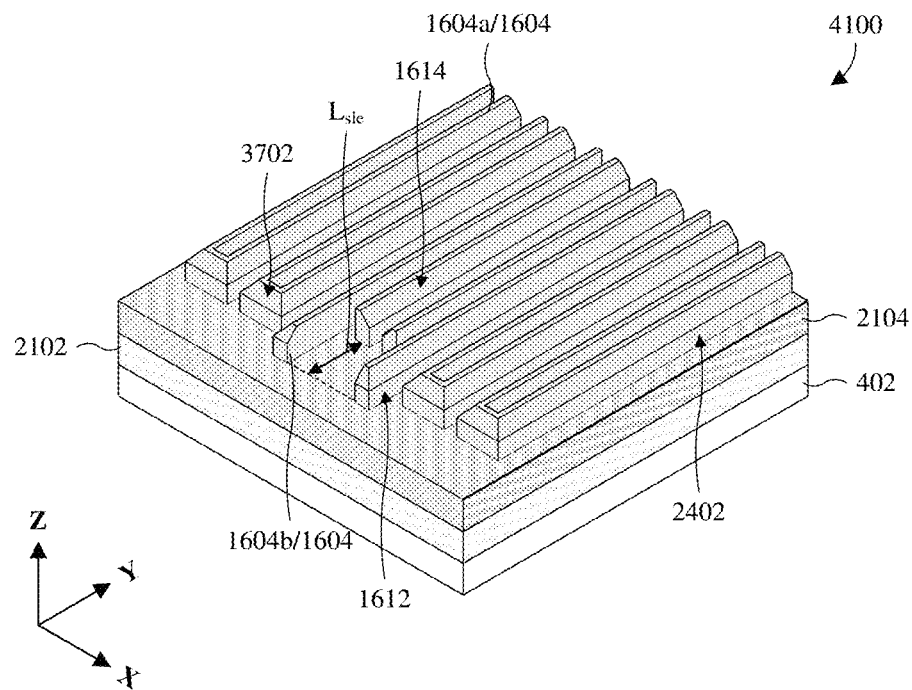

As illustrated by the perspective view 4100 of FIG. 41, a second mandrel etch is performed into the mandrels 1602 (see, e.g., FIGS. 40A-40C) to remove the mandrels 1602. The second mandrel etch employs an etchant having a high selectivity for the mandrels 1602 relative to the sidewall spacer structures 1604 and the hard mask layer 2104. As such, the sidewall spacer structures 1604 and the hard mask layer 2104 are minimally etched.

Figure 42:
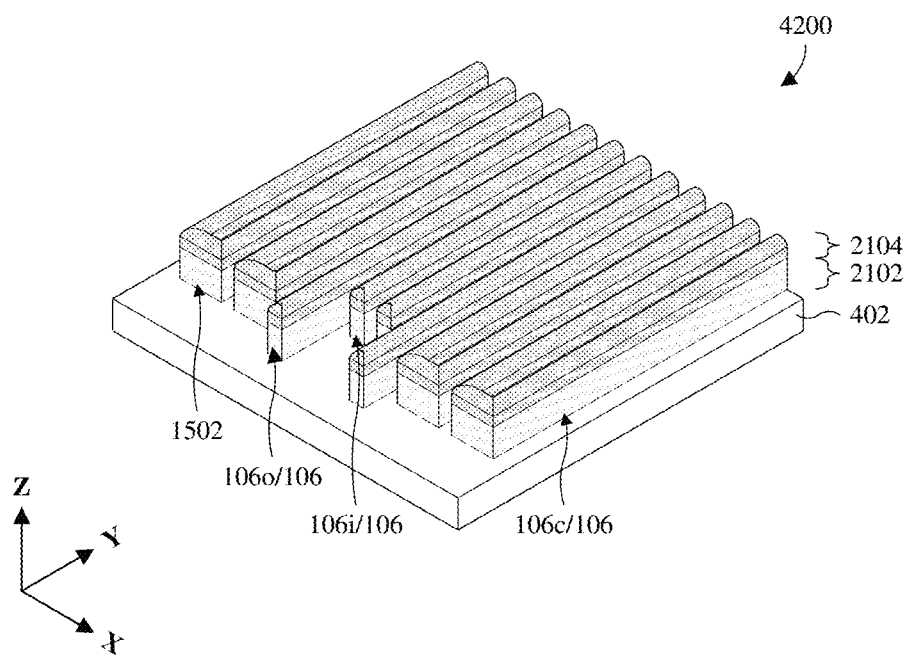

As illustrated by the perspective view 4200 of FIG. 42, a target etch is performed into the hard mask layer 2104 and the conductive layer 2102 with the sidewall spacer structures 1604 (see, e.g., FIG. 41) in place. The target etch employs the sidewall spacer structures 1604 as masks to transfer a target layout from the sidewall spacer structures 1604 to the hard mask layer 2104 and the conductive layer 2102. Further, the target etch removes the sidewall spacer structures 1604 and erodes the hard mask layer 2104.

By transferring the target layout to the hard mask layer 2104 and the conductive layer 2102, a plurality of conductive lines 106 masked by the hard mask layer 2104 are formed. The plurality of conductive lines 106 are elongated in parallel in a first dimension (e.g., a Y dimension) and are spaced in a second dimension (e.g., an X dimension) transverse to the first dimension. The plurality of conductive lines 106 comprises a plurality of connected conductive lines 106c, a pair of cut inner conductive lines 106i, and a pair of cut outer conductive lines 106o. The connected conductive lines 106c are connected to neighboring connected conductive lines by conductive bridges 1502. The cut inner and outer conductive lines 106i, 106o are formed from the second sidewall spacer structure 1604b (see, e.g., FIG. 41), which was cut by the second spacer etch described with regard to FIGS. 39A-39C. The cut inner conductive lines 106i are between and border the cut outer conductive lines 106o and have ends offset from ends of the cut outer conductive lines 106o in the first dimension.

Figure 43:
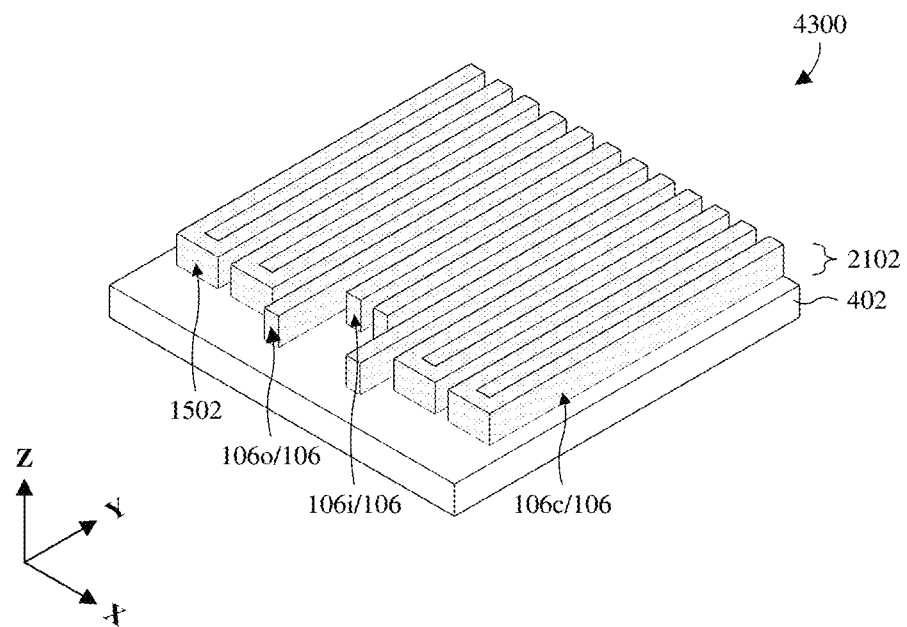

As illustrated by the perspective view 4300 of FIG. 43, the hard mask layer 2104 is removed from atop the conductive layer 2102. In some embodiments, the removal is performed by a hard-mask etch. In other embodiments, the removal is performed by a CMP. In other embodiments, the removal is performed by some other removal process.

While FIGS. 34-36, 37A-37C to 40A-40C, and 41-43 are described with reference to a method, it will be appreciated that the structures shown in FIGS. 34-36, 37A-37C to 40A-40C, and 41-43 are not limited to the method but rather may stand alone separate of the method. While FIGS. 34-36, 37A-37C to 40A-40C, and 41-43 are described as a series of acts, it will be appreciated that the order of the acts may be altered in other embodiments. While FIGS. 34-36, 37A-37C to 40A-40C, and 41-43 illustrate and describe as a specific set of acts, some acts that are illustrated and/or described may be omitted in other embodiments. Further, acts that are not illustrated and/or described may be included in other embodiments.

Figure 44:
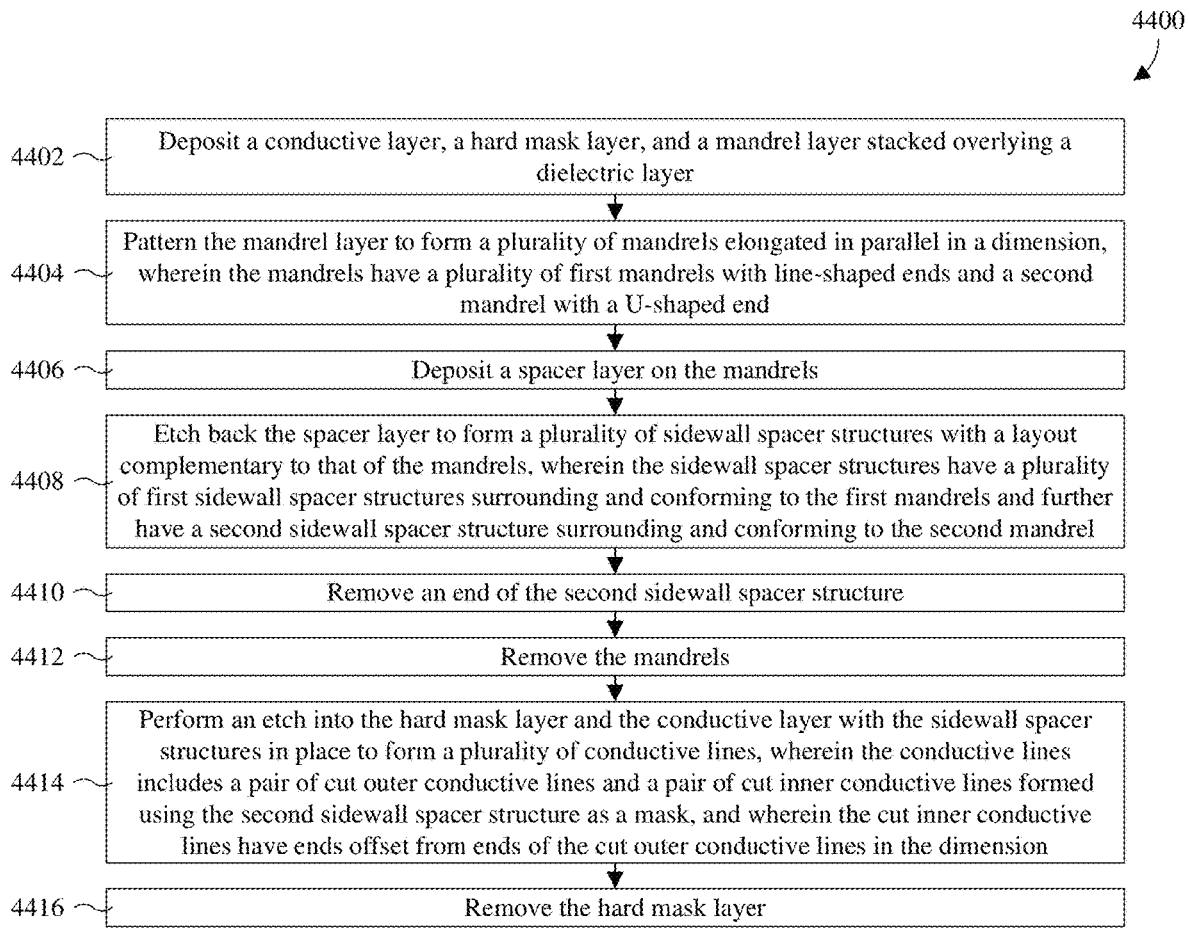
FIG. 44 illustrates a block diagram of some embodiments of the method of FIGS. 34-36, 37A-37C to 40A-40C, and 41-43.

With reference to FIG. 44, a block diagram 4400 of some embodiments of the method of FIGS. 34-36, 37A-37C to 40A-40C, and 41-43 is provided.

At 4402, a conductive layer, a hard mask layer, and a mandrel layer are deposited stacked overlying a dielectric layer. See, for example, FIG. 34.

At 4404, the mandrel layer is patterned to form a plurality of mandrels elongated in parallel, wherein the mandrels have a plurality of first mandrels with line-shaped ends and a second mandrel with a U-shaped end. See, for example, FIGS. 34 and 35.

At 4406, a spacer layer is deposited on the mandrels. See, for example, FIG. 36.

At 4408, the spacer layer is etched back to form a plurality of sidewall spacer structures with a layout complementary to that of the mandrels, wherein the sidewall spacer structures have a plurality of first sidewall spacer structures surrounding and conforming to the first mandrels and further have a second sidewall spacer structure surrounding and conforming to the second mandrel. See, for example, FIGS. 37A-37C.

At 4410, an end of the second sidewall spacer structure is removed. See, for example, FIGS. 38A-38C to FIGS. 40A-40C.

At 4412, the mandrels are removed. See, for example, FIG. 41.

At 4414, an etch is performed into the hard mask layer and the conductive layer with the sidewall spacer structures in place to form a plurality of conductive lines, wherein the conductive lines includes a pair of cut outer conductive lines and a pair of cut inner conductive lines formed using the second sidewall spacer structure as a mask, and wherein the cut inner conductive lines have ends offset from ends of the cut outer conductive lines in the dimension. See, for example, FIG. 42.

At 4416, the hard mask layer is removed. See, for example, FIG. 43.

While the block diagram 4400 of FIG. 44 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 45A-45C, 46A-46C, and 47, a series of views of some alternative embodiments of the method of FIGS. 34-36, 37A-37C to 40A-40C, and 41-43 is provided in which the mandrels are removed before cutting ends of sidewall spacer structures.

Figure 45A:
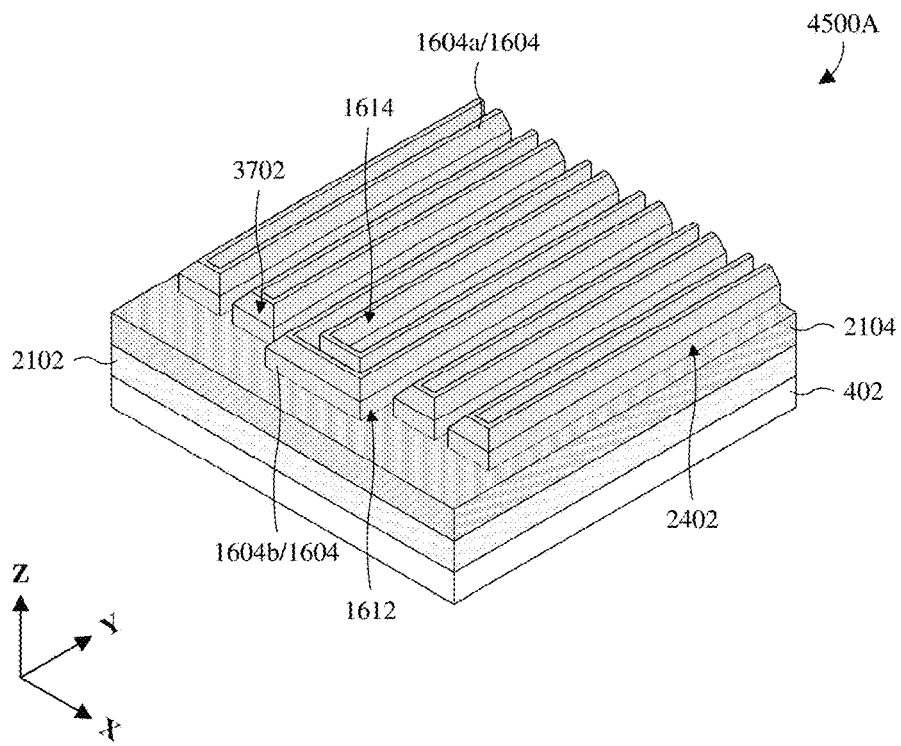
FIGS. 45A-45C, 46A-46C, and 47 illustrate a series of views of some alternative embodiments of the method of FIGS. 34-36, 37A-37C to 40A-40C, and 41-43 in which mandrels are removed before cutting ends of sidewall spacer structures.
Figure 45B:
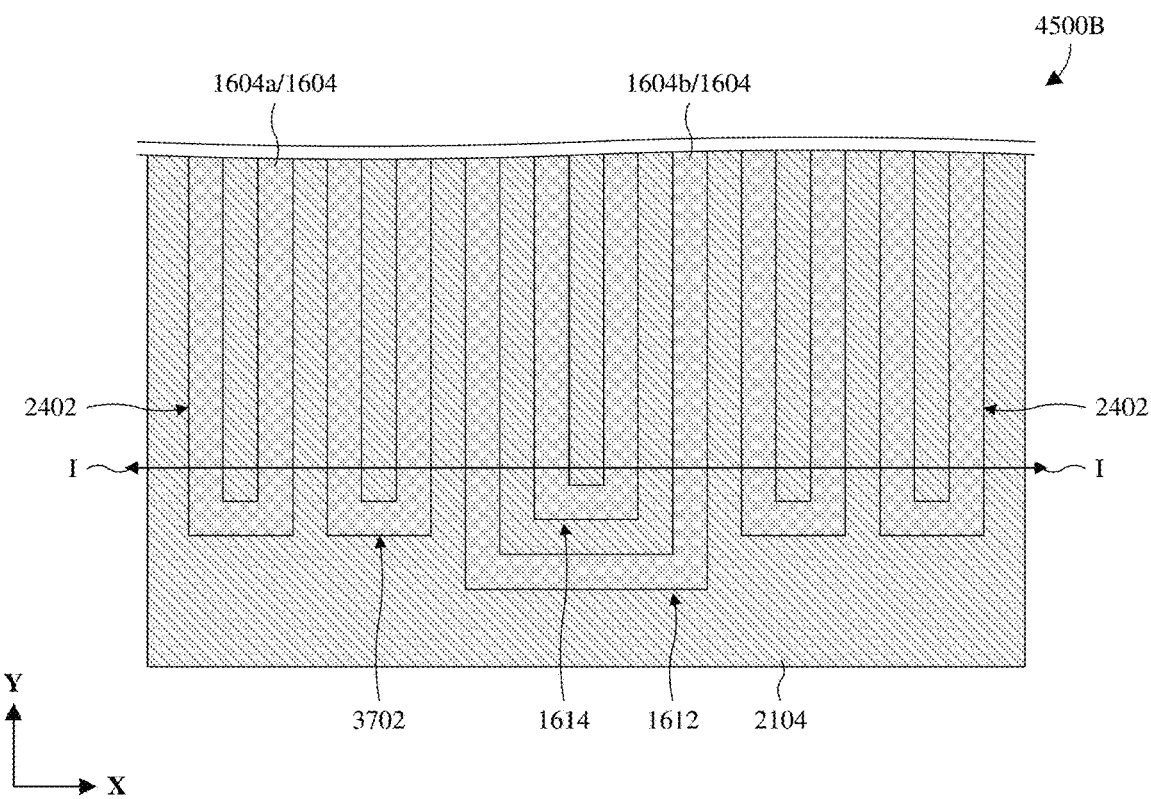
Figure 45C:
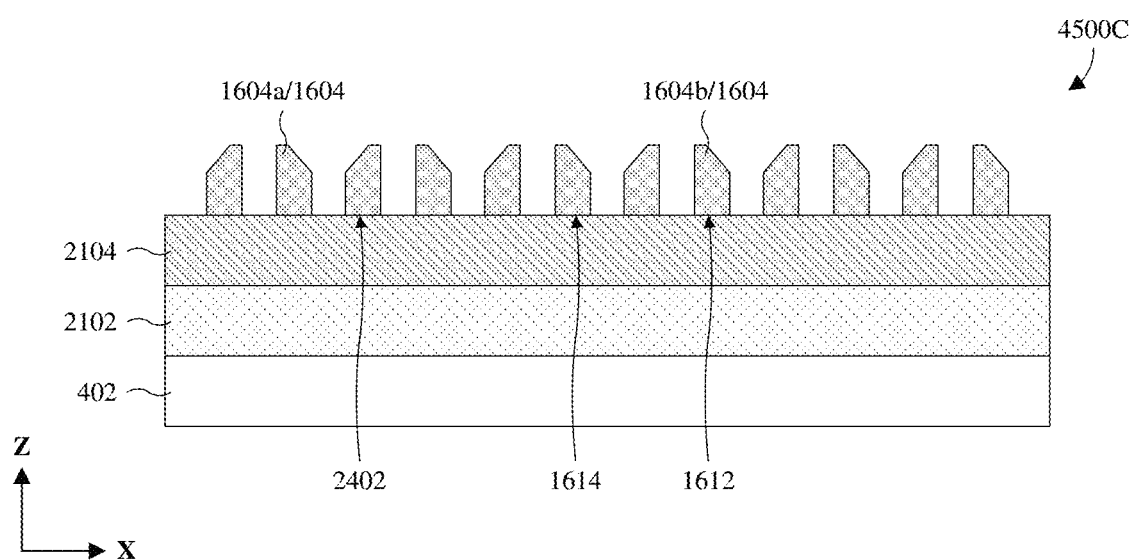
Figure 46A:
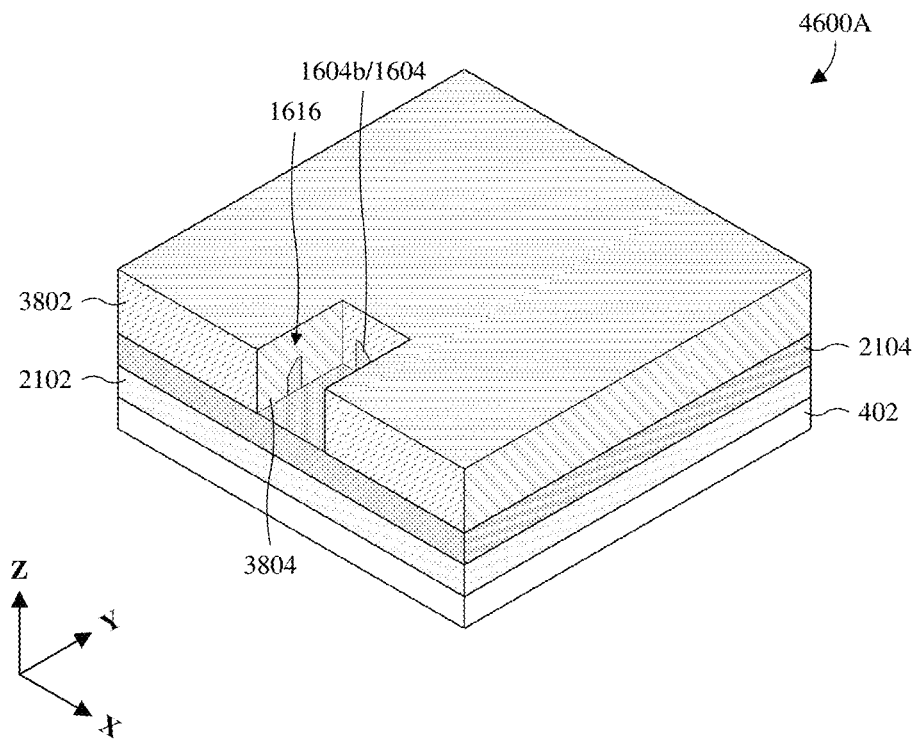
Figure 46B:
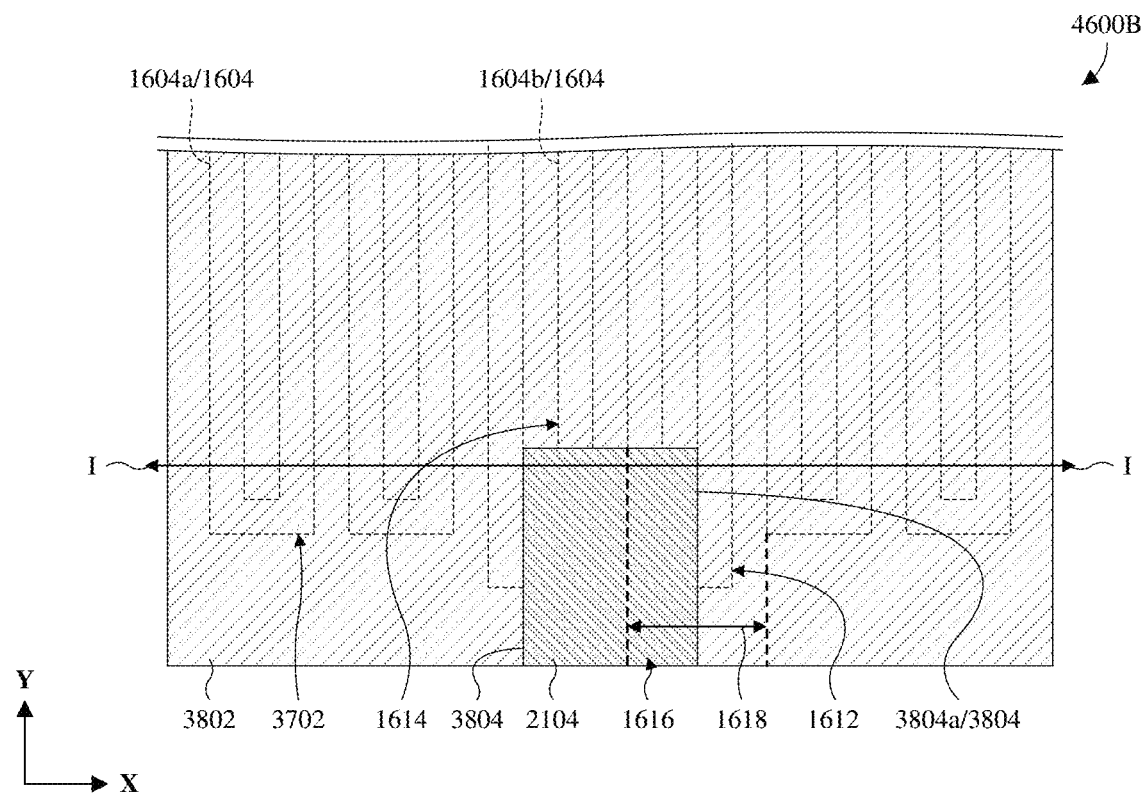
Figure 46C:
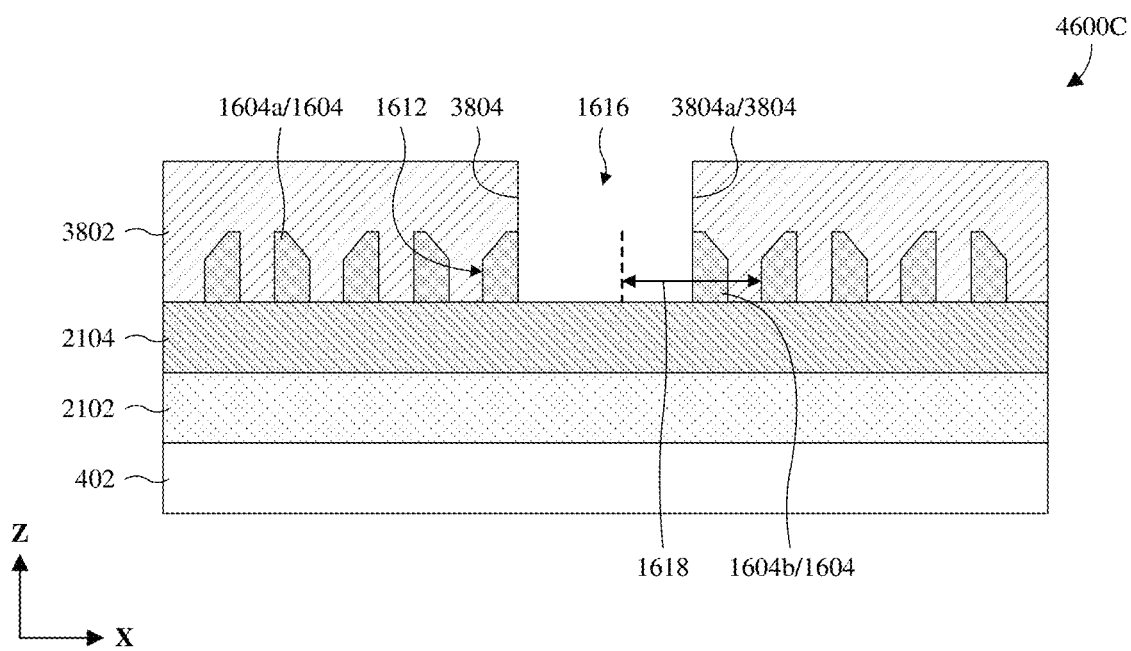
Figure 47:
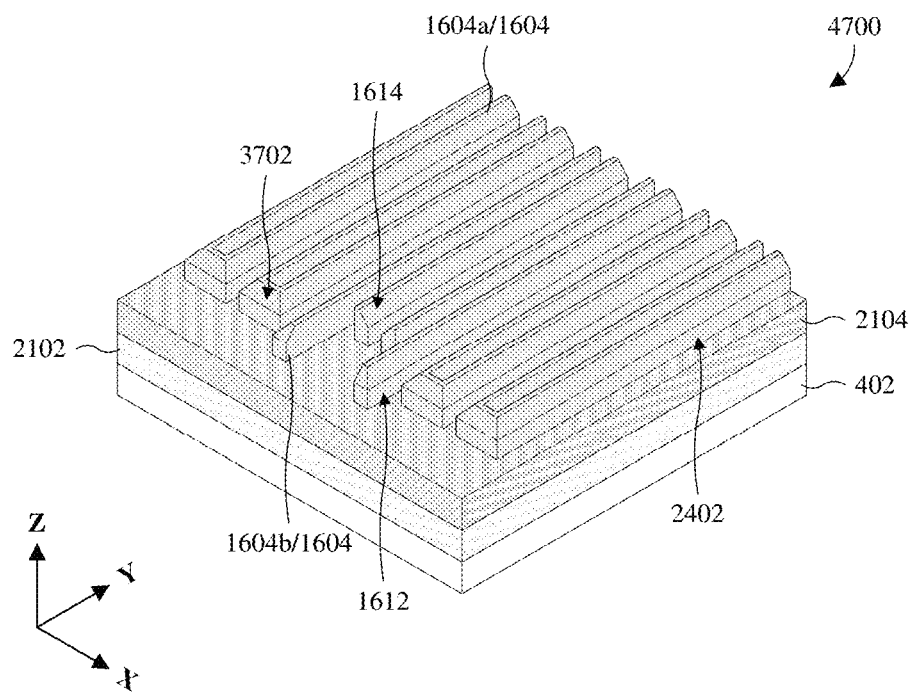

As illustrated by the views 4500A-4500C of FIGS. 45A-45C, the acts described with regard to FIGS. 34-36 and 37A-37C are performed as illustrated and described above. Further, the second mandrel etch described with regard to FIG. 41 is performed as illustrated and described above to remove the mandrels 1602. As illustrated by the views 4600A-4600C of FIGS. 46A-46C, the acts described with regard to FIGS. 38A-38C to 39A-39C are performed as illustrated and described above to cut an end of the second sidewall spacer structure 1604b. As illustrated by the perspective view 4700 of FIG. 47, the acts described with regard to FIGS. 40A-40C are performed as illustrated and described above to remove the second photoresist mask 3802. Thereafter, the acts described with regard to FIGS. 42 and 43 are performed as illustrated and described above arrive at the structure of FIG. 43.

Figure 48:
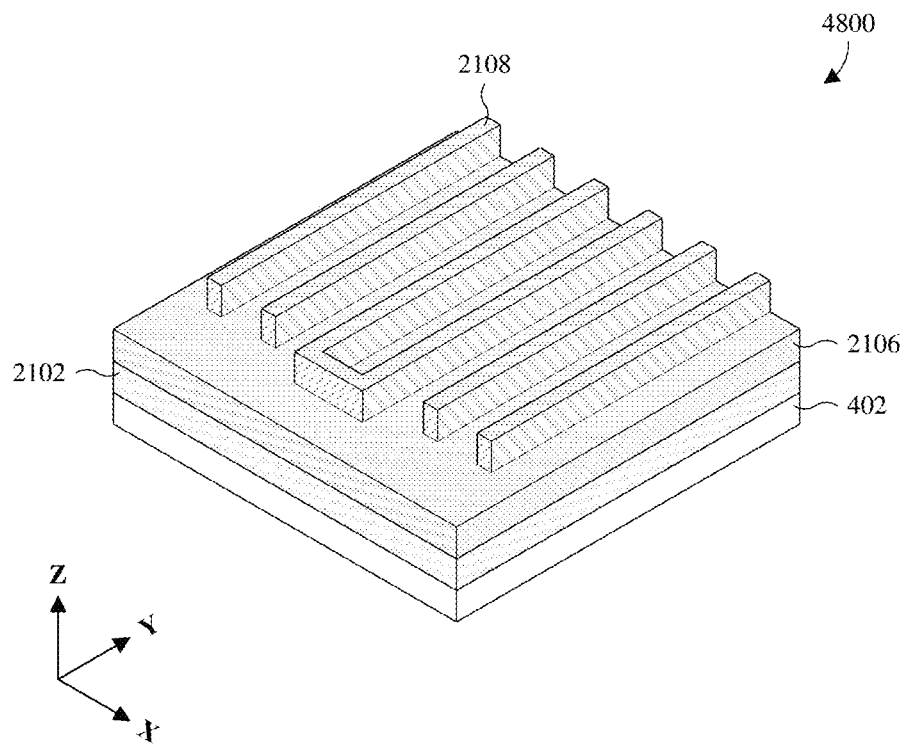
FIGS. 48 and 49 illustrate a series of perspective views of some alternative embodiments of the method of FIGS. 34-36, 37A-37C to 40A-40C, and 41-43 in which a hard mask layer is omitted.
Figure 49:
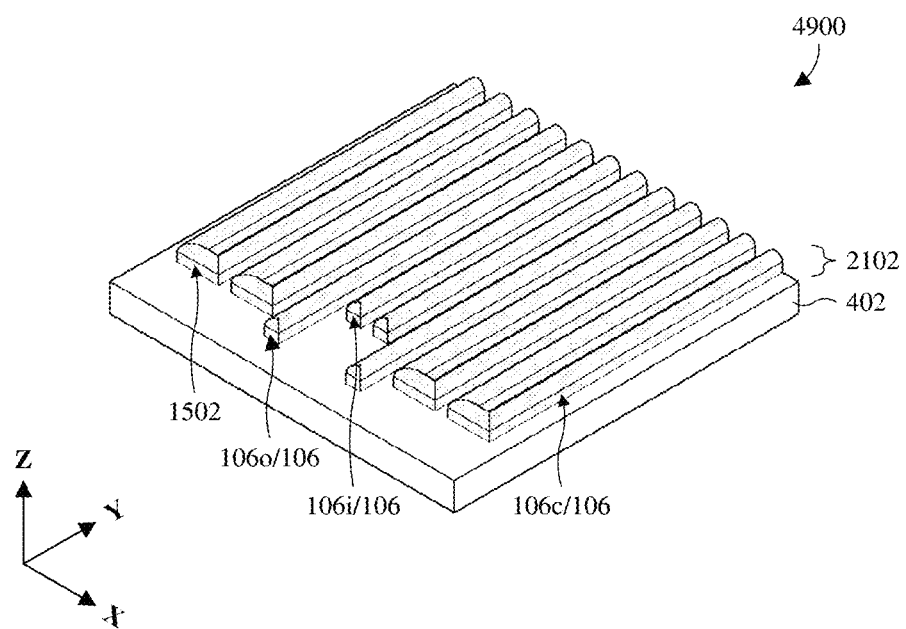

With reference to FIGS. 48 and 49, a series of perspective views of some alternative embodiments of the method of FIGS. 34-36, 37A-37C to 40A-40C, and 41-43 is provided in which the hard mask layer is omitted.

As illustrated by the perspective view 4800 of FIG. 48, the acts described with regard to FIG. 34 are performed as illustrated and described above, except the hard mask layer 2104 is omitted. As illustrated by the perspective view 4900 of FIG. 49, the acts described with regard to FIGS. 35, 36, 37A-37C to 40A-40C, and 41-42 are performed as illustrated and described above to form the plurality of conductive lines 106. In contrast with the conductive lines 106 in FIGS. 42 and 43, which have rectilinear tops, the conductive lines 106 of FIG. 49 have curved tops.

Figure 50:
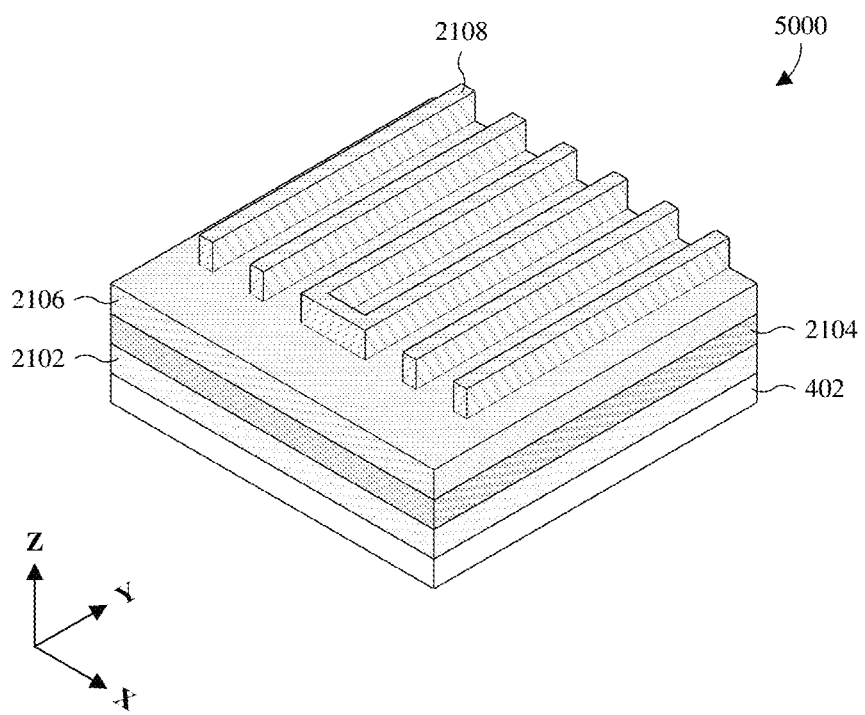
FIGS. 50-52 illustrate a series of perspective views of some alternative embodiments of the method of FIGS. 34-36, 37A-37C to 40A-40C, and 41-43 in which mandrel ends are even in a dimension along which mandrels are elongated.
Figure 51:
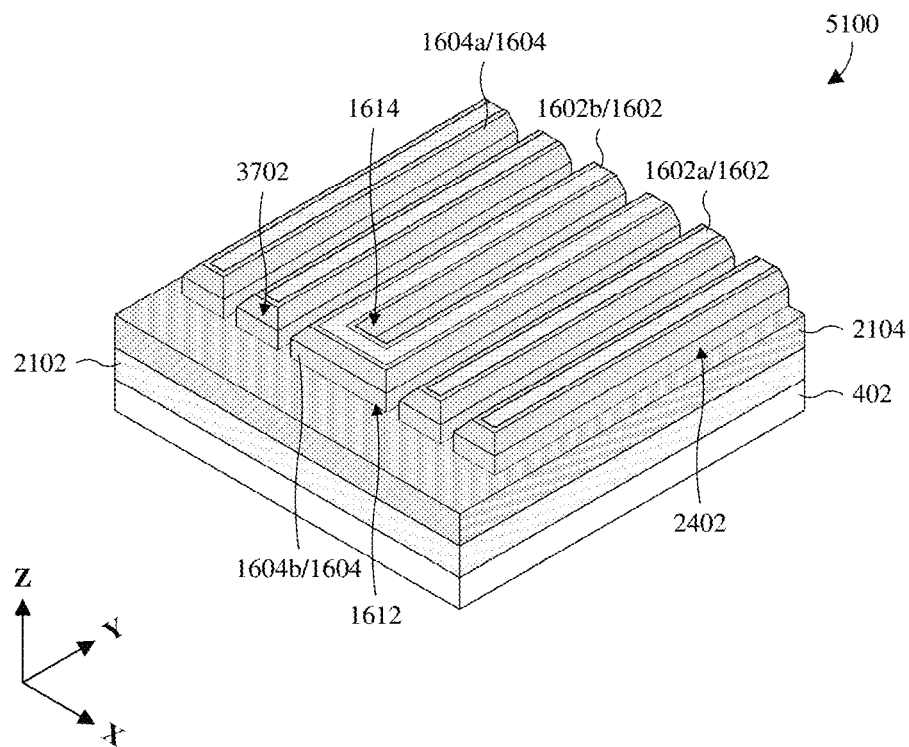
Figure 52:
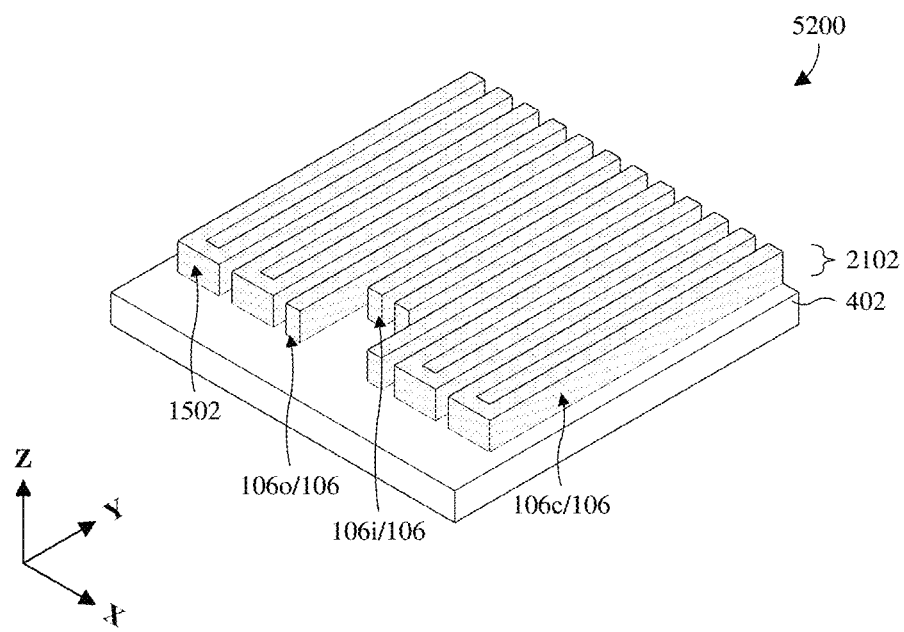

With reference to FIGS. 50-52, a series of perspective views of some alternative embodiments of the method of FIGS. 34-36, 37A-37C to 40A-40C, and 41-43 is provided in which mandrel ends are even in a dimension along which mandrels are elongated. The alternative embodiments may, for example, correspond to embodiments of the IC chip described with regard to FIGS. 18A and 19A.

As illustrated by the perspective view 5000 of FIG. 50, the acts described with regard to FIG. 34 are performed as illustrated and described above, except that line-shaped segments of the photoresist mask 2108 have ends that are even along a length of the line-shaped segments. As illustrated by the perspective view 5100 of FIG. 51, the acts described with regard to FIGS. 35, 36, and 37A-37C are performed as described above to form the mandrels 1602 and the sidewall spacer structures 1604. As illustrated by the perspective view 5200 of FIG. 52, the acts described with regard to FIGS. 38A-38C to 40A-40C and 41-43 are performed as described above to form the conductive lines 106.

With reference to FIGS. 53-56, a series of perspective views of some alternative embodiments of the method of FIGS. 34-36, 37A-37C to 40A-40C, and 41-43 is provided in which the IC chip is formed with four cut inner conductive lines between and bordering cut outer conductive lines. The alternative embodiments may, for example, correspond to embodiments of the IC chip described with regard to FIGS. 18C and 19C.

Figure 53:
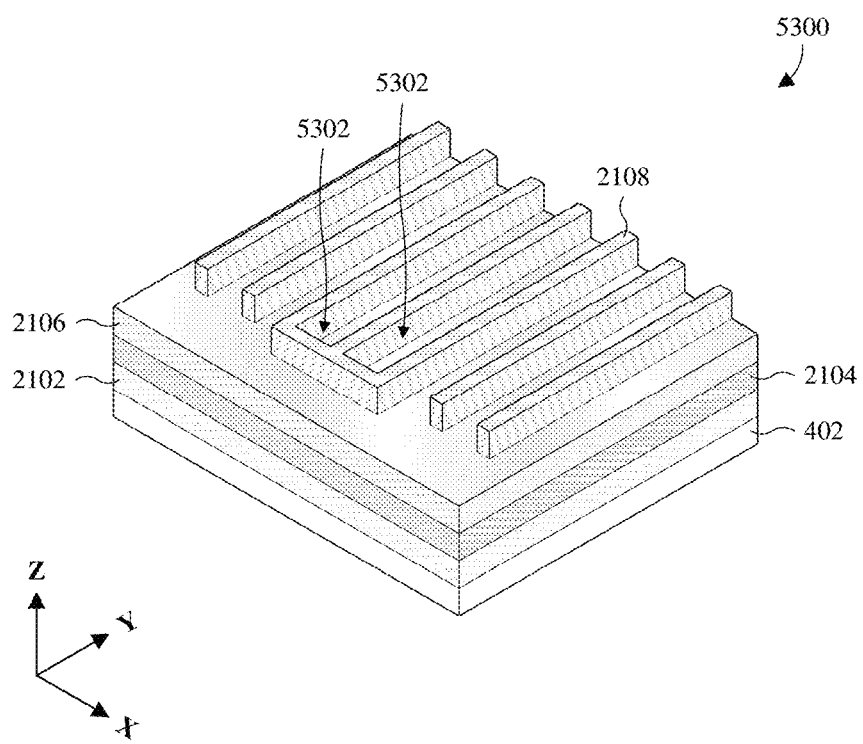
FIGS. 53-56 illustrate a series of perspective views of some alternative embodiments of the method of FIGS. 34-36, 37A-37C to 40A-40C, and 41-43 in which the IC chip is formed with four cut inner conductive lines between and bordering cut outer conductive lines.
Figure 54:
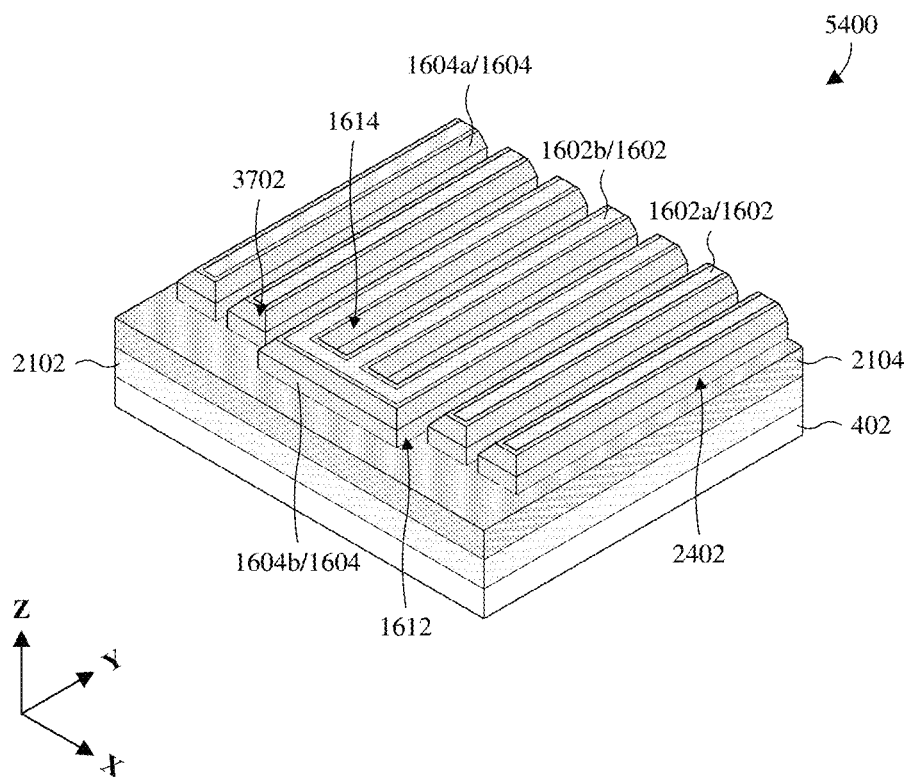
Figure 55:
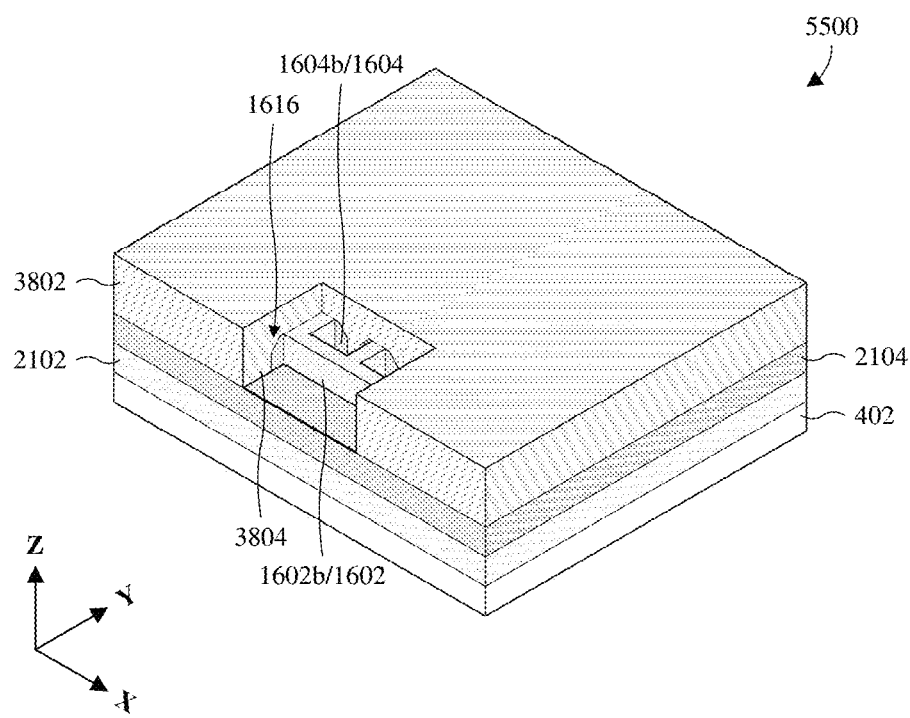
Figure 56:
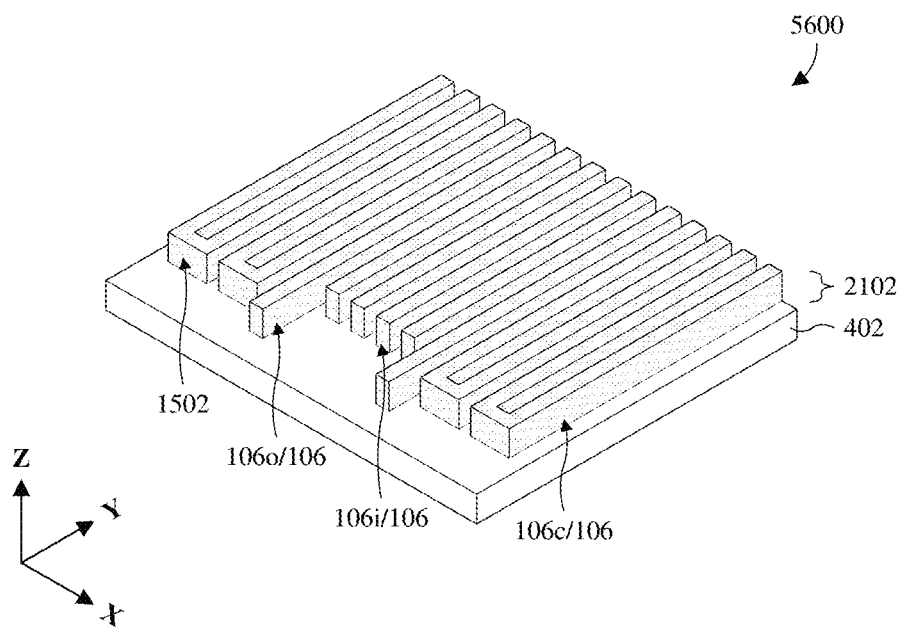

As illustrated by the perspective view 5300 of FIG. 53, the acts described with regard to FIG. 34 are performed as illustrated and described above, except that the photoresist mask 2108 has two U-shaped, overlapping turns 5302 to facilitate formation and cutting of six spacer lines with an enlarged process window as described with regard to FIGS. 15 and 16. As illustrated by the perspective view 5400 of FIG. 54, the acts described with regard FIGS. 35, 36, 37A-37C are performed as illustrated and described above to form the mandrels 1602 and the sidewall spacer structures 1604. As illustrated by the perspective view 5500 of FIG. 55, the acts described with regard to FIGS. 38A-38C and 39A-39C are performed as illustrated and described above to cut the second sidewall spacer structures 1604b. As illustrated by the perspective view 5600 of FIG. 56, the acts described with regard to FIGS. 40A-40C and 41-43 are performed as illustrated and described above to form the conductive lines 106.

With reference to FIGS. 57-60, a series of perspective views of some alternative embodiments of the method of FIGS. 34-36, 37A-37C to 40A-40C, and 41-43 is provided in which the IC chip is formed with six cut inner conductive lines between and bordering cut outer conductive lines. The alternative embodiments may, for example, correspond to embodiments of the IC chip described with regard to FIGS. 18D and 19D.

Figure 57:
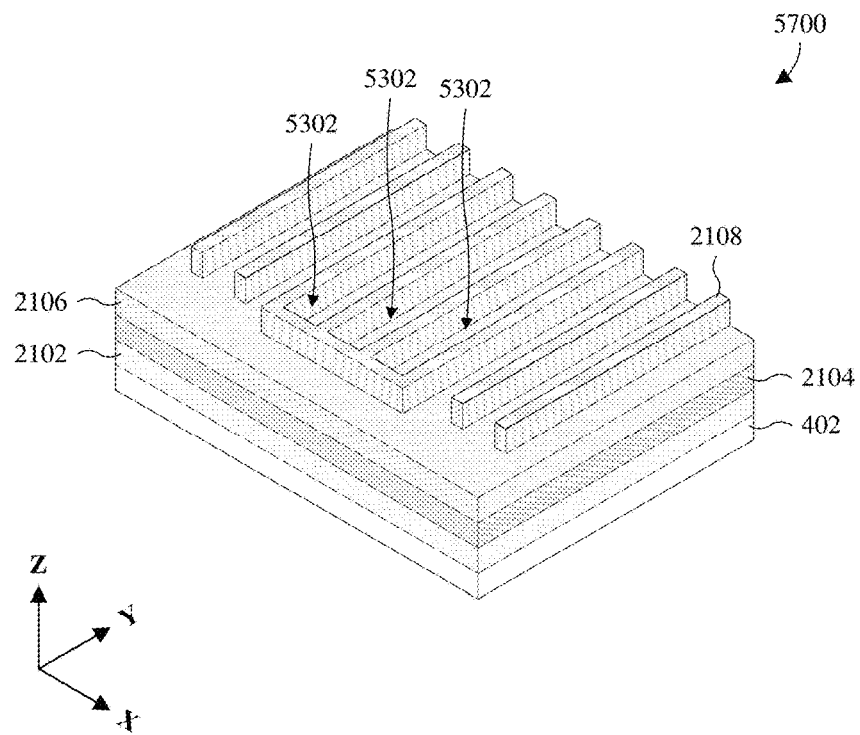
FIGS. 57-60 illustrate a series of perspective views of some alternative embodiments of the method of FIGS. 34-36, 37A-37C to 40A-40C, and 41-43 in which the IC chip is formed with six cut inner conductive lines between and bordering cut outer conductive lines.
Figure 58:
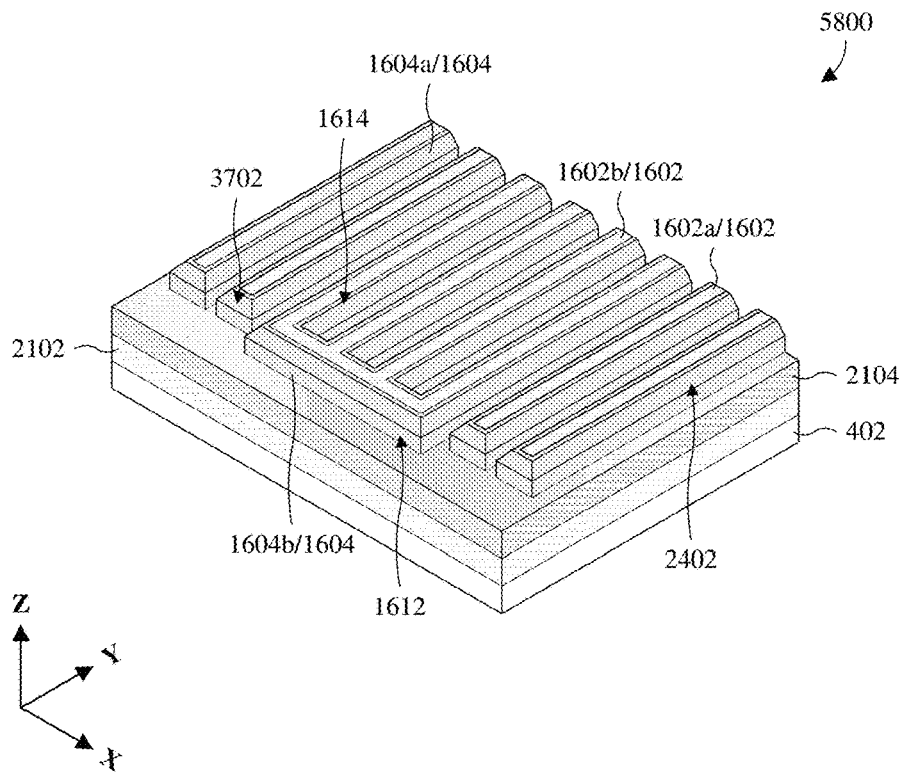
Figure 59:
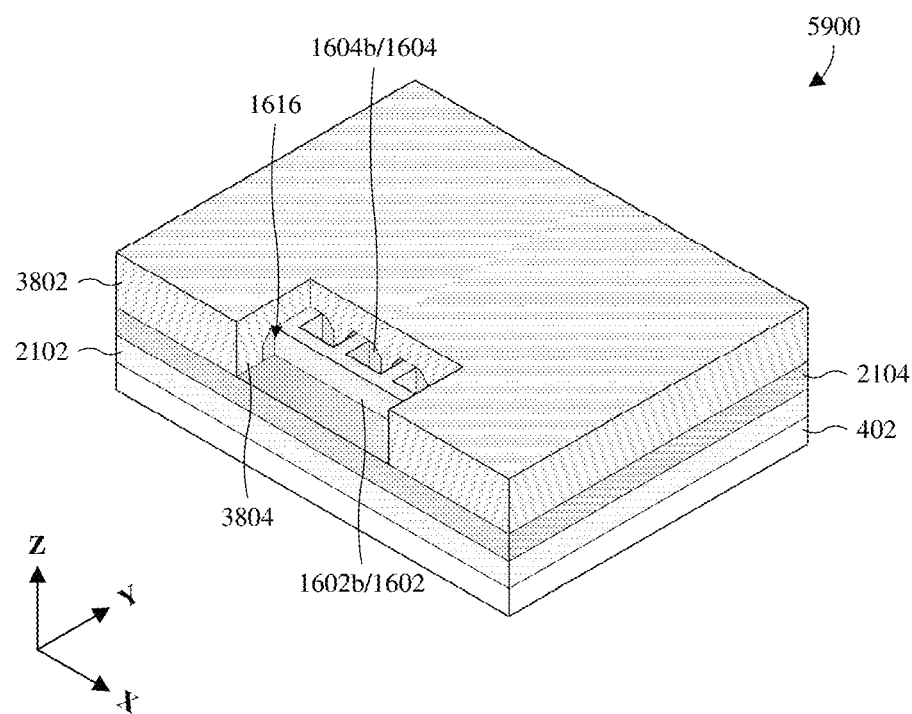
Figure 60:
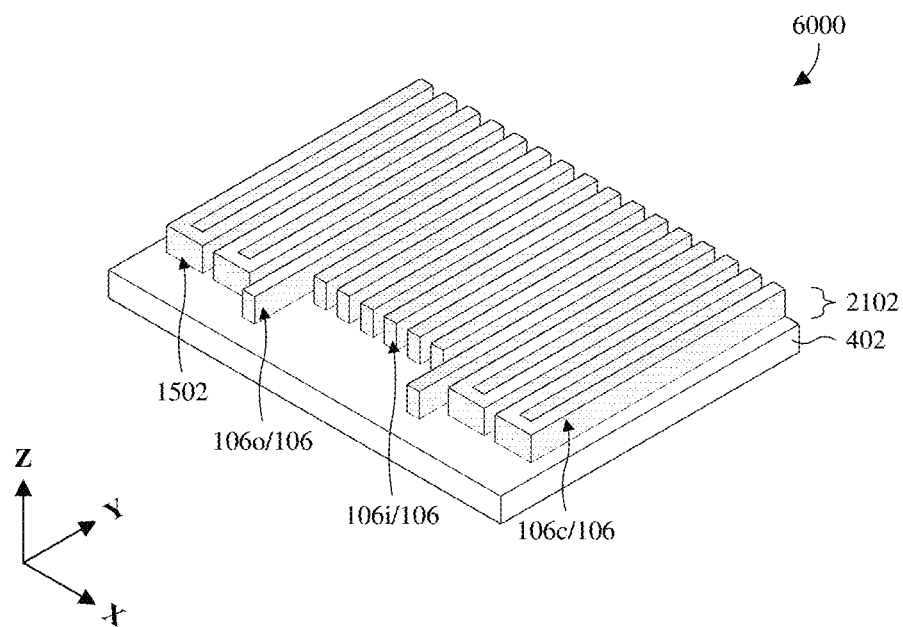

As illustrated by the perspective view 5700 of FIG. 57, the acts described with regard to FIG. 34 are performed as illustrated and described above, except that the photoresist mask 2108 has three U-shaped, overlapping turns 5302 to facilitate formation and cutting of eight spacer lines with an enlarged process window as described with regard to FIGS. 15 and 16. As illustrated by the perspective view 5800 of FIG. 58, the acts described with regard FIGS. 35, 36, 37A-37C are performed as illustrated and described above to form the mandrels 1602 and the sidewall spacer structures 1604. As illustrated by the perspective view 5900 of FIG. 59, the acts described with regard to FIGS. 38A-38C and 39A-39C are performed as illustrated and described above to cut the second sidewall spacer structures 1604b. As illustrated by the perspective view 6000 of FIG. 60, the acts described with regard to FIGS. 40A-40C and 41-43 are performed as illustrated and described above to form the conductive lines 106.

Figure 61:
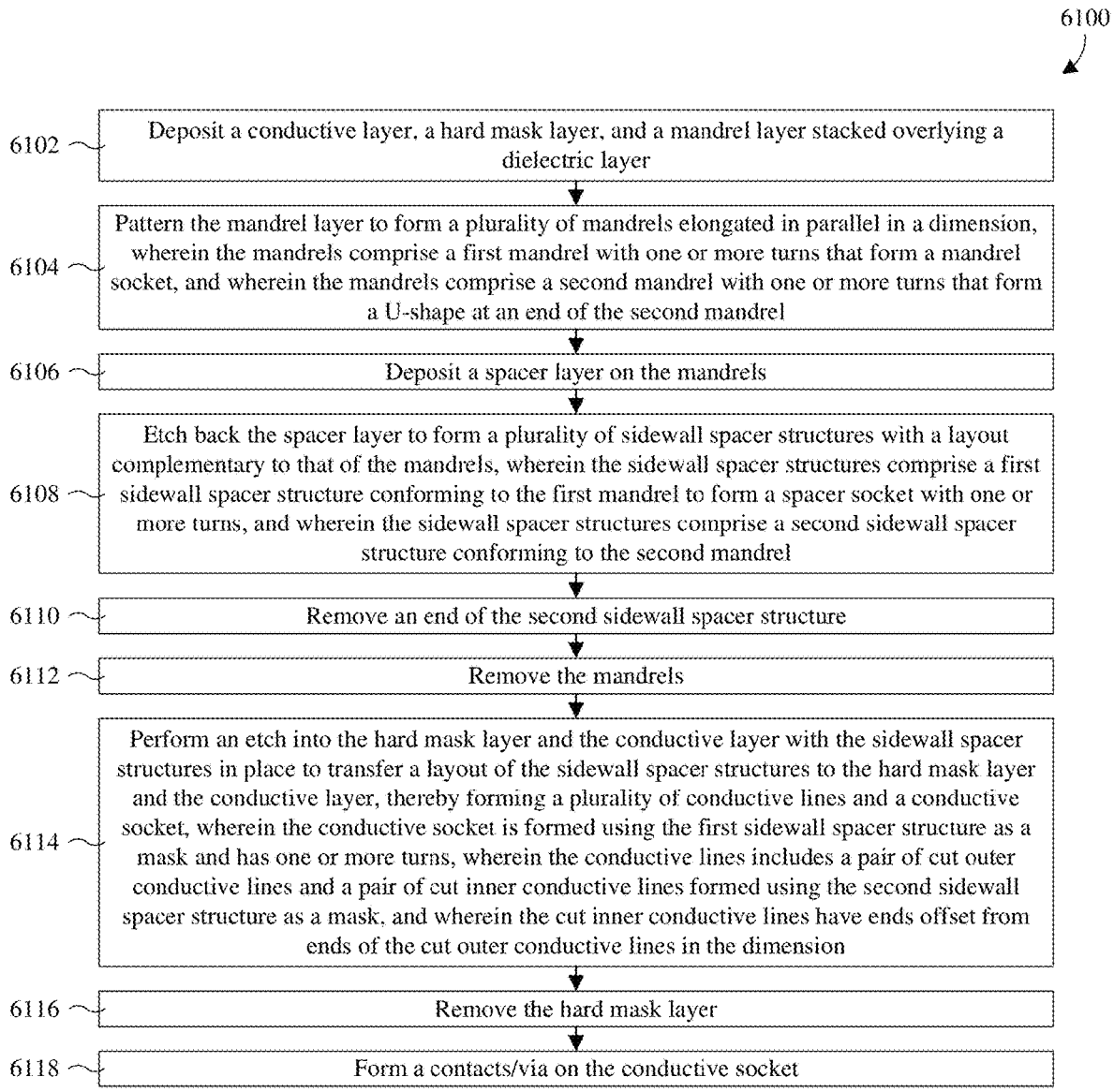
FIG. 61 illustrates a block diagram of some embodiments of a method combining the methods of FIGS. 29 and 44.

With reference to FIG. 61, a block diagram of some embodiments of a method combining the methods of FIGS. 29 and 44 is provided. The method may, for example, be employed to form the IC chip of FIG. 20 or some other suitable IC chip.

At 6102, a conductive layer, a hard mask layer, and a mandrel layer are deposited stacked overlying a dielectric layer. See, for example, FIGS. 21A and 21B and FIG. 34.

At 6104, the mandrel layer is patterned to form a plurality of mandrels elongated in parallel in a dimension, wherein the mandrels comprise a first mandrel with one or more turns that form a mandrel socket, and wherein the mandrels comprise a second mandrel with one or more turns that form a U-shape at an end of the second mandrel. See, for example, FIGS. 21A and 21B to FIGS. 22A and 22B and FIGS. 34 and 35. In some embodiments, the first and second mandrels are the same.

At 6106, a spacer layer is deposited on the mandrels. See, for example, FIGS. 23A and 23B and FIG. 36.

At 6108, the spacer layer is etched back to form a plurality of sidewall spacer structures with a layout complementary to that of the mandrels, wherein the sidewall spacer structures comprise a first sidewall spacer structure conforming to the first mandrel to form a spacer socket with one or more turns, and wherein the sidewall spacer structures comprise a second sidewall spacer structure conforming to the second mandrel. See, for example, FIGS. 24A and 24B and FIGS. 37A-37C.

At 6110, an end of the second sidewall spacer structure is removed. See, for example, FIGS. 38A-38C to FIGS. 40A-40C.

At 6112, the mandrels are removed. See, for example, FIGS. 25A and 25B and FIG. 41.

At 6114, an etch is performed into the hard mask layer and the conductive layer with the sidewall spacer structures in place to transfer a layout of the sidewall spacer structures to the hard mask layer and the conductive layer, thereby forming a plurality of conductive lines and a conductive socket, wherein the conductive socket is formed using the first sidewall spacer structure as a mask and has one or more turns, wherein the conductive lines includes a pair of cut outer conductive lines and a pair of cut inner conductive lines formed using the second sidewall spacer structure as a mask, and wherein the cut inner conductive lines have ends offset from ends of the cut outer conductive lines in the dimension. See, for example, FIGS. 26A and 26B and FIG. 42.

At 6116, the hard mask layer is removed. See, for example, FIGS. 27A and 27B and FIG. 43.

At 6118, a contacts/via is formed on the conductive socket. See, for example, FIGS. 28A and 28B.

While the block diagram 4400 of FIG. 44 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides an IC chip including: a plurality of conductive lines elongated in parallel in a first dimension, wherein the plurality of conductive lines includes a first conductive line; a conductive socket integrated with the first conductive line and extending away from the first conductive line in a second dimension transverse to the first dimension, wherein the conductive socket extends in the second dimension along a path with at least one turn and has a width that is substantially the same as that of the first conductive line along the path; and a contact/via overlying and extending from the conductive socket. In some embodiments, a length of the conductive socket in the first dimension is greater than a width of the contact/via. In some embodiments, the at least one turn includes a first turn that changes direction continuously and that has an acute turn angle. In some embodiments, the at least one turn includes a first turn that changes direction discretely and that has a turn angle less than or equal to 90 degrees. In some embodiments, the contact/via protrudes through the conductive socket and has a bottom surface recessed relative to that of the conductive socket. In some embodiments, the contact/via has a bottom surface level with or elevated above a bottom surface of the conductive socket. In some embodiments, the conductive socket has a serpentine top layout. In some embodiments, the plurality of conductive lines further includes: a plurality of cut inner conductive lines and a pair of cut outer conductive lines, wherein the cut inner conductive lines are between and border the cut outer conductive lines, and wherein ends of the cut inner conductive lines are offset from ends of the cut outer conductive lines in the first dimension. In some embodiments, the first conductive line is one of the inner conductive lines. In some embodiments, the first conductive line is one of the outer conductive lines.

In some embodiments, the present disclosure provides a method including: forming a mandrel overlying a conductive layer and having a mandrel line and a mandrel socket, wherein a first sidewall of mandrel socket extends away from the mandrel line in a direction transverse to a length of the mandrel line with at least one turn; forming a sidewall spacer structure on sidewalls of the mandrel, wherein the sidewall spacer structure has a first spacer line and a first spacer socket, wherein the first spacer line is elongated in parallel with and borders the mandrel line, and wherein the first spacer socket extends from the first spacer line and conforms to the first sidewall of the mandrel socket; performing an etch into the conductive layer with the sidewall spacer structure in place to form a first conductive line and a first conductive socket with top layouts respectively of the first spacer line and the first spacer socket; and forming a contact/via overlying and extending from the first conductive socket. In some embodiments, the first spacer socket has a serpentine pattern extending away from the first spacer line. In some embodiments, a second sidewall of the mandrel socket is on an opposite side of the mandrel socket as the first sidewall and extends away from the mandrel line in the direction with a plurality of turns, wherein the sidewall spacer structure has a second spacer line and a second spacer socket, wherein the mandrel line is between and borders the first and second spacer lines, and wherein the second spacer socket extends from the second spacer line and conforms to the second sidewall of the mandrel socket. In some embodiments, the method further includes removing the mandrel before the etch. In some embodiments, the first sidewall of the mandrel socket has a plurality of fingers protruding in parallel with the length of the mandrel line.

In some embodiments, the present disclosure provides another method including: forming a mandrel on a conductive layer, wherein the mandrel has a pair of mandrel lines elongated in parallel and further has a U-shaped segment connecting ends of the mandrel lines; forming a sidewall spacer structure on sidewalls of the mandrel, wherein the sidewall spacer structure has a pair of inner spacer lines with ends connected by an inner U-shaped segment of the sidewall spacer structure and further has a pair of outer spacer lines with ends connected by an outer U-shaped segment of the sidewall spacer structure, and wherein the U-shaped segment of the mandrel is between and borders the inner and outer U-shaped segments; cutting the inner and outer U-shaped segments of the sidewall spacer structure to respectively separate the inner spacer lines and the outer spacer lines; and performing an etch into the conductive layer with the sidewall spacer structure in place to form conductive lines with layout of the inner and outer spacer lines. In some embodiments, the ends of the inner spacer lines are offset from the ends of the outer spacer lines in a direction along which the inner and outer spacer lines are elongated in parallel. In some embodiments, the forming of the sidewall spacer structure includes: depositing a spacer layer overlying the mandrel and the conductive layer and further lining the sidewalls of the mandrel; and etching back the spacer layer to remove the spacer layer from atop the mandrel. In some embodiments, the method further includes removing the mandrel before the cutting. In some embodiments, the method further includes removing the mandrel after the cutting.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a mandrel overlying a conductive layer and having a mandrel line and a mandrel socket, wherein a first sidewall of the mandrel socket extends away from the mandrel line in a direction transverse to a length of the mandrel line with at least one turn;
   forming a sidewall spacer structure on sidewalls of the mandrel, wherein the sidewall spacer structure has a first spacer line and a first spacer socket, wherein the first spacer line is elongated in parallel with and borders the mandrel line, and wherein the first spacer socket extends from the first spacer line and conforms to the first sidewall of the mandrel socket;
   performing an etch into the conductive layer with the sidewall spacer structure in place to form a first conductive line and a first conductive socket with top layouts respectively of the first spacer line and the first spacer socket; and
   forming a contact/via overlying and extending from the first conductive socket,
   wherein the mandrel socket has a body, as well as a first finger and a second finger that border each other on a common side of the body and that protrude from the body in a common direction, and wherein a separation between the first and second fingers increases continuously from the body to distal ends of the first and second fingers.

2. The method according to claim 1, wherein the first spacer socket has a serpentine pattern extending away from the first spacer line.

3. The method according to claim 1, wherein a second sidewall of the mandrel socket is on an opposite side of the mandrel socket as the first sidewall and extends away from the mandrel line in the direction with a plurality of turns, wherein the sidewall spacer structure has a second spacer line and a second spacer socket, wherein the mandrel line is between and borders the first and second spacer lines, and wherein the second spacer socket extends from the second spacer line and conforms to the second sidewall of the mandrel socket.

4. The method according to claim 1, further comprising:
   removing the mandrel before the etch.

5. The method according to claim 1, wherein the mandrel and the sidewall spacer structure overlie and directly contact the conductive layer, and wherein the first conductive line and the first conductive socket have individual top surfaces that are rounded at completion of the etch.

6. The method according to claim 1, further comprising:
   forming a hard mask layer overlying the conductive layer, wherein the mandrel is formed overlying the hard mask layer, wherein the etch is further performed into the hard mask layer, and wherein the first conductive line and the first conductive socket have individual top surfaces that are flat at completion of the etch.

7. The method according to claim 1, wherein the sidewall spacer structure further has a second spacer line elongated in parallel with the first spacer line and further has a U-shaped spacer segment, which connects individual ends of the first and second spacer lines and is laterally offset from the first spacer socket, and
   wherein the method further comprises performing an additional etch through an entire thickness of the U-shaped spacer segment to completely disconnect the individual ends of the first and second spacer lines from each other before the etch.

8. A method comprising:
forming a mandrel on a conductive layer, wherein the mandrel has a pair of mandrel lines elongated in parallel and further has a U-shaped segment connecting ends of the mandrel lines;
forming a sidewall spacer structure on sidewalls of the mandrel, wherein the sidewall spacer structure has a pair of inner spacer lines with ends connected by an inner U-shaped segment of the sidewall spacer structure and further has a pair of outer spacer lines with ends connected by an outer U-shaped segment of the sidewall spacer structure, and wherein the U-shaped segment of the mandrel is between and borders the inner and outer U-shaped segments;
cutting the inner and outer U-shaped segments of the sidewall spacer structure to respectively and completely disconnect the ends of the pair of inner spacer lines and the ends of the pair of outer spacer lines; and
performing an etch into the conductive layer with the sidewall spacer structure in place to form conductive lines with layouts of the inner and outer spacer lines.

9. The method according to claim 8, wherein the ends of the inner spacer lines are offset from the ends of the outer spacer lines in a direction along which the inner and outer spacer lines are elongated in parallel.

10. The method according to claim 8, wherein the forming of the sidewall spacer structure comprises:
depositing a spacer layer overlying the mandrel and the conductive layer and further lining the sidewalls of the mandrel; and
etching back the spacer layer to remove the spacer layer from atop the mandrel.

11. The method according to claim 8, further comprising: removing the mandrel before the cutting.

12. The method according to claim 8, further comprising: removing the mandrel after the cutting.

13. The method according to claim 8, wherein the cutting comprises:
forming a mask having an opening overlying the inner and outer U-shaped segments, wherein the opening has a width less than a width of the outer U-shaped segment and more than a width of the inner U-shaped segment; and
performing another etch into the inner and outer U-shaped segments with the mask in place.

14. The method according to claim 8, wherein the pair of mandrel lines have individual greatest dimensions extending laterally in parallel with each other in a direction, wherein the pair of inner spacer lines have individual sidewalls facing the U-shaped segment of the mandrel in the direction after the cutting, wherein the pair of outer spacer lines have individual sidewalls facing in the direction after the cutting, and wherein the U-shaped segment of the mandrel is between and spaced from the individual sidewalls of the pair of inner spacer lines and the individual sidewalls of the pair of outer spacer lines in the direction.

15. A method comprising:
forming a first mandrel overlying a conductive layer, wherein the first mandrel has a pair of first line segments elongated in parallel in a first dimension, and further has a bridge segment elongated in a second dimension transverse to the first dimension and connected to individual ends of the pair of first line segments;
depositing a spacer layer covering and conforming to the first mandrel;
etching back the spacer layer to expose a top surface of the first mandrel and to form a first sidewall spacer structure on sidewalls of the first mandrel, wherein the first sidewall spacer structure has portions contacting the bridge segment of the first mandrel;
after the etching back of the spacer layer, removing the portions of the first sidewall spacer structure to segment the first sidewall spacer structure into a first pair of line-shaped spacer segments completely disconnected from each other; and
performing an etch into the conductive layer with the first sidewall spacer structure in place to form a plurality of conductive lines after the removing.

16. The method according to claim 15, further comprising:
forming a second mandrel overlying the conductive layer, wherein the second mandrel has a pair of second line segments elongated in parallel in the first dimension and laterally spaced from each other in the second dimension, wherein the second mandrel has a socket segment with a first sidewall that turns a plurality of times along a path from an end of one of the pair of second line segments to an end of an additional one of the pair of second line segments, and wherein the spacer layer is deposited covering and conforming to the second mandrel.

17. The method according to claim 16, wherein the socket segment has a plurality of protrusions spaced from each other in a line extending in the second dimension and elongated in parallel with each other in the first dimension, and wherein the plurality of protrusions form the first sidewall of the second mandrel.

18. The method according to claim 16, wherein the socket segment has a second sidewall with a serpentine layout from the end of the one of the pair of second line segments to the end of the additional one of the pair of second line segments, and wherein the second sidewall is on an opposite side of the socket segment as the first sidewall.

19. The method according to claim 15, wherein the etching back forms an additional sidewall spacer structure with a portion having a serpentine layout, wherein the etch transfers the serpentine layout to the conductive layer to form a conductive socket, and wherein the method further comprises forming a via overlying and directly contacting the conductive socket.

20. The method according to claim 15, wherein the first mandrel has three or more first line segments, including the pair of first line segments, elongated in parallel in the first dimension and spaced from each other in a line extending in the second dimension, and wherein the bridge segment has a line-shaped top geometry elongated in the second dimension and directly contacting individual ends of the three or more first line segments.

* * * * *